United States Patent
Tsukamoto et al.

(10) Patent No.: US 10,777,103 B2
(45) Date of Patent: Sep. 15, 2020

(54) DISPLAY APPARATUS AND METHOD FOR MANUFACTURING SAME

(71) Applicant: Sharp Kabushiki Kaisha, Sakai, Osaka (JP)

(72) Inventors: Yuto Tsukamoto, Sakai (JP); Shinichi Kawato, Sakai (JP); Manabu Niboshi, Sakai (JP); Hiroshi Imada, Sakai (JP); Tokiyoshi Umeda, Sakai (JP); Bai Zhang, Sakai (JP); Tomoaki Jo, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/333,607

(22) PCT Filed: Sep. 21, 2017

(86) PCT No.: PCT/JP2017/034149
§ 371 (c)(1),
(2) Date: Mar. 15, 2019

(87) PCT Pub. No.: WO2018/061987
PCT Pub. Date: Apr. 5, 2018

(65) Prior Publication Data
US 2019/0228686 A1    Jul. 25, 2019

(30) Foreign Application Priority Data
Sep. 28, 2016 (JP) ................. 2016-190417

(51) Int. Cl.
*G09F 9/302* (2006.01)
*H01L 27/32* (2006.01)
(Continued)

(52) U.S. Cl.
CPC .............. *G09F 9/302* (2013.01); *G09F 9/301* (2013.01); *H01L 27/32* (2013.01); *H01L 51/50* (2013.01);
(Continued)

(58) Field of Classification Search
None
See application file for complete search history.

(56) References Cited

U.S. PATENT DOCUMENTS 8,907,332 B2 *  12/2014  Ye ...................... H01L 51/5044
                                                              257/40
9,276,228 B2 *   3/2016  Seo ..................... H01L 51/0074
(Continued)

FOREIGN PATENT DOCUMENTS

| JP | 2009-211890 A | 9/2009 |
| JP | 4441883 B2 | 3/2010 |

(Continued)

OTHER PUBLICATIONS

Official Communication issued in International Patent Application No. PCT/JP2017/034149, dated Nov. 7, 2017.

*Primary Examiner* — Telly D Green
(74) *Attorney, Agent, or Firm* — Keating & Bennett, LLP

(57) ABSTRACT

Provided is a display apparatus where: a blue light-emitting layer is formed as a layer that is common to a first subpixel, a second subpixel, and a third subpixel; a green light-emitting layer is formed as a layer that is common to the second subpixel and the third subpixel; and the red light-emitting layer is formed only in the third subpixel.

16 Claims, 24 Drawing Sheets

(51) Int. Cl.
  *H01L 51/50* (2006.01)
  *H05B 33/10* (2006.01)
  *H05B 33/28* (2006.01)
  *G09F 9/30* (2006.01)
  *H05B 33/24* (2006.01)
  *H05B 33/26* (2006.01)
  *H05B 33/12* (2006.01)

(52) U.S. Cl.
  CPC ...... *H01L 51/5016* (2013.01); *H01L 51/5056* (2013.01); *H01L 51/5072* (2013.01); *H05B 33/10* (2013.01); *H05B 33/12* (2013.01); *H05B 33/24* (2013.01); *H05B 33/26* (2013.01); *H05B 33/28* (2013.01)

(56) References Cited

U.S. PATENT DOCUMENTS

| | | | |
|---|---|---|---|
| 9,559,313 B2 * | 1/2017 | Seo | H01L 51/006 |
| 9,741,970 B2 * | 8/2017 | Cho | H01L 51/56 |
| 9,893,124 B2 * | 2/2018 | Song | H01L 51/5096 |
| 9,929,350 B2 * | 3/2018 | Yamazaki | H01L 51/0067 |
| 9,947,885 B2 * | 4/2018 | Seo | H01L 51/5012 |
| 10,033,020 B2 * | 7/2018 | Cho | H01L 27/3211 |
| 10,461,132 B2 * | 10/2019 | Tsukamoto | H01L 51/56 |
| 10,505,120 B2 * | 12/2019 | Yamazaki | H01L 51/0059 |
| 10,505,132 B2 * | 12/2019 | Seo | H01L 51/0072 |
| 10,510,807 B2 * | 12/2019 | Tsukamoto | H01L 51/504 |
| 2007/0075310 A1 | 4/2007 | Lee | |
| 2007/0145350 A1 | 6/2007 | Kobori | |
| 2009/0220705 A1 * | 9/2009 | Mizuno | H01L 27/3211 427/555 |
| 2009/0261360 A1 * | 10/2009 | Yasukawa | H01L 51/5044 257/89 |
| 2009/0325451 A1 * | 12/2009 | Higo | H01L 51/0013 445/24 |
| 2010/0133994 A1 | 6/2010 | Song et al. | |
| 2012/0187386 A1 | 7/2012 | Matsumi | |
| 2014/0183482 A1 * | 7/2014 | Lee | H01L 51/5064 257/40 |
| 2014/0231760 A1 * | 8/2014 | Ye | H01L 51/5044 257/40 |
| 2014/0235004 A1 * | 8/2014 | Cho | H01L 51/56 438/35 |
| 2014/0284566 A1 * | 9/2014 | Yoo | H01L 27/3211 257/40 |
| 2015/0318509 A1 * | 11/2015 | Song | H01L 51/5096 257/40 |
| 2017/0331077 A1 * | 11/2017 | Cho | H01L 51/56 |
| 2018/0019428 A1 * | 1/2018 | Kawamura | H01L 51/5004 |
| 2019/0157360 A1 * | 5/2019 | Tsukamoto | H01L 51/504 |
| 2019/0198788 A1 * | 6/2019 | Park | H01L 51/5278 |
| 2019/0237514 A1 * | 8/2019 | Tsukamoto | H01L 51/0011 |
| 2019/0305054 A1 * | 10/2019 | Tsukamoto | H05B 33/24 |
| 2019/0312220 A1 * | 10/2019 | Tsukamoto | H01L 51/5234 |

FOREIGN PATENT DOCUMENTS

| | | |
|---|---|---|
| JP | 5819069 B2 | 11/2015 |
| WO | 2016/129536 A1 | 8/2016 |

* cited by examiner

B LIGHT EMISSION

G LIGHT EMISSION

R LIGHT EMISSION

DISPLAY APPARATUS AND METHOD FOR MANUFACTURING SAME

TECHNICAL FIELD

The disclosure relates to a display apparatus and to a method for manufacturing a display apparatus.

BACKGROUND ART

In recent years, a self-luminous display apparatus using a light-emitting element employing an electroluminescence (hereinafter referred to as "EL") phenomenon has been developed as a display apparatus instead of a liquid crystal display apparatus.

The display apparatus including an EL element can emit light at a low voltage. As the display apparatus is self-luminous element, the display apparatus has a wide viewing angle and high viewability. In addition, use of a complete solid element having a thin-film shape allows the display apparatus to save space and thus to be portable, which makes the display apparatus more attractive.

The EL element has a configuration in which a light-emitting layer containing a luminescent material is provided between an anode electrode and a cathode electrode. The EL element emits light by the use of the light-releasing phenomenon observed when excitons generated by the recombination of the electrons and the holes having been injected into the light-emitting layer are deactivated.

The light-emitting layer in the EL element is formed mainly by the use of a vapor deposition technique such as the vacuum vapor deposition technique. The vapor deposition technique for forming a full-color organic EL display apparatus is roughly classified into a white color filter (CF) technique and a separate-patterning technique. In addition, a technique that is classified into neither the white CF technique nor the separate-patterning technique has been proposed in recent years. The technique combines the EL element with a color conversion layer.

In the white CF technique, the luminescent color of each subpixel is selected by combining an EL element emitting white light with a CF layer. According to the white CF technique, each subpixel emits white light by layering a red light-emitting layer, a green light-emitting layer, and a blue light-emitting layer between the cathode electrode and anode electrode. In addition, each subpixel includes color filters of red color (R), green color (G) and blue color (B), which allows such subpixels to compose a full-color display apparatus.

In the separate-patterning technique, a separately patterning vapor deposition is performed by the use of vapor deposition masks for individual colors. Commonly, subpixels including red color (R) EL elements, subpixels including green color (G) EL elements, and subpixels including blue color (B) EL elements are arranged on a substrate. The subpixels are selectively made to emit light of their respective colors with desired luminance by the use of TFTs to display intended images. Between every mutually-adjacent EL elements, a bank (partition) is disposed to define light emitting regions of the subpixels. The light-emitting layer in each EL element is formed in an opening in the bank by the use of a vapor deposition mask.

According to the technique combining the EL elements with color conversion layers, a blue light-emitting layer is formed as a common layer to all the subpixels. Each green subpixel includes: a green color conversion layer configured to convert the blue light to the green light; and a green color filter. Each red subpixel includes: a red color conversion layer configured to convert the blue light to the red light; and a red color filter. Each blue subpixel includes a blue color filter but does not include no color conversion layer. Hence, the blue light emitted by the blue light-emitting layer is extracted through the blue color filter without having been subjected to any color conversion. Accordingly, each subpixel emits light of the corresponding color (e.g., see PTL 1).

The display apparatus disclosed in PTL 1 includes a pair of substrates that are arranged face to face each other. For each subpixel, a counter electrode layer is formed on a first one of the substrates, then a function layer including a blue light-emitting layer is formed on the counter electrode layer, and then an optical transparent electrode layer is formed on the function layer. On a second one of the substrates, a color filter and, if necessary, as described above, a color conversion layer are formed for each subpixel. The counter electrode layer is a layered body including a reflective electrode layer and a transparent electrode layer formed by layering these layers in this order from the first substrate side.

In the case of the display apparatus of PTL 1, the blue subpixels have no color conversion layers, and the optical distance between the reflective electrode layer and the blue light-emitting layer in each of the blue subpixels is set to a distance enabling the interference of the blue light in the blue light-emitting layer. Hence, the blue light that is extracted has an intensity increased by the interference. On the other hand, the red subpixels and the green subpixels include their respective color conversion layers. In each of the subpixels, the optical distance between the reflective electrode layer and the light-emitting layer is set to a distance enabling the light of the luminescent color obtained as a result of the conversion by the color conversion layer to be extracted with the highest intensity possible. Hence, the intensity of the extracted red light and the intensity of the extracted green light can be increased.

CITATION LIST

Patent Literature

PTL 1: JP 4441883 B (Published on Jan. 22, 2010)
PTL 2: JP 5819069 B (Published on Oct. 9, 2015)

SUMMARY

Technical Problem

The white CF technique has an advantage in that the display apparatus manufactured by the technique can achieve a high resolution without requiring any high-resolution vapor deposition masks. The white CF technique, however, needs to make the blue light-emitting layer, the green light-emitting layer, and the red light-emitting layer emit light simultaneously to obtain the emission of white light. This requires a higher drive voltage. In addition, the use of color filters causes an energy loss. Hence, the display apparatus employing the white CF technique has a problem of an increased power consumption when driven. In addition, the display apparatus employing the white CF technique is manufactured by layering a red light-emitting layer, a green light-emitting layer, and a blue light-emitting layer in each of all the subpixels. This means that more layers need to be formed in each of all the subpixels than other techniques. In addition, the use of the color filters results in a much higher manufacturing cost.

The separate-patterning technique, on the other hand, has some excellent properties such as the luminous efficiency and the low-voltage driving. The separate-patterning technique, however, has difficulty in performing a highly accurate patterning. The separate-patterning technique may have a problem of the mixing of the color intended for a particular pixel into a neighboring pixel. This problem may be caused, for example, if the openings are not formed accurately enough in a vapor deposition mask or if the distance between the vapor deposition source and the film target substrate is inappropriate. In addition, a certain thickness of the vapor deposition mask or a certain vapor deposition angle may result in a shadow, that is, a film thickness that is thinner than the intended one. Hence, the display apparatus employing the separate-patterning technique may have a problem of a display quality degraded by the mixing-in of the vapor deposition material from a neighboring pixel and/or by a shadow. In particular, the attachment of only a slightest amount of different-color dopant to a neighboring pixel may have a disproportionately great effect in the EL light emission spectrum in a certain apparatus structure, resulting in an unintentional change in chromaticity.

Hence, manufacturing a high-resolution display apparatus by the separate-patterning technique needs to separate the vapor deposition source from the film target substrate by a certain distance that allows an acute vapor deposition angle to be achieved, which in turn requires a vacuum chamber that is high enough to accommodate the vapor deposition source and the film target substrate thus remotely separated.

Such a high vacuum chamber, however, requires a higher manufacturing cost. In addition, bad material-utilization efficiency increases the material cost.

In a display apparatus employing a technique combining EL elements with color conversion layers, such as the technique disclosed in PTL 1, the formation of a single blue light-emitting layer as a common layer to all the subpixels can reduce the number of required separate-patterning vapor-deposition sessions using different vapor deposition masks.

The technique using the color conversion layers achieves the emission of green light and red light by the use of color conversion layers containing fluorescent media capable of absorbing the blue light and of generating fluorescence that enables the re-emission of green light and red light, respectively. Hence, the technique results in lower luminous efficiencies for green light and for red light. In particular, absorption of blue light by the red color conversion layer needs a significant wavelength shift to the longer wavelength side. Hence, this wavelength shift results in a remarkable decrease in the light emission intensity.

The technique using the color conversion layers has additional problems. The variation in the thickness of the layered film may result in great changes in the light extraction efficiency. In addition, the gap that exists between the EL element and the color conversion layer allows the blue light to exit obliquely, which in turn causes color mixing and/or color shifting, resulting in difficulty in achieving a high resolution.

PTL 2 discloses an organic EL display apparatus including a blue light-emitting layer that is common to all the subpixels (i.e., a common blue light-emitting layer); an individual green light-emitting layer for each of the green subpixels; an individual red light-emitting layer for each of the red subpixels; a blue color filter for each of the blue subpixels; a green color filter for each of the green subpixels; and a red color filter for each of the red subpixels.

The organic EL display apparatus disclosed in PTL 2, however, includes a common blue light-emitting layer. Hence, certain carrier mobilities of the host material of the blue light-emitting layer may limit the layering order of the blue light-emitting layer, the green light-emitting layer, and the red light-emitting layer. In addition, a change in the layering order will change the recombination position of the holes and the electrons, which in turn may result in color mixing.

Additional problems may arise from the use of the color filters by the organic EL display apparatus disclosed in PTL 2: an increased manufacturing cost and an energy loss.

The disclosure has been made in view of the above-described problems of the display apparatus of related art and thus provides a display apparatus, along with a manufacturing method thereof, capable of: preventing color mixing or color shift from occurring in each subpixel; achieving a high efficiency in providing each luminescent color; and reducing the power consumption when driven and reducing the manufacturing cost from their respective counterparts of display apparatus of related art.

Solution to Problem

To solve the above-described problems, an aspect of the disclosure provides a display apparatus including: a display region; a first electrode; a second electrode; and a layered body formed between the first electrode and the second electrode. In the display apparatus, the display region includes: a first subpixel, a second subpixel, and a third subpixel. The first subpixel, the second subpixel, and the third subpixel emit their respective light having mutually different peak wavelengths. The layered body includes: a first light-emitting layer containing a first fluorescent luminescent material, a second light-emitting layer containing a second fluorescent luminescent material, and a third light-emitting layer containing a third fluorescent luminescent material or a phosphorescent luminescent material as a luminescent material. The second fluorescent luminescent material has a lower energy level in a minimum excited singlet state than an energy level of the first fluorescent luminescent material in the minimum excited singlet state. The third fluorescent luminescent material or the phosphorescent luminescent material has a lower energy level in a minimum excited singlet state than the energy level of the second fluorescent luminescent material in the minimum excited singlet state. The first light-emitting layer is formed as a layer that is common to the first subpixel, the second subpixel, and the third subpixel. The second light-emitting layer is formed as a layer that is common to the second subpixel and the third subpixel. The third light-emitting layer is formed only in the third subpixel.

To solve the above-described problems, an aspect of the disclosure provides a display apparatus manufacturing method for manufacturing a display apparatus. The display apparatus includes: a display region; a first electrode; a second electrode; and a layered body formed between the first electrode and the second electrode. The display region includes: a first subpixel, a second subpixel, and a third subpixel. The first subpixel, the second subpixel, and the third subpixel emit their respective light having mutually different peak wavelengths. The layered body includes: a first light-emitting layer containing a first fluorescent luminescent material, a second light-emitting layer containing a second fluorescent luminescent material, and a third light-emitting layer containing a third fluorescent luminescent material or a phosphorescent luminescent material. The second fluorescent luminescent material has a lower energy level in a minimum excited singlet state than an energy level of the first fluorescent luminescent material in the minimum excited singlet state. The third fluorescent luminescent material or the phosphorescent luminescent material has a lower energy level in a minimum excited singlet state than the energy level of the second fluorescent luminescent material in the minimum excited singlet state. A luminescent spectrum of the first fluorescent luminescent material and an absorption spectrum of the luminescent material contained in the third light-emitting layer have no overlapping with each other. The display apparatus manufacturing method includes: a first electrode formation step for forming the first electrode; a layered body formation step for forming the layered body; and a second electrode formation step for forming the second electrode. The layered body formation step includes: a first light-emitting layer vapor deposition step for vapor-depositing the first light-emitting layer as a layer that is common to the first subpixel, the second subpixel, and the third subpixel; a second light-emitting layer vapor-deposition step for vapor-depositing the second light-emitting layer in a separately patterning manner as a layer that is common to the second subpixel and the third subpixel; and a third light-emitting layer vapor-deposition step for vapor-depositing the third light-emitting layer in a separately patterning manner in the third subpixel.

Advantage Effects of Disclosure

According to the aspect of the disclosure, the first light-emitting layer is formed to be a layer that is common to the first subpixel, the second subpixel, and the third subpixel. Hence, not all the light-emitting layers have to be formed by the separately patterning vapor deposition technique. According to the aspect of the disclosure, the first light-emitting layer is vapor-deposited to be a layer common to the first subpixel, the second subpixel, and the third subpixel. This reduces the number of separate-patterning vapor-deposition sessions using different vapor deposition masks.

In addition, according to the aspect of the disclosure, in the first subpixel, an almost 100% light emission is achieved by the first light-emitting layer provided in the first subpixel. In the second subpixel, the first light-emitting layer and the second light-emitting layer are layered. In addition, the second fluorescent luminescent material, which is a luminescent material of the second light-emitting layer, has a lower energy level in the minimum excited singlet state than its counterpart of the first fluorescent luminescent material, which is a luminescent material of the first light-emitting layer. Hence, by adjusting the carrier mobilities and/or the distance between the first light-emitting layer and the second light-emitting layer, the second light-emitting layer achieves almost 100% light emission. In the third subpixel, the first light-emitting layer, the second light-emitting layer, and the third light-emitting layer are layered one upon another. A luminescent material of the second light-emitting layer has a lower energy level in the minimum excited singlet state than its counterpart of a luminescent material of the first light-emitting layer. A luminescent material of the third light-emitting layer has a lower energy level in the minimum excited singlet state than its counterpart of a luminescent material of the second light-emitting layer. Hence, by adjusting the carrier mobilities, by adjusting the distance between the first light-emitting layer and the second light-emitting layer and/or by adjusting the distance between the second light-emitting layer and the third light-emitting layer, the third light-emitting layer achieves almost 100% light emission. In addition, according to the aspect of the disclosure, it is not necessary to form, separately, a color filter or a color conversion layer. Hence, according to the aspect of the disclosure, each subpixel can obtain its own luminescent color with a high efficiency without causing any color mixing or color shift to take place. As a result, a higher resolution can be achieved easily.

In addition, according to the aspect of the disclosure, the first subpixel, the second subpixel, and the third subpixel emit their respective lights having different peak wavelengths from one another. Hence, according to the aspect of the disclosure, unlike the case of the white CF technique, it is not necessary to make the blue light-emitting layer, the green light-emitting layer, and the red light-emitting layer emit light simultaneously. Accordingly, the power consumption at the time of driving the display apparatus can be reduced.

In addition, according to the aspect of the disclosure, the unnecessity of any color filters that would otherwise have to be separately provided reduces the manufacturing cost and eliminates the possible energy loss that would otherwise be caused by the use of the color filters.

In addition, according to the aspect of the disclosure, the common light-emitting layer provided as a common layer to a plurality of subpixels can reduce the number of separate-patterning vapor-deposition sessions and increases the degree of freedom in determining the layering order of the light-emitting layers including the common light-emitting layer compared with that in the related art.

Hence, the aspect of the disclosure provides a display apparatus, along with a manufacturing method thereof, that is capable of: preventing color mixing or color shift from occurring in each subpixel; achieving a high efficiency in providing each luminescent color; and reducing the power consumption when driven and reducing the manufacturing cost.

DESCRIPTION OF EMBODIMENTS

Hereinafter, embodiments of the disclosure will be described in detail.

First Embodiment

An embodiment of the disclosure is described below with reference to FIGS. 1 to 9.

Note that the following description is based on a case where the display apparatus according to the present embodiment is an organic EL display apparatus.

Schematic Configuration of Organic EL Display Apparatus

Figure 1:
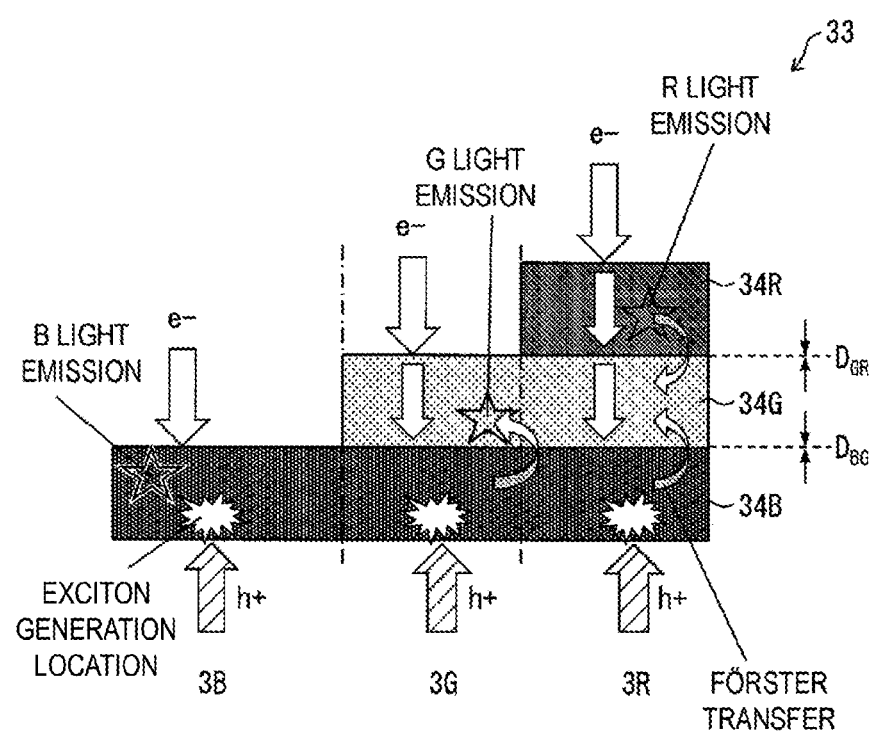
FIG. 1 is a diagram illustrating a schematic configuration of a light-emitting layer unit of an organic EL display apparatus and illustrating a principle of light emission by the light-emitting layer unit according to a first embodiment of the disclosure.
Figure 2A:
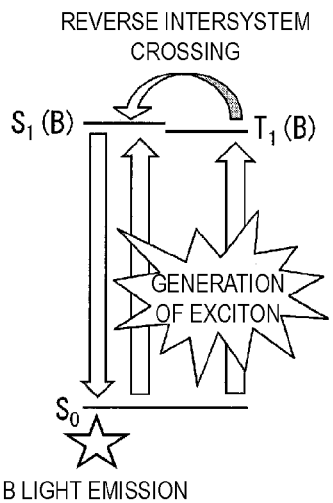
FIG. 2A is a diagram illustrating a principle of light emission in a blue subpixel of the organic EL display apparatus according to the first embodiment of the disclosure.
Figure 2B:
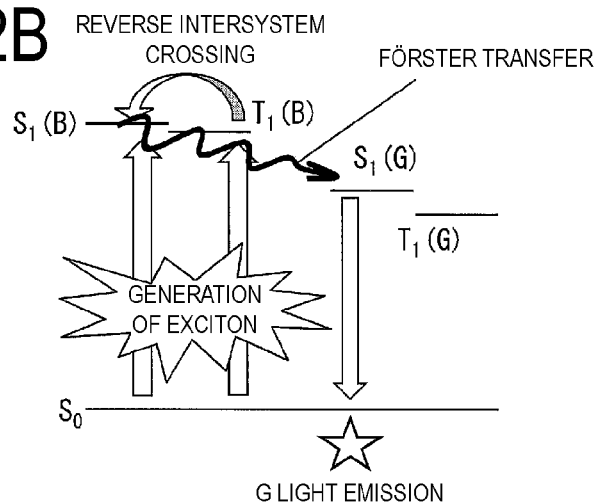
FIG. 2B is a diagram illustrating a principle of light emission in a green subpixel of the organic EL display apparatus according to the first embodiment of the disclosure.
Figure 2C:
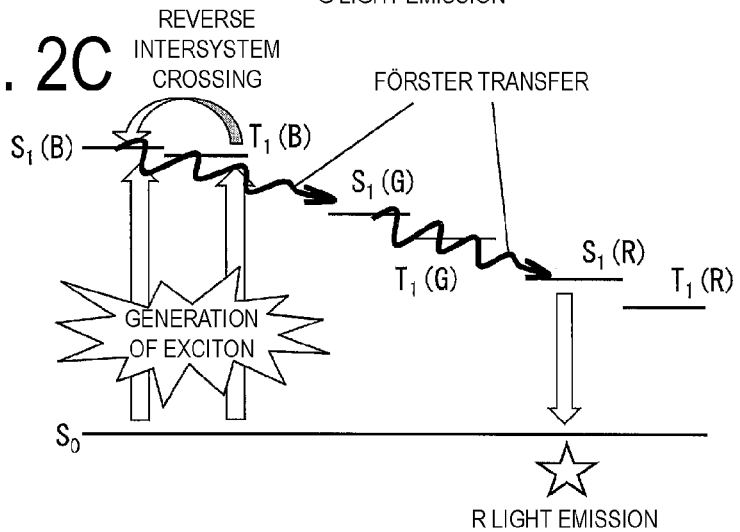
FIG. 2C is a diagram illustrating a principle of light emission in a red subpixel of the organic EL display apparatus according to the first embodiment of the disclosure.
Figure 3:
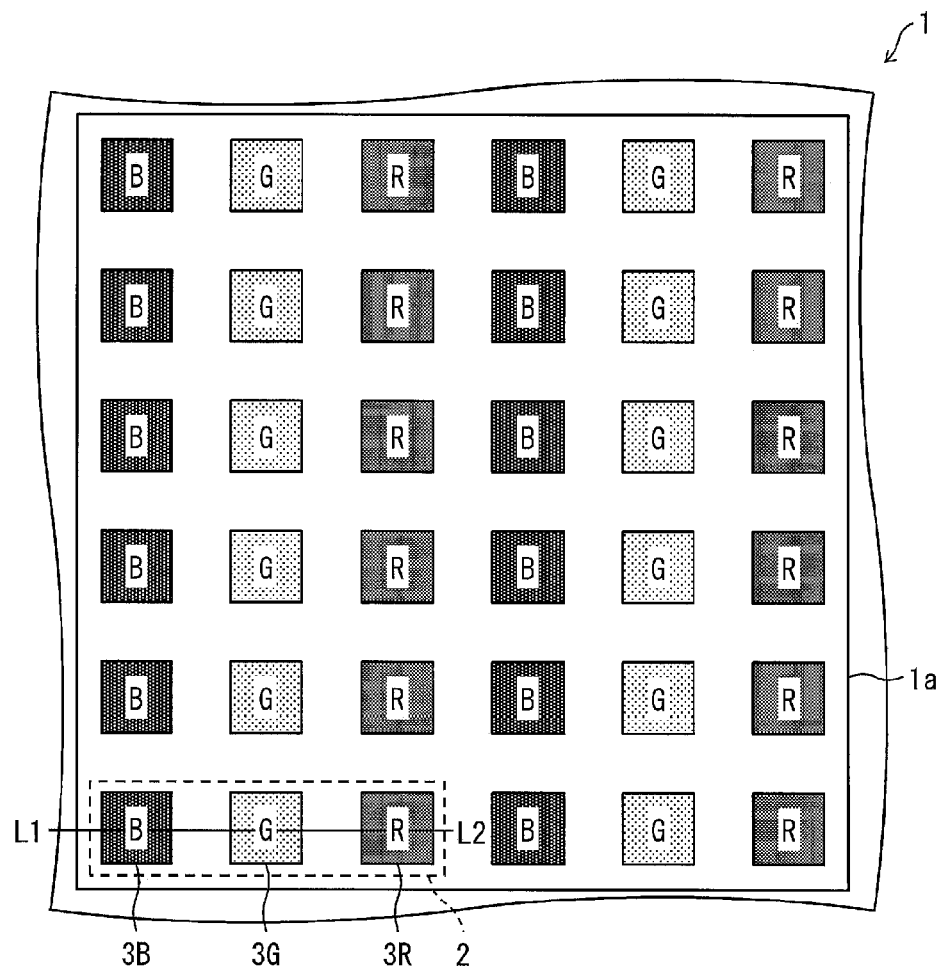
FIG. 3 is a diagram schematically illustrating a pixel arrangement of the organic EL display apparatus according to the first embodiment of the disclosure.
Figure 4:
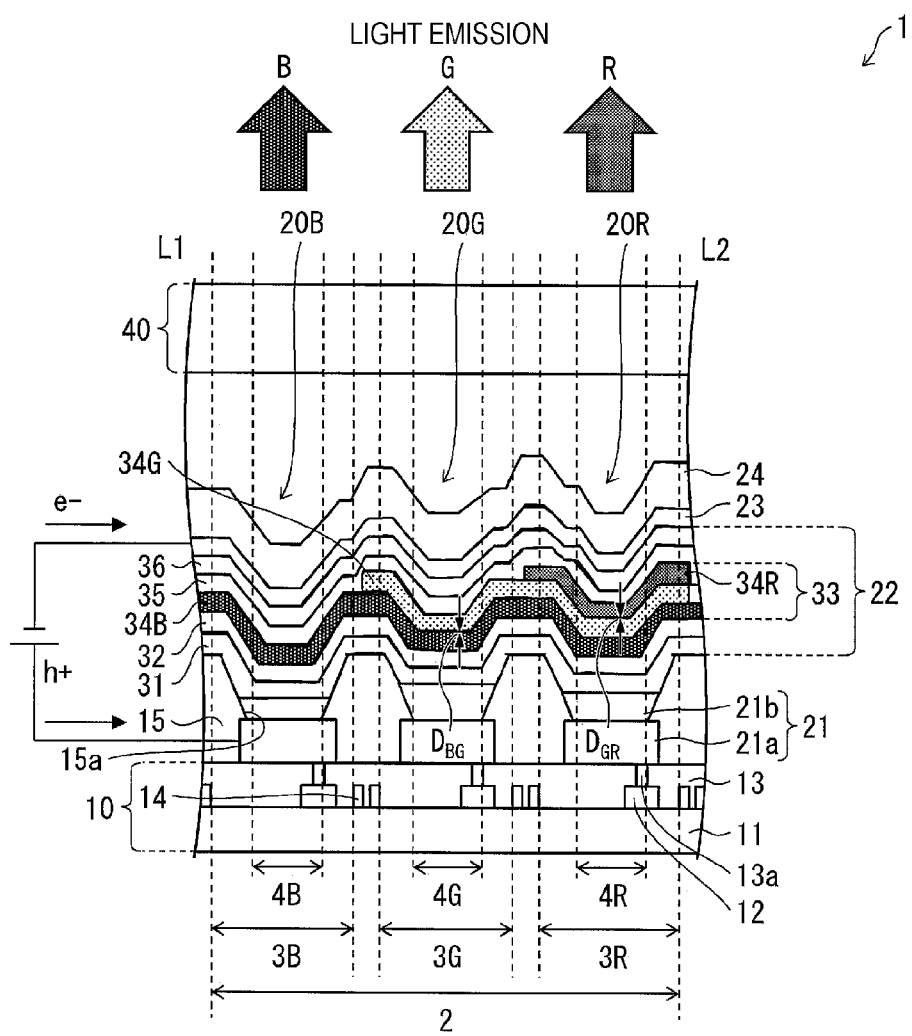
FIG. 4 is a cross-sectional view illustrating an example of a schematic configuration of the organic EL display apparatus according to the first embodiment of the disclosure.
Figure 5A:
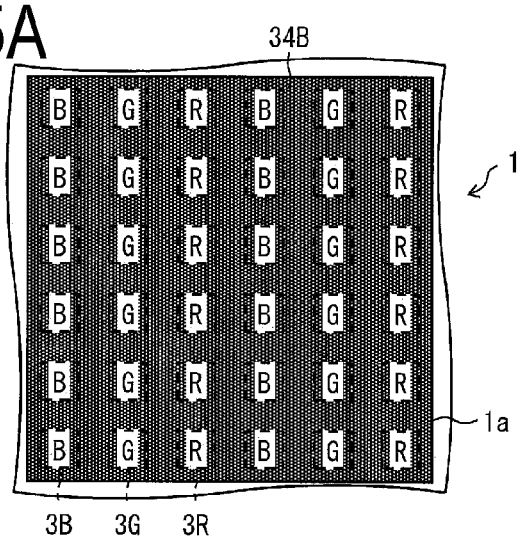
FIGS. 5A to 5C are plan views illustrating a method of layering a blue light-emitting layer, a green light-emitting layer, and a red light-emitting layer in the organic EL display apparatus according to the first embodiment of the disclosure, and the sequence from FIGS. 5A to 5C corresponds to the order of layering.
Figure 5B:
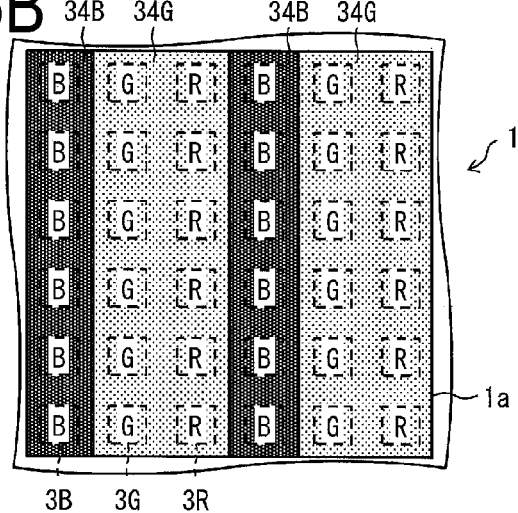
Figure 5C:
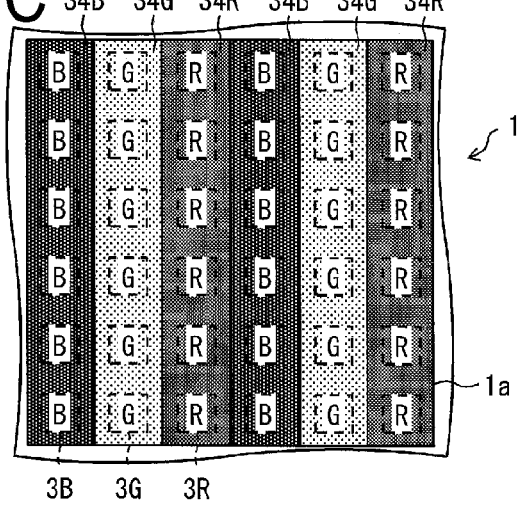

FIG. 1 is a diagram illustrating a schematic configuration of a light-emitting layer unit 33 of an organic EL display apparatus 1 and illustrating a principle of light emission by the light-emitting layer unit 33 according to the present embodiment. FIG. 2A is a diagram illustrating a principle of light emission in a subpixel 3B of the organic EL display apparatus 1 according to the present embodiment. FIG. 2B is a diagram illustrating a principle of light emission in a subpixel 3G of the organic EL display apparatus 1 according to the present embodiment. FIG. 2C is a diagram illustrating a principle of light emission in a subpixel 3R of the organic EL display apparatus 1 according to the present embodiment. FIG. 3 is a plan view schematically illustrating a pixel arrangement of the organic EL display apparatus 1 according to the present embodiment. FIG. 4 is a cross-sectional view illustrating an example of a schematic configuration of the organic EL display apparatus 1 according to the present embodiment. Note that the cross-sectional view of FIG. 4 illustrates an example of a schematic configuration of a single pixel area of the organic EL display apparatus 1 and corresponds to a cross section taken along the line L1-L2 in FIG. 3. FIGS. 5A to 5C are plan views illustrating a method of layering a blue light-emitting layer 34B, a green light-emitting layer 34G, and a red light-emitting layer 34R in the organic EL display apparatus 1 according to the present embodiment, and the sequence from FIGS. 5A to 5C corresponds to the order of layering.

As illustrated in FIG. 3, the organic EL display apparatus 1 according to the present embodiment includes a plurality of pixels 2 arranged in a matrix shape in a display region 1a. Note that in FIG. 3, for the convenience of illustration, the number of the pixels 2 is reduced.

As illustrated in FIG. 3 and FIG. 4, each of the pixels 2 (i.e., a single pixel) includes three subpixels 3B, 3G, and 3R. As illustrated in FIG. 3, the organic EL display apparatus 1 according to the present embodiment is an organic EL display apparatus with a pixel arrangement referred to as a "RGB-stripe arrangement", where the subpixels 3B, 3G, and 3R are arranged in a stripe pattern.

As illustrated in FIG. 4, each of the subpixels 3B includes an organic EL element 20B whose luminescent color is blue (B), each of the subpixels 3G includes an organic EL element 20G whose luminescent color is green (G), and each of the subpixels 3R includes an organic EL element 20R whose luminescent color is red (R).

Each of the subpixels 3B configured to display a first color—blue in this example—(referred also to as "first subpixels", and "blue subpixels") includes the organic EL element 20B whose luminescent color is blue and allows blue light to pass therethrough. Each of the subpixels 3G configured to display a second color—green in this example—(referred also to as "second subpixels", and "green subpixels") includes the organic EL element 20G whose luminescent color is green and allows green light to pass therethrough. Each of the subpixels 3R configured to display a third color—red in this example—(referred also to as "third subpixels", and "red subpixels") includes the organic EL element 20R whose luminescent color is red and allows red light to pass therethrough.

To make the following description simpler, the organic EL elements 20B, 20G, and 20R are collectively referred to simply as the "organic EL elements 20", unless it is necessary to distinguish the organic EL elements 20B, 20G, and 20R from one another. Likewise, the subpixels 3B, 3G, and 3R are collectively referred to simply as the "subpixel 3", unless it is necessary to distinguish the subpixels 3B, 3G, and 3R from one another.

As illustrated in FIG. 4, the organic EL display apparatus 1 has, for example, a configuration including a thin film transistor (TFT) substrate 10 (which may be simply referred to as the "substrate") and a sealing substrate 40 that are bonded together via an unillustrated sealing member. The plurality of organic EL elements 20 of each of the colors described above are formed on the TFT substrate 10.

The plurality of organic EL elements 20, each of which emits light of one of these colors, are enclosed between a pair of substrates including the TFT substrate 10 and the sealing substrate 40. For example, an unillustrated filler layer is formed between the TFT substrate 10 and the sealing substrate 40, that is, in a space where the organic EL elements 20 are layered one upon another. The following description will be based on a case where the TFT substrate 10 has a rectangular shape.

The organic EL display apparatus 1 according to the present embodiment is a top-emitting display apparatus that emits light from the sealing substrate 40 side. Details are described below.

Configuration of TFT Substrate 10

The TFT substrate 10 is a circuit substrate in which TFT circuits including TFTs 12 and wiring lines 14 are formed. The TFT substrate 10 serves as a support substrate and includes an unillustrated insulating substrate 11.

The insulating substrate 11 is not particularly limited as long as it has an insulating property. The insulating substrate 11 may be one of a variety of publicly known insulating substrates: e.g., inorganic substrates including a glass substrate, a quartz substrate, and the like; and plastic substrates including a substrate made from polyethylene terephthalate, polyimide resin, or the like.

Note that as described later, the description of the present embodiment is based on a case where the insulating substrate 11 is a transparent glass substrate (transparent substrate). In a case of the top-emitting organic EL element 20, however, the insulating substrate 11 does not have to be transparent. Hence, in a case where the organic EL display apparatus 1 is a top-emitting organic EL display apparatus as is the case with the present embodiment, the insulating substrate 11 may be an insulating substrate having no transparency (non-transparent substrate). Some examples of such non-transparent substrates are: a semiconductor substrate such as a silicon wafer; a substrate including a metal substrate made from aluminum (Al), iron (Fe), or the like, with its surface coated with an insulating material including silicon oxide, an organic insulating material, or the like; a substrate including a metal substrate made from Al or the like, with its surface subjected to an insulation treatment by a method such as an anode electrode oxidation and other methods.

A plurality of wiring lines 14 are formed on the insulating substrate 11. The plurality of wiring lines 14 includes: a plurality of gate lines formed in a horizontal direction; and a plurality of signal lines formed in a vertical direction and intersecting the gate lines. An interlayer insulating film 13 covers the wiring lines 14 and the TFTs 12. Unillustrated gate line drive circuits are connected to their corresponding gate lines to drive the gate lines. Unillustrated signal line drive circuits are connected to their corresponding signal lines to drive the signal lines.

On the TFT substrate 10, there are areas each of which is surrounded by the wiring lines 14. These areas are the locations where light emitting regions 4B of the organic EL elements 20B, light emitting regions 4G of the organic EL elements 20G, and light emitting regions 4R of the organic EL elements 20R are formed on a one-to-one basis. Hereinafter, the light emitting regions 4B, 4G, and 4R are collectively referred to simply as the "light emitting regions 4", unless it is necessary to distinguish the light emitting regions 4B, 4G, and 4R from one another.

Each area surrounded by the wiring lines 14 is a single subpixel 3 (dot). The light emitting region 4R, 4G, or 4B is defined for each subpixel 3.

Each subpixel 3 includes a plurality of TFTs 12 including a TFT serving as a drive transistor configured to supply a drive current to the organic EL element 20. The light emission intensity of each subpixel 3 is determined by scanning and selection by the wiring lines 14 and the TFTs 12. As described above, the organic EL display apparatus 1 displays images by selectively making each organic EL element 20 emit light of the desired luminance by the use of the TFTs 12.

Configuration of Organic EL Element 20

As illustrated in FIG. 4, each organic EL element 20 includes a first electrode 21, an organic EL layer 22, and a second electrode 23. The organic EL layer 22 is sandwiched by the first electrode 21 and the second electrode 23. In the present embodiment, the term "organic EL layer 22" refers collectively to the layers formed between the first electrode 21 and the second electrode 23.

The organic EL layer 22 is an organic layer including at least one function layer. The organic EL layer 22 in each organic EL element 20 includes the light-emitting layer unit 33 that includes at least one of the blue light-emitting layer 34B, the green light-emitting layer 34G, and the red light-emitting layer 34R. Hereinafter, the blue light-emitting layer 34B, the green light-emitting layer 34G, and the red light-emitting layer 34R are collectively referred to simply as the "light-emitting layers 34" unless it is necessary to distinguish the blue light-emitting layer 34B, the green light-emitting layer 34G, and the red light-emitting layer 34R from one another.

The first electrode 21, the organic EL layer 22, and the second electrode 23 are layered in this order from the side of the TFT substrate 10.

The first electrode 21 is formed in an island-like pattern for each subpixel 3. The end portions of the first electrode 21 are covered with bank 15 (partition, edge cover). The first electrode 21 is connected to the TFTs 12 through a contact hole 13a formed in the interlayer insulating film 13.

The bank 15 is an insulating layer, and is made, for example, from a photosensitive resin. The bank 15 prevents a short-circuit between the first electrode 21 and the second electrode 23 from occurring even in a case where a concentration of electrodes occurs in an end portion of the first electrode 21 or even in a case where the organic EL layer 22 becomes thinner in an end portion of the first electrode 21. In addition, the bank 15 functions also as a pixel separation film configured to prevent electric current from leaking out from one subpixel 3 to an adjacent subpixel 3.

The bank 15 includes openings 15a, each of which corresponds to one of the subpixels 3. As illustrated in FIG. 4, each opening 15a allows a portion of the corresponding first electrode 21 and a portion of the corresponding organic EL layer 22 to be exposed. The exposed portions define the light emitting region 4 of the corresponding subpixel 3. The region other than the light emitting region 4 serves as a non-emissive region.

The second electrode 23 is a common electrode that is common to every subpixel 3. The second electrode 23 is a single electrode common to all the subpixels 3 of the pixel 2. This, however, is not the only possible configuration for the present embodiment. Alternatively, the second electrodes 23 may be formed individually for the subpixels 3.

A protection layer 24 is formed on and covers the second electrode 23. The protection layer 24 protects the second electrode 23 serving as the upper electrode and prevents external oxygen and moisture from infiltrating into each organic EL element 20. Note that the protection layer 24 covers the second electrode 23 of all the organic EL elements 20, and the protection layer 24 is a single layer common to all the organic EL elements 20. In the present embodiment, the first electrode 21, the organic EL layer 22, the second electrode 23, and the protection layer 24 (that is formed when necessary) formed in each subpixel 3 are collectively referred to as the "organic EL element 20".

First Electrode 21 and Second Electrode 23

The first electrode 21 and the second electrode 23 are a pair of electrodes. One of the first and second electrodes 21 and 23 functions as an anode electrode whereas the other one functions as a cathode electrode.

The anode electrode has only to have a function as an electrode configured to inject holes ($h^+$) into the light-emitting layer unit 33. On the other hand, the cathode electrode has only to have a function as an electrode configured to inject electrons ($e^-$) into the light-emitting layer unit 33.

The shape, the structure, and the size of the anode electrode and those of the cathode electrode are not particularly limited and can be appropriately selected according to the application and purpose of the organic EL element 20.

As illustrated in FIG. 4, the description of the present embodiment is based on a case where the first electrodes 21 are provided as patterned anode electrodes and where the second electrodes 23 are provided as a single cathode electrode common to all the subpixels 3 in each pixel 2. This, however, is not the only possible configuration for the present embodiment. Alternatively, the first electrodes 21 may be cathode electrodes and the second electrodes 23 may be anode electrodes. Assume that in a first case the first electrodes 21 are the anode electrodes and the second electrodes 23 are the cathode electrodes and that in a second case the first electrodes 21 are the cathode electrodes and the second electrodes 23 are the anode electrodes. Between the first case and the second case, the order of layering the function layers included in the light-emitting layer unit 33 or the carrier mobility of each of the function layers (carrier transport properties, that is, the hole transport properties and the electron transport properties) is reversed. Likewise, the material for the first electrodes 21 and the material for the second electrodes 23 are also reversed.

Electrode materials capable of being employed as the anode electrode and the cathode electrode are not particularly limited to a specific material, and, for example, known electrode materials may be employed thereto.

As the anode electrode, for example, metals such as gold (Au), platinum (Pt), and nickel (Ni), transparent electrode materials such as indium tin oxide (ITO), tin oxide ($SnO_2$), indium zinc oxide (IZO), gallium-added and zinc oxide (GZO) can be utilized.

On the other hand, it is preferable that a material having a small work function be used for the cathode electrode to inject electrons into the light-emitting layer 34. As the cathode electrode, for example, metals such as lithium (Li), calcium (Ca), cerium (Ce), barium (Ba), and aluminum (Al), or alloys such as Ag (silver)-Mg (magnesium) alloy and Al—Li alloy containing these metals can be utilized.

The thickness of the anode electrode and the thickness of the cathode electrode are not limited to specific thicknesses, and the thicknesses may be similar to the thicknesses of electrodes of related art.

The light generated by the light-emitting layer unit 33 is extracted through either one of the first electrode 21 or the second electrode 23. It is preferable that the electrode through which the light is extracted be a transparent or semi-transparent light-transmissive electrode made from a light-transmissive electrode material (i.e., a transparent electrode or a semi-transparent electrode), and that the electrode through which no light is extracted be either a reflective electrode made from a reflective electrode material or a reflective electrode including a reflective layer.

To put it differently, various kinds of conductive materials are used for the first electrodes 21 and the second electrodes 23. In a case where the organic EL display apparatus 1 is a top-emitting organic EL display apparatus as described above, the first electrodes 21 on the side where the TFT substrate 10, which is a support body configured to support the organic EL element 20, is located be made from a reflective electrode material. In addition, it is preferable that the second electrode 23 located on the opposite side of the organic EL element 20 from the first electrode 21 be made from either a transparent or a semi-transparent light-transmissive electrode material.

Each of the first electrode 21 and the second electrode 23 may have a single layer structure made from one electrode material or may have a layered structure made from a plurality of electrode materials.

Hence, in a case where the organic EL element 20 is a top-emitting organic EL element as described above, the first electrode 21 may have a layered structure including a reflective electrode 21a (reflective layer) and a light-transmissive electrode 21b as illustrated in FIG. 4. In the present embodiment, the first electrode 21 has a configuration where the reflective electrode 21a and the light-transmissive electrode 21b are layered in this order from the TFT substrate 10 side.

Exemplar reflective electrode materials include a black electrode material such as tantalum (Ta) or carbon (C), a reflective metal electrode material such as Al, Ag, gold (Au), Al—Li alloy, Al-neodymium (Nd) alloy, or Al-silicon (Si) alloy.

As the light-transmitting electrode material, for example, a transparent electrode material described above may be employed, or a translucent electrode material such as a thin film of Ag may be used.

The reflective electrode 21a having the same film thickness for each subpixel 3 is independently formed and is connected to the drain electrode of the TFT 12 in each subpixel 3.

The light-transmissive electrode 21b is formed to have an appropriate thickness in accordance with the peak wavelength of the light of the wavelength range of each color of the light emitted from each subpixel 3. The appropriate thickness allows the distance between the reflective electrode 21a and the second electrode 23 serving as the cathode electrode to be a distance that enhances the intensity of the peak wavelength of the light of the wavelength range of each color of the light emitted from each subpixel 3.

Organic EL Layer 22

As illustrated in FIG. 4, the organic EL layer 22 has a configuration including the following function layers: a hole injection layer 31, a hole transport layer 32; the light-emitting layer unit 33 including the light-emitting layer 34; an electron transport layer 35; and an electron injection layer 36. These function layers are layered in this order from the first electrode 21 side. The hole injection layer 31, the hole transport layer 32, the electron transport layer 35, and the electron injection layer 36 are formed across a plurality of pixels 2 as common layers, each of which is common to the plurality of pixels 2. Hence, the hole injection layer 31, the hole transport layer 32, the electron transport layer 35, and the electron injection layer 36 are formed to be common layers that are common to the subpixels 3B, 3G, and 3R.

It should be noted that the function layers other than the light-emitting layer unit 33 are not indispensable to the organic EL layer 22. Hence, each of these functional layers may be selectively formed in accordance with the properties that are required of the organic EL element 20. Each of the function layers mentioned above will be described below.

Light-Emitting Layer Unit 33

As illustrated in FIG. 1 and FIG. 4, the organic EL display apparatus 1 according to the present embodiment includes the light-emitting layer unit 33, which includes the blue light-emitting layer 34B, the green light-emitting layer 34G, and the red light-emitting layer 34R.

As illustrated in FIG. 5A, the blue light-emitting layer 34B is formed, for example, in a solid-like manner all over the entire display region 1a across all the pixels 2, and is formed as a single common layer that is common to the subpixels 3B, 3G, and 3R (i.e., the organic EL elements 20B, 20G, and 20R) of all the pixels 2 (i.e., a common blue light-emitting layer). As illustrated in FIG. 5B, the green light-emitting layers 34G are formed, for example, in a stripe-like manner across the subpixels 3G and 3R in a plurality of pixels 2 that are arranged in the column direction, and each of the green light-emitting layers 34G is formed as a common layer (i.e., common green light-emitting layer) that is common to the subpixels 3G and 3R of each pixel 2 (i.e., common to the organic EL elements 20G and 20R). As illustrated in FIG. 5C, the red light-emitting layers 34R are individual layers and each of the red light-emitting layers 34R is formed only for the subpixel 3R in each pixel 2 (i.e., for the organic EL element 20R). The red light-emitting layers 34R are formed, for example, in a stripe-like manner across the subpixels 3R of a plurality of pixels 2 that are arranged in the column direction.

As illustrated in FIG. 1, FIG. 4, and FIGS. 5A to 5C, the light-emitting layer unit 33 according to the present embodiment has a configuration where in each pixel 2, the blue light-emitting layer 34B, the green light-emitting layer 34G, and the red light-emitting layer 34R, are layered in this order from the first electrode 21 side and are adjacent one another.

Hence, in the present embodiment, in the subpixel 3B, the light-emitting layer unit 33 provided between the first electrode 21 and the second electrode includes only the blue light-emitting layer 34B. In the subpixel 3G, the light-emitting layer unit 33 provided between the first electrode 21 and the second electrode includes the blue light-emitting layer 34B and the green light-emitting layer 34G that are layered in this order from the first electrode 21 side and that are adjacent each other. In the subpixel 3R, the light-emitting layer unit 33 provided between the first electrode 21 and the second electrode includes the blue light-emitting layer 34B, the green light-emitting layer 34G, and the red light-emitting layer 34R that are layered in this order from the first electrode 21 side and that are adjacent one another.

The blue light-emitting layer 34B includes, as a luminescent material (first luminescent material), a blue fluorescent luminescent material that emits blue light. The green light-emitting layer 34G includes, as a luminescent material (second luminescent material), a green fluorescent luminescent material that emits green light. The red light-emitting layer 34R includes, as a luminescent material (third luminescent material), a red fluorescent luminescent material that emits red light.

Figure 6:
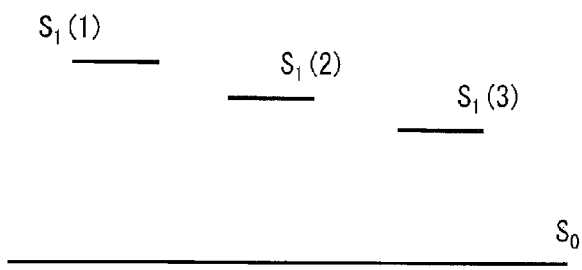
FIG. 6 is a diagram illustrating relations among the energy levels of a blue luminescent material, a green luminescent material, and a red luminescent material when these materials are in the minimum excited singlet state.

FIG. 6 is a diagram illustrating relations among the energy levels of a blue luminescent material, a green luminescent material, and a red luminescent material when these materials are in the minimum excited singlet state. (hereinafter, the energy level in the minimum excited singlet state is referred to as the "$S_1$ level"). In FIG. 6, $S_1(1)$ represents the $S_1$ level of the blue luminescent material, $S_1(2)$ represents the $S_1$ level of the green luminescent material, and $S_1(3)$ represents the $S_1$ level of the red luminescent material. Note that in FIG. 6, $S_0$ represents the singlet ground state.

As illustrated in FIG. 6, $S_1$ level of the green luminescent material ($S_1(2)$) is lower than $S_1$ level of the blue luminescent material ($S_1(1)$)) whereas $S_1$ level of the red luminescent material ($S_1(3)$)) is lower than $S_1$ level of the green luminescent material ($S_1(2)$). To put it differently, $S_1$ level of the green fluorescent luminescent material is lower than $S_1$ level of the blue fluorescent luminescent material whereas $S_1$ level of the red fluorescent luminescent material ($S_1(3)$)) is lower than $S_1$ level of the green fluorescent luminescent material ($S_1(2)$)).

Figure 7:
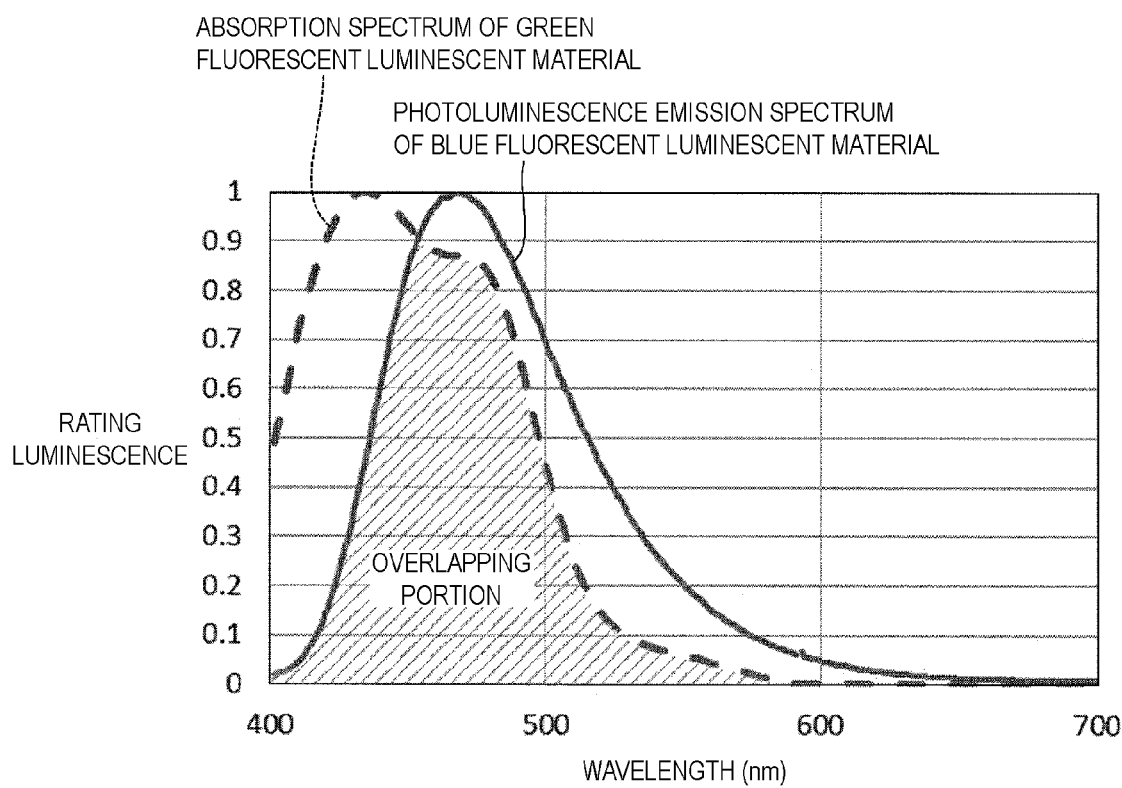
FIG. 7 is a graph showing both an exemplar photoluminescence emission spectrum of a blue fluorescent luminescent material used in the first embodiment of the disclosure and an exemplar absorption spectrum of a green fluorescent luminescent material used in the first embodiment of the disclosure.
Figure 8:
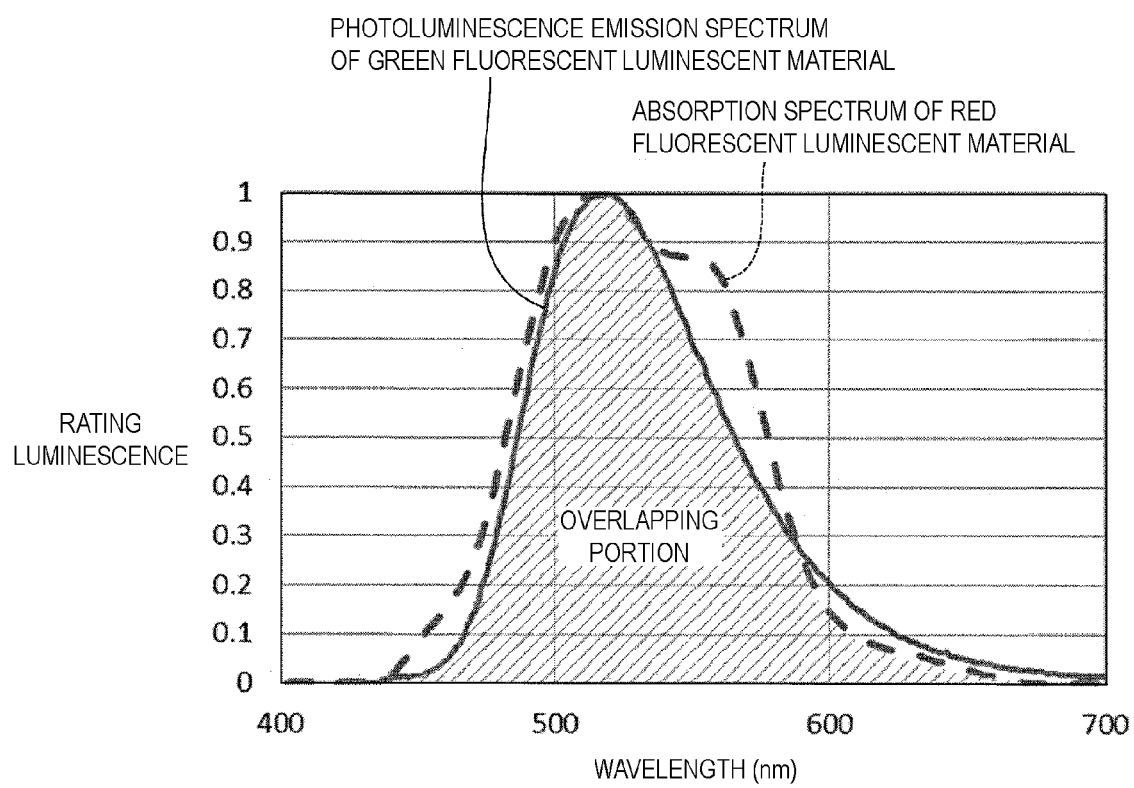
FIG. 8 is a graph showing both an exemplar photoluminescence emission spectrum of a green fluorescent luminescent material used in the first embodiment of the disclosure and an exemplar absorption spectrum of a red fluorescent luminescent material used in the first embodiment of the disclosure.

FIG. 7 is a graph showing both an exemplar photoluminescence (PL) emission spectrum of a blue fluorescent luminescent material and an exemplar absorption spectrum of a green fluorescent luminescent material. FIG. 8 is a graph showing both an exemplar PL emission spectrum of a green fluorescent luminescent material and an exemplar absorption spectrum of a red fluorescent luminescent material.

Note that FIG. 7 illustrates the PL emission spectrum of 2,5,8,11-tetra-tert-butylperylene (TBP) as the PL emission spectrum of the blue fluorescent luminescent material, and also illustrates the absorption spectrum of 2,3-(2-benzothiazolyl)-7-(diethylamino) coumarin (coumarin 6) as the absorption spectrum of the green fluorescent luminescent material. FIG. 8 exhibits the PL emission spectrum of coumarin 6 as the PL emission spectrum of a green fluorescent luminescent material and also exhibits the absorption spectrum of (E)-2-{2-[4-(dimethylamino)styryl]-6-methyl-4H-pyran-4-ylidene}malononitrile (DCM) as the absorption spectrum of a red fluorescent luminescent material.

In a case where the light-emitting layer unit 33 has a layered structure such as one illustrated in FIG. 1 and FIG. 4, it is preferable that a part of the PL emission spectrum of the blue luminescent material (the blue fluorescent luminescent material in the present embodiment) overlap a part of the absorption spectrum of the green luminescent material (the green fluorescent luminescent material in the present embodiment), as illustrated in FIG. 7. In addition, it is preferable that as illustrated in FIG. 8, a part of the PL emission spectrum of the green luminescent material (the green fluorescent luminescent material in the present embodiment) overlap a part of the absorption spectrum of the red luminescent material (the fluorescent luminescent material in the present embodiment).

The overlapping between a part of the PL emission spectrum of the blue luminescent material and a part of the absorption spectrum of the green luminescent material allows the energy transfer from the blue luminescent material to the green luminescent material to occur more easily. In addition, the overlapping between a part of the PL emission spectrum of the green luminescent material and a part of the absorption spectrum of the red luminescent material allows the energy transfer from the green luminescent material to the red luminescent material to occur more easily.

As illustrated in FIG. 1, the blue light-emitting layer 34B and the green light-emitting layer 34G are in a direct contact with each other in each of the subpixels 3G and 3R. Hence, in the subpixels 3G and 3R the distance between the blue light-emitting layer 34B and the green light-emitting layer 34G (i.e., the distance $D_{BG}$ between mutually opposing surfaces of the blue light-emitting layer 34B and the green light-emitting layer 34G) is not greater than Förster radius. In addition, the green light-emitting layer 34G and the red light-emitting layer 34R are in a direct contact with each other in each of the subpixels 3R. Hence, in the subpixel 3R the distance between the green light-emitting layer 34G and the red light-emitting layer 34R (i.e., the distance $D_{GR}$ between mutually opposing surfaces of the green light-emitting layer 34G and the red light-emitting layer 34R) is not greater than Förster radius.

Förster radius refers to the distance between mutually-adjacent light-emitting layers 34 (specifically, in the mutually adjacent light-emitting layers 34, the distance between the two mutually opposing surfaces that are most closely adjacent each other) that may cause Förster transfer to occur. The greater the degree of overlapping between the photoluminescence (PL) emission spectrum of the luminescent material included in a first one of the mutually adjacent light-emitting layers 34 and the absorption spectrum of the luminescent material included in a second one of the mutually adjacent light-emitting layer 34, the greater the Förster radius. In contrast, the smaller degree of overlapping, the smaller the Förster radius. It is commonly understood that Förster radius ranges from 1 to 10 nm, approximately.

Note that Förster transfer refers to an energy transfer between the mutually adjacent light-emitting layers 34, specifically from singlet excitons having higher energy levels exciting the molecules having lower energy levels in the singlet ground state.

Note that this Förster transfer occurs in a case where the mutually adjacent light-emitting layers 34 exist within the Förster radius. In addition, in a case where all of three or more mutually adjacent light-emitting layers 34 exist within the Förster radius as in the above-described case of the subpixel 3R, a plurality of Förster transfers occur in a step-like manner among the three or more mutually adjacent light-emitting layers 34 making the singlet excitons having higher energy levels excite the molecules having lower energy levels in the singlet ground state.

As described earlier, it is commonly understood that Förster radius ranges from 1 to 10 nm, approximately. Hence, the distance between the surface located on the opposite side of the blue light-emitting layer 34B from the surface facing the green light-emitting layer 34G and the surface of the green light-emitting layer 34G facing the blue light-emitting layer 34B is preferably not greater than 10 nm. Hence, in the present embodiment, it is preferable that the blue light-emitting layer 34B have a layer thickness of 10 nm or smaller. Thus, the minimum distance from any position in the blue light-emitting layer 34B to the green light-emitting layer 34G can be reduced down to 10 nm or even smaller. Förster transfer can be made possible even for a molecule of the blue fluorescent luminescent material located on the opposite side of the blue light-emitting layer 34B from the green light-emitting layer 34G.

In addition, the distance between the surface located on the opposite side of the green light-emitting layer 34G from the surface facing the red light-emitting layer 34R and the surface of the red light-emitting layer 34R facing the green light-emitting layer 34G is preferably not greater than 10 nm. Hence, in the present embodiment, it is preferable that the green light-emitting layer 34G have a layer thickness of 10 nm or smaller. Thus, the minimum distance from any position in the green light-emitting layer 34G to the red light-emitting layer 34R can be reduced down to 10 nm or even smaller. Förster transfer can be made possible even for a molecule of the green fluorescent luminescent material located on the opposite side of the green light-emitting layer 34G from the red light-emitting layer 34R.

Note that the layer thickness of the red light-emitting layer 34R may be configured as that in cases of related art and is not limited to a particular thickness.

Note that each light-emitting layer 34 may be made from two components: a host material in charge of the transportation of the carriers (holes and electrons); and a luminescent dopant (guest) material serving as a luminescent material in charge of the light emission. Alternatively, each light-emitting layer 34 may be made from a luminescent material alone.

Of all the materials (components) of the light-emitting layer 34, the material having the highest content percentage may be the host material or may be the luminescent material.

The host material is a material into which holes and electrons can be injected. The host material has a function to transport the holes and the electrons, makes the holes and the electrons recombine with each other within the molecules of the host material, and thus makes the luminous material emit light. In a case where a host material is used, the luminescent material is dispersed uniformly within the host material.

In the case where a host material is used, the host material to be used is an organic compound having a higher $S_1$ level and/or a higher energy level in the minimum excited triplet state (hereinafter referred to as the "$T_1$ level") than that of the luminescent material. Thus, the host material can trap the energy of the luminescent material within the luminescent material and thus can enhance the luminous efficiency by the luminescent material.

Each subpixel 3 having a layering structure according to the present embodiment is intended to efficiently emit the light of the luminescent color that is to be displayed. To this end, it is preferable that the material having the highest content percentage of all the materials for the green light-emitting layer 34G or, desirably, all the materials for the green light-emitting layer 34G be an electron transporting material or electron transporting materials having an electron mobility that is higher than its hole mobility. In this case, the holes (h$^+$) and the electrons (e$^-$) move as indicated by the arrows in FIG. 1.

It is preferable that the material having the highest content percentage of all the materials for the red light-emitting layer 34R or, desirably, all the materials for the red light-emitting layer 34R be an electron transporting material. Alternatively, it is preferable that the red light-emitting layer 34R as a whole exhibit high bipolar transport properties, that is, exhibit both high hole transport properties and high electron transport properties. Note that in a case where the red light-emitting layer 34R exhibits bipolar transport properties, each of the materials contained in the red light-emitting layer 34R may be a material that exhibits the bipolar transport properties by itself. Alternatively, the red light-emitting layer 34R may use a combination of two or more kinds of materials to give bipolar transport properties to the red light-emitting layer 34R. In this case, one material should exhibit high hole transfer properties having a higher hole mobility than its electron mobility, and another material should exhibit high electron transport properties having a higher electron mobility than its hole mobility.

The carrier mobilities of each material for the blue light-emitting layer 34B are not particularly limited, but it is preferable that the material having the highest combination ratio of all the materials for the blue light-emitting layer 34B, or preferably, all the materials for the blue light-emitting layer 34B be an electron transporting material or electron transporting materials. This is because of the following reasons.

By taking into account the recent development situation in the organic EL display apparatus industry, host materials exhibiting better electron transport properties are easier to be synthesized than the host materials exhibiting better hole transport properties. In addition, there are more types of the former host materials than the latter host materials. In this sense, the development of the former host materials has progressed much further than the latter host materials. Hence, selecting an electron transporting material, not a hole transporting material, as the host material allows a material having good properties to be obtained easily.

In fact, electron transporting materials exhibiting very high electron mobilities are better known than hole transporting materials exhibiting very high hole mobilities. For example, of those host materials available in the market, not the ones exhibiting better hole transport properties but the ones exhibiting better electron transport properties are the ones that tend to be driven at lower voltages easily. Hence, a low-voltage driving is more likely to be achieved by the use of the host material exhibiting good electron transport properties than by the use of the host material exhibiting good hole transport properties.

Some examples of the host materials exhibiting better hole transport properties are hole transporting materials such as 4,4'-bis[N-phenyl-N-(3"-methylphenyl)amino]biphenyl (TPD), 9,10-di(2-naphthyl)anthracene(ADN), 1,3-bis(carbazole-9-yl)benzene(mCP), and 3,3'-di(9H-carbazole-9-yl)biphenyl(mCBP). Some examples of the host materials exhibiting better electron transport properties are electron transporting materials such as 2,9-dimethyl-4,7-diphenyl-1,10-phenanthroline(BCP), bis[(2-diphenylphosphoryl)phenyl]ether(DPEPO), 4,4'-bis(2,2-diphenylvinyl)-1,1'-biphenyl(DPVBi), 2,2',2"-(1,3,5-benzinetolyl)-tris(1-phenyl-1-H-benzimidazolyl)(TPBi), and bis(2-methyl-8-quinolinoleate)-4-(phenylphenolate)aluminum(BAlq).

Some examples of the host materials exhibiting better bipolar transport properties are bipolar transporting materials such as 4,4'-bis(9-carbazoyl)-biphenyl(CBP).

Some examples of the blue fluorescent luminescent materials are fluorescent luminescent materials emitting blue light such as 2,5,8,11-tetra-tert-butylperylene(TBPe), bis[4-(9,9-dimethyl-9,10-dihydroacridine)phenyl]sulfone (DMAC-DPS), perylene, and 4,5-bis(carbazole-9-yl)-1,2-dicyanobenzene(2CzPN).

Some examples of the green fluorescent luminescent materials are 3-(2-benzothiazolyl)-7-(diethylamino)coumarin (coumarin6), 8-hydroxyquinoline aluminum(Alq3), 1,2,3,5-tetrakis(carbazole-9-yl)-4,6-dicyanobenzene(4CzIPN), 1,2,3,4-tetrakis(carbazole-9-yl)-5,6-dicyanobenzene (4CzPN), and PXZ-DPS represented by the following formula:

[Chemical Formula 1]

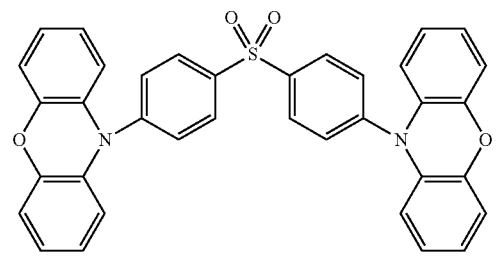

These materials are preferably used.

Some examples of the red fluorescent luminescent materials are: tetraphenyl-dibenzo-periflanthen (DBP), and (E)-2-{2-[4-(dimethylamino)styryl]-6-methyl-4H-pyran-4-ylidene}malononitrile (DCM).

In addition, it is preferable that the blue fluorescent luminescent materials and the green fluorescent luminescent materials be thermally activated delayed fluorescence (TADF) materials. In addition, the red fluorescent luminescent materials may be TADF materials.

A TADF material is a material in which a minimum excited singlet state can be generated by reverse intersystem crossing from minimum excited triplet state by thermal activation. In addition, a TADF material is a delayed fluorescent material that has an extremely small energy difference $\Delta E_{ST}$ between the $S_1$ level and the $T_1$ level. Use of a delayed fluorescent material that has an extremely small energy difference $\Delta E_{ST}$ between the $S_1$ level and the $T_1$ level as the luminescent material makes the thermal energy to cause reverse intersystem crossing from the $T_1$ level to the $S_1$ level. Use of the delayed fluorescence by the TADF material allows even the fluorescence emission to enhance the internal quantum efficiency even up to 100% theoretically. A smaller $\Delta E_{ST}$ results in the easier occurrence of a reverse intersystem crossing from the minimum excited triplet state to the minimum excited singlet state. An energy difference $\Delta E_{ST}$ of 0.3 eV or smaller allows a reverse intersystem crossing to occur relatively easily even at the room temperature.

Some examples of the TADF materials emitting blue light are 2CzPN and DMAC-DPS mentioned above. Some examples of the TADF materials emitting green light are 4CzIPN, 4CzPN, and PXZ-DPS mentioned above.

Some examples of the TADF materials emitting red light are PPZ-DPO represented by the following formula:

[Chemical Formula 2]

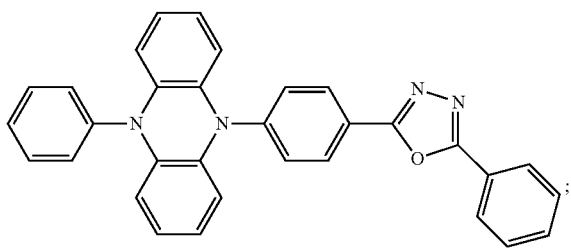

PPZ-DPS represented by the following formula:

[Chemical Formula 3]

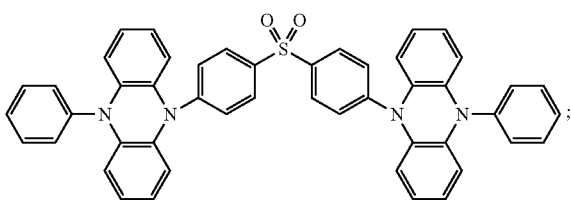

and 4CzTPN-Ph represented by the following formula:

[Chemical Formula 4]

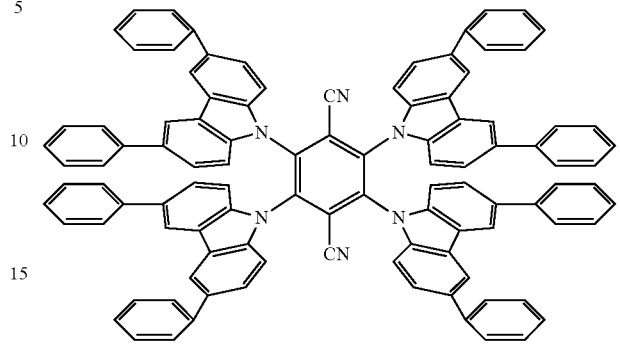

These materials are preferably used.

Hole Injection Layer 31 and Hole Transport Layer 32

The hole injection layer 31 includes a hole injection material and has a function to increase the hole injection efficiency to the light-emitting layer 34. The hole injection layer 31 and the hole transport layer 32 may be formed as mutually independent layers or may be integrated together as a hole injection-cum-transport layer. It is not necessary that both the hole injection layer 31 and the hole transport layer 32 be provided. Only one of the hole injection layer 31 or the hole transport layer 32 (e.g., only the hole transport layer 32) may be provided.

A known material can be used as a material for the hole injection layer 31, the hole transport layer 32, or the hole injection-cum-transport layer, that is, as a hole injection material or as a hole transporting material.

Examples of the material include open chain or heterocyclic conjugated monomers, oligomers, or polymers of naphthalene, anthracene, azatriphenylene, fluorenone, hydrazone, stilbene, triphenylene, benzine, styrylamine, triphenylamine, porphyrins, triazole, imidazole, oxadiazole, oxazole, polyarylalkane, phenylenediamine, arylamine, and derivative thereof, a thiophene-based compound, a polysilane-based compound, a vinyl carbazole-based compound, and an aniline-based compound. Specifically, N,N'-di(naphthalen-1-yl)-N,N'-diphenyl-benzidine (α-NPD), 2,3,6,7,10,11-hexacyano-1,4,5,8,9,12-hexaazatriphenylene (HAT-CN), 1,3-bis(carbazol-9-yl)benzene (mCP), di[4-(N,N-ditolyl-amino)-phenyl]cyclohexane (TAPC), 9,10-diphenylanthracene-2-sulfonate (DPAS), N,N'-diphenyl-N,N'-(4-(di(3-tolyl)amino)phenyl)-1,1'-biphenyl-4,4'-diamine (DNTPD), iridium (III) tris[N,N'-diphenylbenzimidazol-2-ylidene-C2, C2'](Ir(dpbic)$_3$), 4,4',4''-tris-(N-carbazolyl)-triphenylamine (TCTA), 2,2-bis(p-trimellitic oxyphenyl)propanoic anhydride (BTPD), bis[4-(p,p-ditolylamino)phenyl]diphenylsilane (DTASi), or the like is used.

For the hole injection layer 31, the hole transport layer 32, or the hole injection-cum-transport layer, an intrinsic hole injection material or an intrinsic hole transporting material that is not doped with an impurity may be used. Alternatively, the material may be doped with an impurity to enhance the electrical conductivity, or for the like reasons.

To obtain highly-efficient light emission, it is desirable that the excitation energy be trapped within the light-emitting layer unit 33, in particular within the light-emitting layer 34 in the light-emitting layer unit 33. Hence, it is desirable to use, as the hole injection material and the hole transporting material, a material having an $S_1$ level and a $T_1$ level that are excitation levels higher than the $S_1$ level and the $T_1$ level of the luminescent material in the light-emitting layer 34. Hence, it is more preferable to select a material having a high excitation level and a high hole mobility as the hole injection material and the hole-transporting material.
Electron Transport Layer 35 and Electron Injection Layer 36

The electron injection layer 36 includes an electron-injecting material and has a function to increase the electrode injection efficiency to the light-emitting layer 34.

The electron transport layer 35 includes an electron-transporting material and has a function to increase the electron transport efficiency to the light-emitting layer 34.

The electron injection layer 36 and the electron transport layer 35 may be formed as mutually independent layers or may be integrated together as an electron injection-cum-transport layer. It is not necessary that both the electron injection layer 36 and the electron transport layer 35 be provided. Only one of the electron injection layer 36 or the electron transport layer 35, for example, only the electron transport layer 35 may be provided. Needless to say, neither the electron injection layer 36 nor the electron transport layer 35 may be provided.

As a material for the electron injection layer 36, the electron transport layer 35, or the electron injection-cum-transport layer, that is, a material used as the electron-injecting material or the electron-transporting material, a known material can be used.

Some examples of such materials include quinoline, perylene, phenanthroline, bisstyryl, pyrazine, triazole, oxazole, oxadiazole, fluorenone, and derivatives and metal complexes thereof; and lithium fluoride (LiF).

More specific examples thereof include bis[(2-diphenyl-phosphoryl)phenyl]ether (DPEPO), 4,7-diphenyl-1,10-phenanthroline (Bphen), 3,3'-bis(9H-carbazole-9-yl)biphenyl (mCBP), 2,9-dimethyl-4,7-diphenyl-1,10-phenanthroline (BCP), 1,3,5-tris(N-phenylbenzoimidazole-2-yl)benzene (TPBI), 3-phenyl-4(1'-naphthyl)-5-phenyl-1,2,4-triazole (TAZ), 1,10-phenanthroline, Alq(tris(8-hydroxyquinoline)aluminum), LiF, and the like.
Protection Layer 24

The protection layer 24 is made from a transparent insulating material or a transparent conductive material. Some examples of the materials for the protection layer 24 include: inorganic insulating materials such as silicon nitride (SiN), silicon oxide (SiO), silicon oxynitride (SiON), and aluminum oxide ($Al_2O_3$); and conductive materials such as ITO. Note that the protection layer 24 may have a layered structure including both an inorganic insulating layer and an organic insulating layer. Some examples of organic insulating materials that can be used for the organic insulating layer include polysiloxane, silicon oxide carbide (SiOC), acrylate, polyurea, parylene, polyimide, and polyamide.

The thickness of the protection layer 24 is not limited to a particular thickness and may be set, appropriately depending on the material for the protection layer, to a thickness that allows the protection layer 24 to prevent external oxygen and moisture from infiltrating into the organic EL element 20.
Sealing Substrate 40

An insulating substrate, such as a glass substrate and a plastic substrate, is used as the sealing substrate 40. In a case where the organic EL display apparatus 1 is a top-emitting organic EL display apparatus as in the case of the present embodiment, a transparent insulating substrate is used as sealing substrate 40.

Note that the insulating substrate 11 and the sealing substrate 40 may be flexible insulating films. Use of a flexible substrate as each of the insulating substrate 11 and the sealing substrate 40 allows the organic EL display apparatus 1 to be a flexible display apparatus or a bendable display apparatus.

Note that an unillustrated gap spacer may be provided between the TFT substrate 10 and the sealing substrate 40. Thus, the sealing substrate 40 is prevented from hitting the TFT substrate 10, and thus the organic EL element 20 is prevented from being damaged by the hitting.
Production Method of Organic EL Display Apparatus 1

Next, a method of manufacturing the organic EL display apparatus 1 is described below with reference mainly to FIG. 4, FIGS. 5A to 5C, and FIG. 9.

A manufacturing process of the organic EL display apparatus 1 according to the present embodiment includes: a TFT substrate production step for producing the TFT substrate 10 described above; an organic EL element production process for forming the organic EL element 20 on the TFT substrate 10; and a sealing process for sealing the organic EL element 20 having been produced in the organic EL element production process.

The organic EL element production process includes for example, an anode electrode formation process, a hole injection layer formation process, a hole transport layer formation process, a blue light-emitting layer formation process, a green light-emitting layer formation process, a red light-emitting layer formation process, an electron transport layer formation process, an electron injection layer formation process, a cathode electrode formation process, and a protection layer formation process.

In the present embodiment, the processes included in the organic EL element production process are performed in this order. Hence, in the present embodiment, as illustrated in FIG. 4, the reflective electrode 21a, the light-transmissive electrode 21b, the hole injection layer 31, the hole transport layer 32, the blue light-emitting layer 34B, the green light-emitting layer 34G, the red light-emitting layer 34R, the electron transport layer 35, the electron injection layer 36, the second electrode 23, and the protection layer 24 are formed on and over the TFT substrate 10 in this order from the TFT substrate 10 side.

Each of the above-mentioned processes is described below.

Firstly, in the TFT substrate production process, by a publicly known technique, a photosensitive resin is coated on the insulating substrate 11 where the TFTs 12 and the wiring lines 14 have already been formed. Then, a patterning is performed by the use of a photolithography technique to form, on the insulating substrate 11, the interlayer insulating film 13 serving as a flattening film (level-difference compensation film).

The interlayer insulating film 13 may be made from an acrylic resin or a polyimide resin, for example. The film thickness of the interlayer insulating film 13 is not particularly limited as long as the interlayer insulating film 13 can compensate the level differences caused by the TFTs 12.

Next, the contact hole 13a allowing the first electrode 21 serving as an anode electrode to be electrically connected to the TFTs 12 is formed in the interlayer insulating film 13. Thus, the TFT substrate 10 is produced.

Subsequently, on the TFT substrate 10 thus formed, the organic EL element 20 is formed (organic EL element production process).

In the organic EL element production process, firstly, the first electrode 21 serving as an anode electrode is formed on the TFT substrate 10. The anode electrode formation process according to the present embodiment includes a reflective electrode formation process for forming the reflective electrode 21a on the TFT substrate 10; and a light-transmissive electrode formation process for forming the light-transmissive electrode 21b on the reflective electrode 21a.

Hence, in the anode electrode formation process, firstly, on the TFT substrate 10, a predetermined-thickness reflective electrode material is pattern-formed as the reflective electrode 21a in the first electrode 21.

To form the reflective electrode 21a, a film of a reflective electrode material is formed by, for example, a sputtering technique, and then an unillustrated resist pattern is formed for each subpixel 3 by a photolithography technique. Then, the layer of the reflective electrode material is etched by the use of the resist pattern as a mask, followed by the peeling off of the resist pattern and washing. Thus, the patterning of reflective electrodes 21a as separated for individual subpixels 3 is completed. Alternatively, the film is pattern-formed by, for example, a printing technique or a vapor deposition technique using a vapor deposition mask. As the vapor deposition technique, for example a vacuum vapor deposition technique, a chemical vapor deposition (CVD) technique, or a plasma CVD technique may be used.

The thickness of the reflective electrode 21a may be set in a similar manner to a practice of related art and is not particularly limited. An exemplar thickness of the reflective electrode 21a made from Ag is 100 nm.

Next, as the light-transmissive electrode 21b in the first electrode 21, a predetermined-thickness light-transmissive electrode material is pattern-formed on the reflective electrode 21a.

It is preferable that the distance between the reflective electrode 21a and the second electrode 23 serving as the cathode electrode be set to a distance allowing the light emitted from each subpixel 3 to increase the intensity of the peak wavelength of the light of the wavelength range of each color.

Figure 9:
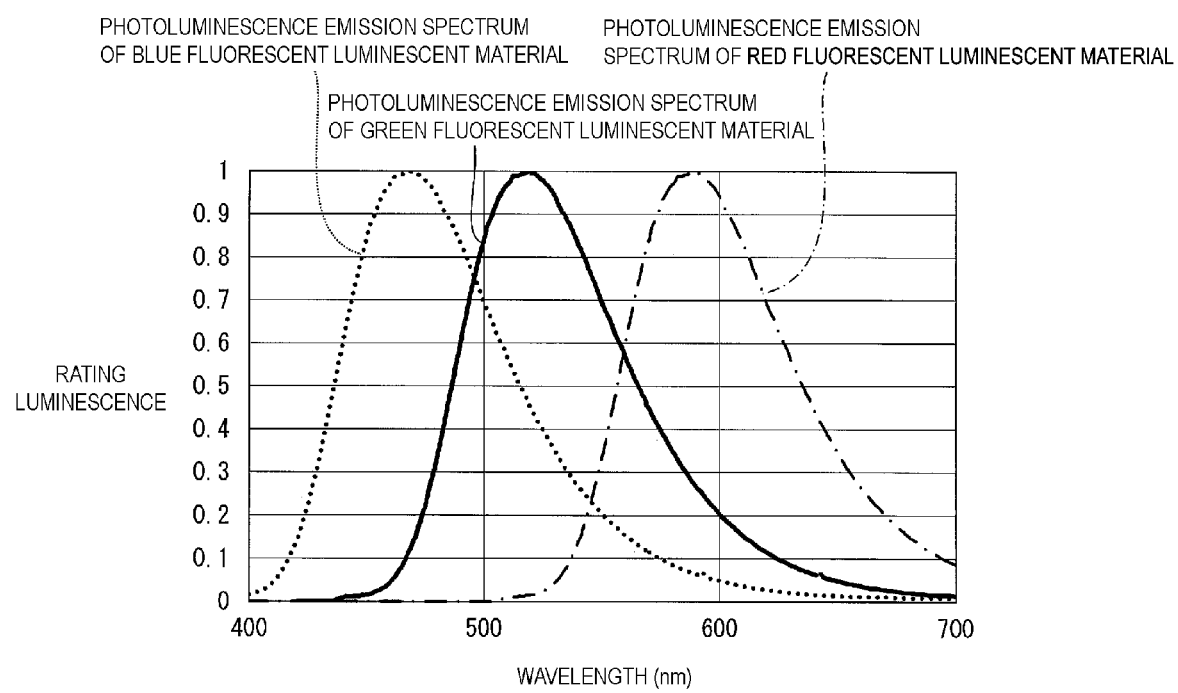
FIG. 9 is a graph showing an exemplar photoluminescence emission spectrum of the blue fluorescent luminescent material, an exemplar photoluminescence emission spectrum of the green fluorescent luminescent material, and an exemplar photoluminescence emission spectrum of a red fluorescent luminescent material.

FIG. 9 is a graph showing an exemplar PL emission spectrum of a blue fluorescent luminescent material, an exemplar PL emission spectrum of a green fluorescent luminescent material, and an exemplar PL emission spectrum of a red fluorescent luminescent material.

Note that in FIG. 9, the PL emission spectrum of a blue fluorescent luminescent material is the PL emission spectrum of TBPe, the PL emission spectrum of a green fluorescent luminescent material is the PL emission spectrum of coumarin 6, and the PL emission spectrum of a red fluorescent luminescent material is the PL emission spectrum of Ir(piq)3.

As illustrated in FIG. 9, the blue fluorescent luminescent material has a peak wavelength (first peak wavelength) of approximately 470 nm, the green fluorescent luminescent material has a peak wavelength (second peak wavelength) of approximately 520 nm, and the red fluorescent luminescent material has a peak wavelength (third peak wavelength) of approximately 590 nm.

The organic EL element 20 according to the present embodiment is an organic EL element of the microcavity (microresonator) type. In the microcavity-type organic EL element, the emitted light is reflected multiple times and resonated between the anode electrode and the cathode electrode, which results in a steep light emission spectrum and an increased light emission intensity at a particular wavelength.

An exemplar method of introducing such a resonance structure (microcavity structure) into an organic EL element is known. The known method is changing, for each luminescent color, the distance between the two resonance surfaces (cavity length), that is, the optical path length, in the organic EL element.

In the present embodiment, the thickness of the light-transmissive electrode 21b is set individually for each subpixel 3. Thus, the cavity length is changed individually for each subpixel 3. The microcavity effect thus obtained helps enhance the chromaticity of the emitted light and the luminous efficiency.

Hence, in the present embodiment, a part of the light emitted from the luminescent material of each subpixel 3 is emitted directly to the outside, but another part thereof is emitted to the outside after the multiple reflections. To put it differently, the light emitted to the outside from each subpixel 3 includes: the light emitted from the luminescent material, then passing through the light-transmissive electrode (i.e., the second electrode 23 in the present embodiment) disposed on the opposite side of the organic EL layer 22 from the reflective electrode, and then let out to the outside; and the light emitted from the luminescent material, then reflected multiple times between the anode electrode and the cathode electrode (strictly speaking, between the reflective electrode and the light-transmissive electrode, or in the present embodiment, between the reflective electrode 21a in the first electrode 21 and the second electrode 23), then passing through the light-transmissive electrode (i.e., the second electrode 23 in the present embodiment) disposed on the opposite side from the reflective electrode, and let out to the outside.

Hence, while in the subpixel 3B, the light emitted from the blue light-emitting layer 34B is let out to the outside, the light that is let out to the outside includes the light obtained by the emission from the blue light-emitting layer 34B (i.e., the light emitted from the blue fluorescent luminescent material) followed by multiple reflections between the anode electrode and the cathode electrode in the subpixel 3B. In addition, while in the subpixel 3G, the light emitted from the green light-emitting layer 34G is let out to the outside, the light that is let out to the outside includes the light obtained by the emission from the green light-emitting layer 34G (i.e., the light emitted from the green fluorescent luminescent material) followed by multiple reflections between the anode electrode and the cathode electrode in the subpixel 3G. In addition, while in the subpixel 3R, the light emitted from the red light-emitting layer 34R is let out to the outside, the light that is let out to the outside includes the light obtained by the emission from the red light-emitting layer 34R (i.e., the light emitted from the red fluorescent luminescent material) followed by multiple reflections between the anode electrode and the cathode electrode in the subpixel 3R.

In the subpixel 3B, the thickness of the light-transmissive electrode 21b is determined to allow the distance between the reflective electrode 21a and the second electrode 23 to be an optimal thickness for the extraction (i.e., letting out) of the light having a wavelength within the wavelength range of blue light (i.e., a distance allowing the intensity of the peak wavelength of the blue fluorescent luminescent material to be increased). Likewise, in the subpixel 3G, the thickness of the light-transmissive electrode 21b is determined to allow the distance between the reflective electrode 21a and the second electrode 23 to be an optimal thickness for the extraction (i.e., letting out) of the light having a wavelength within the wavelength range of green light (i.e., a distance allowing the intensity of the peak wavelength of the green fluorescent luminescent material to be increased). In the subpixel 3R, the thickness of the light-transmissive electrode 21b is determined to allow the distance between the reflective electrode 21a and the second electrode 23 to be an optimal thickness for the extraction (i.e., letting out) of the light having a wavelength within the wavelength range of red light (i.e., a distance allowing the intensity of the peak wavelength of the red fluorescent luminescent material to be increased).

Note that the method for changing the thickness of the light-transmissive electrode 21b in each subpixel 3 is not particularly limited. A vapor deposition technique, a printing technique, or the like technique may be used for forming a film of the light-transmissive electrode material into a thickness desired for each subpixel 3. Still alternatively, a film of the light-transmissive electrode material is firstly formed by a sputtering technique or the like technique, then the film is patterned by a photolithography technique, and then the thickness of each layer made from the light-transmissive electrode material is adjusted to a desirable thickness by an ashing technique or the like technique.

In this way, on the TFT substrate 10, the first electrodes 21 having different layer thicknesses for individual subpixels 3 are formed in a matrix shape.

Next, in a similar manner to the formation of the interlayer insulating film 13, the bank 15 is pattern-formed to cover the end portions of the first electrode 21. By the processes described thus far, the first electrodes 21 serving as the anode electrodes are formed as being separated for individual subpixels 3 by the bank 15.

Next, TFT substrate 10 having been subjected to the processes described above is subjected to a low-pressure baking for dehydration and to an oxygen plasma treatment for washing the surfaces of the first electrodes 21.

Next, in a similar manner to the procedure of related art, the material for the hole injection layer 31 and the material for the hole transport layer 32 are vapor-deposited in this order, by the use of, for example, an open mask or the like, on the entire display region 1a on the TFT substrate 10 where the first electrodes 21 have been formed. As described earlier, none of the hole injection layer 31 and the hole transport layer 32 are an indispensable layer. The layer thickness of the hole injection layer 31 and that of the hole transport layer 32 may be determined in a similar manner to the cases of related art and are not particularly limited.

Next, the blue light-emitting layer 34B is formed to cover the hole transport layer 32 (blue light-emitting layer formation process). As illustrated in FIG. 4 and FIG. 5A, the blue light-emitting layer 34B is formed as a single common light-emitting layer across a plurality of pixels 2. Hence, the material for the blue light-emitting layer 34B is not formed by a separately patterning vapor deposition technique but is vapor-deposited on the entire display region 1a on the TFT substrate 10 by the use of, for example, an open mask as a vapor deposition mask for the blue light-emitting layer formation.

Note that the vapor deposition mask for the blue light-emitting layer formation may be a vapor deposition mask for fixed-mask vapor deposition having the same size as the size of the TFT substrate 10. Alternatively, the vapor deposition mask for the blue light-emitting layer formation may be a vapor deposition mask for scan-vapor deposition to be used in the vapor deposition performed by scanning the film target substrate. The scanning is performed by relatively moving at least one of a vapor deposition unit and the film target substrate (i.e., the TFT substrate 10) in relation to the other one. The vapor deposition unit includes: a vapor deposition source storing a vapor deposition material and a vapor deposition mask having a smaller size than the size of the TFT substrate 10.

Next, as illustrated in FIG. 1, FIG. 4, and FIG. 5B, the green light-emitting layer 34G is formed on the blue light-emitting layer 34B (green light-emitting layer formation process). As illustrated in FIG. 4 and FIG. 5B, the green light-emitting layer 34G is formed as a common layer that is common to the mutually adjacent subpixels 3G and 3R. Hence, the green light-emitting layers 34G are formed on the blue light-emitting layers 34B in a stripe pattern, that is, in straight lines each of which extends in the Y-axis direction, that is, in the column direction. Hence, as illustrated in FIG. 5B, after the green light-emitting layer formation process, in the display region 1a, the blue light-emitting layers 34B and the green light-emitting layers 34G are alternately arranged in the X-axis direction, that is, in the row direction in a plan view (e.g., when viewed from above the TFT substrate 10).

In the green light-emitting layer formation process, the material for the green light-emitting layer 34G is vapor deposited by the use of a vapor deposition mask for green light-emitting layer formation. In the vapor deposition mask for green light-emitting layer formation, openings are formed across the mutually adjacent subpixels 3G and 3R allowing the green light-emitting layers 34G to be formed for both of the subpixels 3G and 3R. Note that like the vapor deposition mask for blue light-emitting layer formation, the vapor deposition mask for green light-emitting layer formation may be a vapor deposition mask for fixed-mask vapor deposition or may be a vapor deposition mask for scan vapor deposition.

Next, as illustrated in FIG. 1, FIG. 4, and FIG. 5C, the red light-emitting layer 34R is formed on the green light-emitting layer 34G (red light-emitting layer formation process). As illustrated in FIG. 4 and FIG. 5C, the red light-emitting layer 34R is formed only for each of the subpixels 3R. Hence, the red light-emitting layers 34R are formed in some portions on the green light-emitting layer 34G by a separately patterning vapor deposition technique, for example, in straight lines each of which extends in the Y-axis direction. Hence, as illustrated in FIG. 5C, after the red light-emitting layer formation process, in the display region 1a, the blue light-emitting layers 34B and the green light-emitting layers 34G, and the red light-emitting layers 34R are alternately arranged in this order in the X-axis direction when viewed from above.

In the red light-emitting layer formation process, the material for the red light-emitting layer 34R is vapor deposited by the use of a vapor deposition mask for red light-emitting layer formation. In the vapor deposition mask for red light-emitting layer formation, openings are formed only for the subpixels 3R allowing the red light-emitting layers 34R to be formed only for the subpixels 3R. Note that the vapor deposition mask for red light-emitting layer formation also may be a vapor deposition mask for fixed-mask vapor deposition or may be a vapor deposition mask for scan vapor deposition.

Then, in a similar manner to the procedure of related art, the material for the electron transport layer 35 and the material for the electron injection layer 36 are vapor-deposited in this order, by the use of, for example, an open mask or the like, on the entire display region 1a on the TFT substrate 10 where the light-emitting layers 34 of the above-mentioned individual colors have been formed. As described earlier, none of the electron transport layer 35 and the electron injection layer 36 are an indispensable layer. The layer thickness of the electron transport layer 35 and that of the electron injection layer 36 may be determined in a similar manner to the cases of related art and are not particularly limited.

Next, the second electrode 23 serving as the cathode electrode is formed on the entire display region 1a on the TFT substrate 10 to cover the electron injection layer 36. The second electrode 23 may be formed by: vapor deposition techniques such as a vacuum vapor deposition technique, a CVD technique, and a plasma CVD technique; a sputtering technique; a printing technique; or the like.

Then, the material for the protection layer 24 is vapor-deposited on the entire display region 1a on the TFT substrate 10 to cover the second electrode 23. In this way, the organic EL elements 20 are formed on the TFT substrate 10.

Then, as illustrated in FIG. 4, by performing the sealing process, the TFT substrate 10 with the organic EL elements 20 and the sealing substrate 40 are bonded together with an unillustrated filler layer and a sealing member disposed in between. Thus, the organic EL display apparatus 1 according to the present embodiment is obtained. Note that the method of sealing the organic EL elements 20 is not limited to the above-described method. Alternatively, publicly-known sealing techniques of various kinds may be employed.

Display Method of Organic EL Display Apparatus 1

Next, a display method for making the organic EL display apparatus 1 according to the present embodiment display images is described below with reference to FIG. 1, FIGS. 2A to 2C, and FIG. 4.

As described earlier, the organic EL display apparatus 1 includes a plurality of subpixels 3 each of which includes an organic EL element 20 including a light-emitting layer 34 of the corresponding color. The organic EL display apparatus 1 achieves the displaying of color images by selectively making the organic EL elements 20 in the individual subpixels 3 at desired luminance by the use of color TFTs 12. Light emission in each subpixel 3 is described below.

The organic EL display apparatus 1 according to the present embodiment is an active matrix organic EL display apparatus and has a display region where a plurality of pixels 2 are arranged in a matrix shape.

The organic EL display apparatus 1 according to the present embodiment differs from a known organic EL display apparatus with a pixel arrangement known as the RGB-stripe arrangement in that the subpixels 3B, 3G, and 3R have different layer structures from one another as illustrated in FIG. 1 and FIG. 4.

In the organic EL display apparatus 1 according to the present embodiment, as illustrated in FIG. 4, the holes ($h^+$) and the electrons ($e^-$) having been injected into the organic EL layer 22 respectively from the first electrode 21 and the second electrode 23 are recombined together in the blue light-emitting layer 34B in the subpixel 3B, and thus excitons are generated there as illustrated in FIG. 1 and FIG. 2A. The excitons thus generated emit light when decayed back to the ground state. As a result, the subpixel 3B achieves almost 100% blue light emission (blue fluorescence emission).

In addition, as described earlier, an electron transporting material is used as the material having the highest content percentage in the green light-emitting layer. Hence, in the subpixel 3G, depending on the carrier balance among the light-emitting layers 34, especially the carrier balance between the blue light-emitting layer 34B and the green light-emitting layer 34G, the holes and the electrons having been injected into the organic EL layer 22 respectively from the first electrode 21 and the second electrode 23 are recombined together in either the blue light-emitting layer 34B or the green light-emitting layer 34G, generating excitons. In a case where excitons are generated in the green light-emitting layer 34G, the green light-emitting layer 34G achieves almost 100% green light emission (green fluorescence emission).

FIG. 1 and FIG. 2B illustrate an exemplar case where excitons are generated in the blue light-emitting layer 34B. As described earlier, the $S_1$ level of the green fluorescent luminescent material is lower than the $S_1$ level of the blue fluorescent luminescent material. The blue light-emitting layer 34B and the green light-emitting layer 34G are mutually adjacent, and a part of the PL emission spectrum of the blue fluorescent luminescent material overlaps a part of the absorption spectrum of the green fluorescent luminescent material.

Hence, as illustrated in FIG. 1 and FIG. 2B, in a case where excitons are generated in the blue light-emitting layer 34B, the Förster transfer from the $S_1$ level of the blue fluorescent luminescent material to the $S_1$ level of the green fluorescent luminescent material does occur, and as a result, almost 100% green light emission (green fluorescence emission) is achieved.

Consequently, in the present embodiment, despite the configuration of the subpixel 3G including both the blue light-emitting layer 34B and the green light-emitting layer 34G, the color mixing in the subpixel 3G is suppressed.

In addition, as described earlier, either an electron transporting material or a bipolar transporting material is used as the material having the highest content percentage of all the materials in the red light-emitting layer 34R. In addition, an electron transporting material is used as the material having the highest content percentage in the green light-emitting layer 34G. Hence, in the subpixel 3R, depending on the carrier balance among the light-emitting layers 34, especially the carrier balance between the blue light-emitting layer 34B and the green light-emitting layer 34G, the holes and the electrons having been injected into the organic EL layer 22 respectively from the first electrode 21 and the second electrode 23 are recombined together in either the blue light-emitting layer 34B or the green light-emitting layer 34G, generating excitons. In a case, for example, where an electron transporting material is used as the material having the highest content percentage of all the materials in the blue light-emitting layer 34B, excitons are generated in the blue light-emitting layer 34B.

FIG. 1 and FIG. 2C illustrate an exemplar case where excitons are generated in the blue light-emitting layer 34B. As described earlier, the $S_1$ level of the green fluorescent luminescent material is lower than the $S_1$ level of the blue fluorescent luminescent material. The blue light-emitting layer 34B and the green light-emitting layer 34G are mutually adjacent, and a part of the PL emission spectrum of the blue fluorescent luminescent material overlaps a part of the absorption spectrum of the green fluorescent luminescent material. In addition, the $S_1$ level of the red fluorescent luminescent material is lower than the $S_1$ level of the green fluorescent luminescent material. The green light-emitting layer 34G and the red light-emitting layer 34R are mutually adjacent, and a part of the PL emission spectrum of the green fluorescent luminescent material overlaps a part of the absorption spectrum of the red fluorescent luminescent material.

Hence, as illustrated in FIG. 1 and FIG. 2C, in the subpixel 3R, in a case where excitons are generated in the blue light-emitting layer 34B, Förster transfer occurs from the $S_1$ level of the blue fluorescent luminescent material to the $S_1$ level of the green fluorescent luminescent material. Then, Förster transfer occurs from the $S_1$ level of the green fluorescent luminescent material to the $S_1$ level of the red fluorescent luminescent material. As a consequence, almost 100% red light emission (red fluorescence emission) is achieved. In this case, use of a TADF material as the blue fluorescent luminescent material causes reverse intersystem crossing to convert upwardly the excitons with a 75% $T_1$ level generated in the blue light-emitting layer 34B to the $S_1$ level. Hence, the luminous efficiency in the subpixel 3B and the luminous efficiency in the subpixel 3G can be improved to a great degree.

In the subpixel 3R, in a case where excitons are generated in the green light-emitting layer 34G, the Förster transfer from the $S_1$ level of the green fluorescent luminescent material to the $S_1$ level of the red fluorescent luminescent material does occur, and as a result, the subpixel 3R achieves almost 100% red light emission (red fluorescence emission). In this case, use of a TADF material as the green fluorescent luminescent material causes reverse intersystem crossing to convert upwardly the excitons with a 75% $T_1$ level generated in the green light-emitting layer 34G to the $S_1$ level. Hence, the luminous efficiency in the subpixel 3G and in the subpixel 3R can be improved to a great degree.

Consequently, in the present embodiment, despite the configuration of the subpixel 3R including the blue light-emitting layer 34B, the green light-emitting layer 34G, and the red light-emitting layer 34R, the color mixing in the subpixel 3R is suppressed.

Advantageous Effects

As has been described thus far, in the present embodiment, the blue light-emitting layer 34B is formed as a common light-emitting layer that is common to the subpixel 3B, the subpixel 3G, and the subpixel 3R. In addition, the green light-emitting layer 34G is formed as a common light-emitting layer that is common to both the subpixel 3G and the subpixel 3R. Hence, while the productivity is enhanced by the use of the common light-emitting layers, light is emitted by uses of the Förster-type energy transfer of the luminescent materials and the transferable distance.

According to the present embodiment, as described above, the blue light-emitting layer 34B is formed in the entire display region 1a and thus is common to the subpixel 3B, the subpixel 3G, and the subpixel 3R. Hence, not all the light-emitting layers 34 have to be formed by the separately patterning vapor deposition technique. According to the present embodiment, the blue light-emitting layer 34B is vapor-deposited in the entire display region 1a and thus is common to all the subpixels 3 including the subpixels 3B, subpixels 3G, and the subpixels 3R. This reduces the number of separate-patterning vapor-deposition sessions using different vapor deposition masks.

In addition, according to the present embodiment, as described earlier, in the subpixel 3B, the blue light-emitting layer 34B achieves almost 100% light emission. In addition, as described earlier, in the subpixel 3G, the blue light-emitting layer 34B and the green light-emitting layer 34G are layered, but the green light-emitting layer 34G achieves almost 100% light emission. In the subpixel 3R, the blue light-emitting layer 34B, the green light-emitting layer 34G, and the red light-emitting layer 34R are layered, but the red light-emitting layer 34R achieves almost 100% light emission. In addition, according to the present embodiment, it is not necessary to form, separately, a color filter or a color conversion layer. Hence, according to the present embodiment, each subpixel 3 can obtain its own luminescent color with a high efficiency without causing any color mixing or color shift to take place. As a result, a higher resolution can be achieved easily. In addition, the present embodiment has a higher degree of freedom in selecting the carrier mobilities and in selecting the materials than in the cases of related art.

In addition, according to the present embodiment, the subpixel 3B, the subpixel 3G, and the subpixel 3R emit light having mutually different peak wavelengths. Hence, according to the present embodiment, unlike the case of the white CF technique, it is not necessary to make the blue light-emitting layer 34B, the green light-emitting layer 34G, and the red light-emitting layer 34R emit light simultaneously. Accordingly, the power consumption at the time of driving the display apparatus can be reduced.

In addition, according to the present embodiment, the unnecessity of any color filters that would otherwise have to be separately provided reduces the manufacturing cost and eliminates the possible energy loss that would otherwise be caused by the use of the color filters.

Hence, the present embodiment provides a display apparatus, along with a manufacturing method thereof, that is capable of: preventing color mixing or color shift from occurring in each subpixel; achieving a high efficiency in providing each luminescent color; and reducing the power consumption when driven and reducing the manufacturing cost from their respective counterparts of display apparatus of related art.

Modified Example

Note that the present embodiment has been described above based on a case where the display apparatus according to the present embodiment is an organic EL display apparatus. The display apparatus according to the present embodiment has only to be a display apparatus capable of performing PL light emission. Hence, the display apparatus according to the present embodiment is not limited to the illustrative case described above but may be, for example, an inorganic EL display apparatus or any other display apparatus that is not an EL display apparatus but that uses PL light emission. In addition, by the use of an inorganic material as each of the luminescent materials, inorganic layers may be formed instead of the organic layers.

In addition, in the present embodiment, the blue light-emitting layer 34B is formed as the first light-emitting layer, the green light-emitting layer 34G is formed as the second light-emitting layer, the red light-emitting layer 34R is formed as the third light-emitting layer. The present embodiment, however, is not limited to such an example. The combination of the first luminescent material in the first light-emitting layer, the second luminescent material in the second light-emitting layer, and the third luminescent material in the third light-emitting layer is not limited to the combination of the blue fluorescent luminescent material, the green fluorescent luminescent material, and the red fluorescent luminescent material. Any combination is allowable as long as: the second luminescent material emits light having a longer peak wavelength (second peak wavelength) than the peak wavelength (first peak wavelength) of the light emitted from the first luminescent material, the third luminescent material emits light having a longer peak wavelength (third peak wavelength) than the second peak wavelength, and the second luminescent material has an $S_1$ level that is lower than the $S_1$ level of the first luminescent material but that is higher than the $S_1$ level of the third luminescent material.

Second Embodiment

A description will be given of another embodiment of the disclosure, with reference mainly to FIGS. 10A to 10C.

The present embodiment will be described about differences between the present embodiment and the first embodiment, and components having the same functions as those of the components described in the first embodiment are appended with the same reference signs, and the description thereof is omitted. Obviously, the same modifications as those of the first embodiment may also be applied to the present embodiment.

Schematic Configuration of Organic EL Display Apparatus 1 and Method for Manufacturing Same The organic EL display apparatus 1 according to the present embodiment has a configuration that is identical to the configuration of the organic EL display apparatus 1 according to the first embodiment except that a red phosphorescent luminescent material is used as a luminescent material of the red light-emitting layer 34R. Hence, FIG. 4 can be used as a cross-sectional view illustrating a schematic configuration of the organic EL display apparatus 1 according to the present embodiment. In addition, FIG. 1 can be used as a cross-sectional view illustrating a schematic configuration of the light-emitting layer unit 33 of the organic EL display apparatus 1 according to the present embodiment, and FIG. 3 can be used as a schematic plan view illustrating the pixel arrangement of the organic EL display apparatus 1 according to the present embodiment.

In addition, a method for manufacturing the organic EL display apparatus 1 according to the present embodiment is identical to the method of manufacturing the organic EL display apparatus 1 according to the first embodiment except that a red phosphorescent luminescent material is used as a luminescent material of the red light-emitting layer 34R.

Some examples of the red phosphorescent luminescent materials are tris(1-phenylisoquinoline)iridium (III) (Ir(piq)3), and bis(2-benzo[b]thiophene-2-yl-pyridine)(acetylacetonate)iridium (III) (Ir(btp)2(acac)).

As illustrated in FIG. 6 in the first embodiment, the $S_1$ level of the green luminescent material ($S_1(2)$) is lower than the $S_1$ level of the blue luminescent material ($S_1(1)$) whereas the $S_1$ level of the red luminescent material ($S_1(3)$) is lower than $S_1$ level of the green luminescent material ($S_1(2)$). To put it differently, the $S_1$ level of the green fluorescent luminescent material is lower than the $S_1$ level of the blue fluorescent luminescent material whereas the $S_1$ level of the red phosphorescent luminescent material ($S_1(3)$) is lower than the $S_1$ level of the green fluorescent luminescent material ($S_1(2)$).

In addition, as described earlier in the first embodiment, in a case where the light-emitting layer unit 33 has a layered structure such as one illustrated in FIG. 1 and FIG. 4, it is preferable that even in a case of using a red phosphorescent luminescent material as a red luminescent material, a part of the PL emission spectrum of the blue luminescent material (the blue fluorescent luminescent material in the present embodiment) overlap a part of the absorption spectrum of the green luminescent material (the green fluorescent luminescent material in the present embodiment), as described in the first embodiment. In addition, it is preferable that even in a case of using a red phosphorescent luminescent material as a red luminescent material, a part of the PL emission spectrum of the green luminescent material (the green fluorescent luminescent material in the present embodiment) overlap a part of the absorption spectrum of the red luminescent material (the red phosphorescent luminescent material in the present embodiment). Note that as the $T_1$ level represents a lower energy than the $S_1$ level, the absorption spectrum of the red phosphorescent luminescent material has a longer wavelength than the wavelength of the absorption spectrum of the red fluorescent luminescent material. The wavelength of the absorption spectrum of the red phosphorescent luminescent material is close to the wavelength of the absorption spectrum of the red fluorescent luminescent material. Hence, as in the case of the first embodiment where both the green luminescent material and the red luminescent material are fluorescent luminescent materials, there is sufficiently large overlapping between the spectra mentioned above.

Accordingly, as described above, the overlapping between a part of the PL emission spectrum of the blue luminescent material (the blue fluorescent luminescent material in the present embodiment) and a part of the absorption spectrum of the green luminescent material (the green fluorescent luminescent material in the present embodiment) allows the energy transfer from the blue luminescent material to the green luminescent material to occur more easily. In addition, also in the present embodiment, the overlapping between a part of the PL emission spectrum of the green luminescent material (the green fluorescent luminescent material in the present embodiment) and a part of the absorption spectrum of the red luminescent material (the red phosphorescent luminescent material in the present embodiment) allows the energy transfer from the green luminescent material to the red luminescent material to occur more easily.

Note that by dispersing red phosphorescent luminescent material in the host material and thus reducing the content percentage of the red phosphorescent material in the red light-emitting layer 34R (e.g., down to less than 10 wt %), particles of the red phosphorescent luminescent material can be separated by the host material, and thus the Dexter transfer can be made harder to happen. Consequently, the energy transfer from the green light-emitting layer 34G to the red light-emitting layer 34R can be achieved mainly by the Förster transfer.

Display Method of Organic EL Display Apparatus 1

Next, a display method for making the organic EL display apparatus 1 according to the present embodiment display images is described below with reference to FIG. 1, and FIGS. 10A to 10C.

Figure 10A:
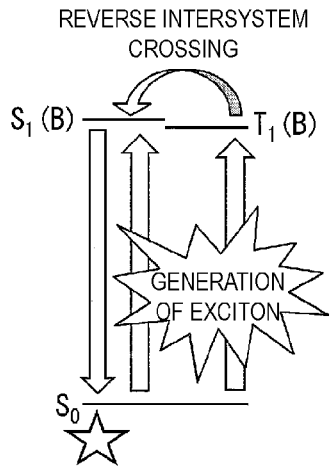
FIG. 10A is a diagram illustrating a principle of light emission in a blue subpixel of the organic EL display apparatus according to a second embodiment of the disclosure.
Figure 10B:
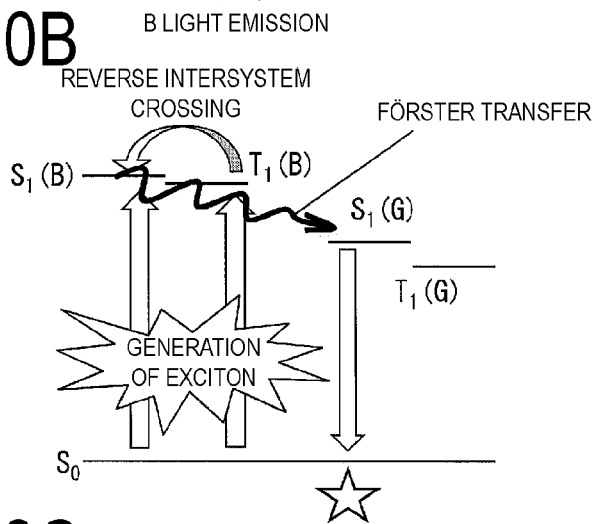
FIG. 10B is a diagram illustrating a principle of light emission in a green subpixel of the organic EL display apparatus according to the second embodiment of the disclosure.

FIG. 10A is a diagram illustrating a principle of light emission in the subpixel 3B of the organic EL display apparatus 1 according to the present embodiment. FIG. 10B is a diagram illustrating a principle of light emission in the subpixel 3G of the organic EL display apparatus 1 according to the present embodiment. FIG. 10C is a diagram illustrating a principle of light emission in the subpixel 3R of the organic EL display apparatus 1 according to the present embodiment.

The subpixels 3B and 3G of the organic EL display apparatus 1 according to the present embodiment have configurations that are identical to their respective counterparts of the subpixels 3B and 3G of the organic EL display apparatus 1 according to the first embodiment. Hence, as illustrated in FIGS. 10A and 10B, the subpixels 3B and 3G of the organic EL display apparatus 1 according to the present embodiment emit light based on the same principles of light emission that are identical to their respective counterparts of the subpixels 3B and 3G of the organic EL display apparatus 1 according to the first embodiment, which are illustrated in FIG. 1, FIG. 2A, and FIG. 2B.

Hence, the organic EL display apparatus 1 according to the present embodiment includes the subpixels 3B, where excitons are generated in the blue light-emitting layer 34B and that achieve almost 100% blue light emission (blue fluorescence emission) as in the case of the first embodiment. In addition, as described in the first embodiment, in the subpixel 3G, depending on the carrier balance between the blue light-emitting layer 34B and the green light-emitting layer 34G, excitons are generated in either the blue light-emitting layer 34B or the green light-emitting layer 34G. In the subpixel 3G, in a case where excitons are generated in the green light-emitting layer 34G, the green light-emitting layer 34G achieves almost 100% green light emission (green fluorescence emission). In the subpixel 3G, in a case where excitons are generated in the blue light-emitting layer 34B, the Förster transfer from green $S_1$ level of the blue fluorescent luminescent material to the $S_1$ level of the green fluorescent luminescent material does occur, and as a result, the subpixel 3G achieves almost 100% green light emission (green fluorescence emission).

Figure 10C:
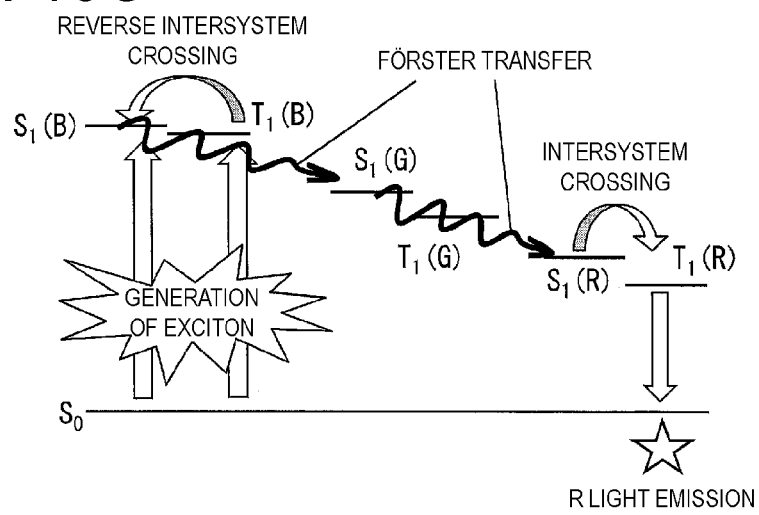
FIG. 10C is a diagram illustrating a principle of light emission in a red subpixel of the organic EL display apparatus according to the second embodiment of the disclosure.

In addition, FIG. 1 and FIG. 10C illustrates an exemplar case where excitons are generated in the blue light-emitting layer 34B as in the case of FIG. 2C. Also in the subpixel 3R, depending on the carrier balance between the blue light-emitting layer 34B and the green light-emitting layer 34G, electrons are generated either in the blue light-emitting layer 34B or in the green light-emitting layer 34G as in the case of the first embodiment.

As described earlier in the first embodiment, the $S_1$ level of the green fluorescent luminescent material is lower than the $S_1$ level of the blue fluorescent luminescent material. The blue light-emitting layer 34B and the green light-emitting layer 34G are mutually adjacent, and a part of the PL emission spectrum of the blue fluorescent luminescent material overlaps a part of the absorption spectrum of the green fluorescent luminescent material.

In addition, the red phosphorescent luminescent material has an $S_1$ level that is lower than the $S_1$ level of the green fluorescent luminescent material as in the case of the $S_1$ level red fluorescent luminescent material. In addition, the green light-emitting layer 34G and the red light-emitting layer 34R are adjacent to each other. In addition, a part of the PL emission spectrum of the green fluorescent luminescent material overlaps a part of the absorption spectrum of the red phosphorescent luminescent material.

Hence, as in the case of the first embodiment, in the subpixel 3R, in a case where excitons are generated in the blue light-emitting layer 34B as illustrated in FIG. 1 and FIG. 10C, Förster transfer occurs from the $S_1$ level of the blue fluorescent luminescent material to the $S_1$ level of the green fluorescent luminescent material. Then, Förster transfer occurs from the $S_1$ level of the green fluorescent luminescent material to the $S_1$ level of the red fluorescent luminescent material. On the other hand, in the subpixel 3R, in a case where excitons are generated in the green light-emitting layer 34G, the Förster transfer from the $S_1$ level of the green fluorescent luminescent material to the $S_1$ level of the red phosphorescent luminescent material does occur. In this case, use of a TADF material as the blue fluorescent luminescent material causes reverse intersystem crossing to convert upwardly the excitons with a 75% $T_1$ level generated in the blue light-emitting layer 34B to the $S_1$ level. Hence, the luminous efficiency in the subpixel 3B and the luminous efficiency in the subpixel 3G can be improved to a great degree. The principle of display up to this point is the same as that in the first embodiment despite the use of a different red luminescent material.

Note that in the present embodiment, a red phosphorescent material is used as a red luminescent material. Hence, the occurrence of Förster transfer from the $S_1$ level of the green fluorescent luminescent material to the $S_1$ level of the red phosphorescent luminescent material causes intersystem crossing to occur later in the red light-emitting layer 34R from the $S_1$ level to the $T_1$ level. Hence, triplet excitons are generated in the red light-emitting layer 34R. Light is emitted when the triplet excitons in the red phosphorescent luminescent material are decayed back to the ground state. As a result, the subpixel 3R achieves almost 100% red light emission (red phosphorescent light emission in the present embodiment).

Advantageous Effects

As has been described thus far, in the present embodiment, the blue light-emitting layer 34B is formed as a common light-emitting layer that is common to the subpixel 3B, the subpixel 3G, and the subpixel 3R. In addition, the green light-emitting layer 34G is formed as a common light-emitting layer that is common to both the subpixel 3G and the subpixel 3R. Hence, while the productivity is enhanced by the use of the common light-emitting layers, light can be emitted by uses of the Förster-type energy transfer of the luminescent materials and the transferable distance. Accordingly, the present embodiment can also obtain similar advantageous effects to those of the first embodiment.

Third Embodiment

A description will be given of yet another embodiment of the disclosure, with reference mainly to FIG. 11 and FIGS. 12A to 12C.

The present embodiment will be described about differences between the present embodiment and the first and second embodiments, and components having the same functions as those of the components described in the first and second embodiments are denoted by the same reference signs, and the description thereof is omitted. Obviously, similar modifications to those of the first and second embodiments may also be applied to the present embodiment.

Figure 11:
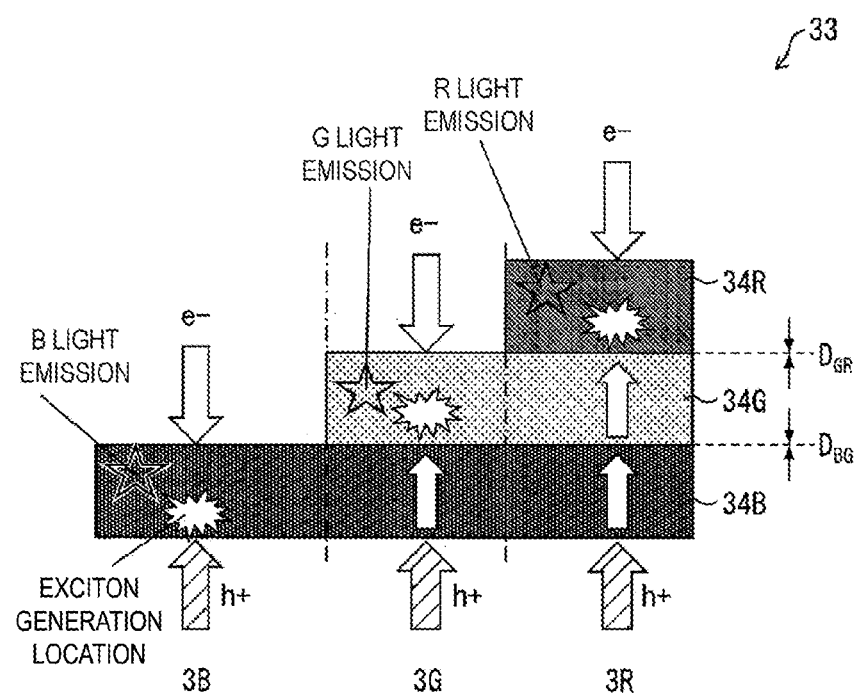
FIG. 11 is a diagram illustrating a schematic configuration of a light-emitting layer unit of an organic EL display apparatus and illustrating a principle of light emission by the light-emitting layer unit according to a third embodiment of the disclosure.

Schematic Configuration of Organic EL Display Apparatus 1 and Method for Manufacturing Same FIG. 11 is a diagram illustrating a schematic configuration of the light-emitting layer unit 33 of the organic EL display apparatus 1 and illustrating a principle of light emission by the light-emitting layer unit 33 according to the present embodiment.

The organic EL display apparatus 1 according to the present embodiment has an identical configuration to that of the first embodiment or that of the second embodiment except that a hole transporting material is used both as a material having the highest content percentage in the blue light-emitting layer 34B and as a material having the highest content percentage in the green light-emitting layer 34G; and that either a bipolar transporting material or an electron transporting material is used as the material having the highest content percentage of all the materials in the red light-emitting layer 34R. Note that the movement of the holes (h+) and the movement of the electrons (e−) are indicated by arrows in FIG. 11. Hence, FIG. 4 can be used as a cross-sectional view illustrating a schematic configuration of the organic EL display apparatus 1 according to the present embodiment, and FIG. 3 can be used as a schematic plan view illustrating the pixel arrangement of the organic EL display apparatus 1 according to the present embodiment.

In addition, a method of manufacturing the organic EL display device 1 according to the present embodiment is the same as the method of manufacturing the organic EL display device 1 according to the first embodiment except the points described below.

Note that in the present embodiment, in a case where the luminescent material of the red light-emitting layer 34R is a red fluorescent luminescent material, it is preferable that the red fluorescent luminescent material be a TADF material, in addition, that the blue fluorescent luminescent material be a TADF material, and that the green fluorescent luminescent material be a TADF material.

Display Method of Organic EL Display Apparatus 1

Next, a display method for making the organic EL display apparatus 1 according to the present embodiment display images is described below with reference to FIG. 11, and FIGS. 12A to 12C.

Figure 12A:
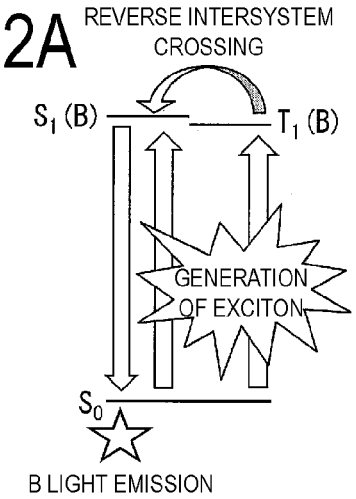
FIG. 12A is a diagram illustrating a principle of light emission in a blue subpixel of the organic EL display apparatus according to the third embodiment of the disclosure.
Figure 12B:
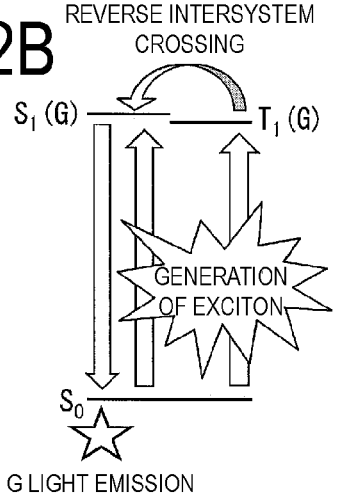
FIG. 12B is a diagram illustrating a principle of light emission in a green subpixel of the organic EL display apparatus according to the third embodiment of the disclosure.
Figure 12C:
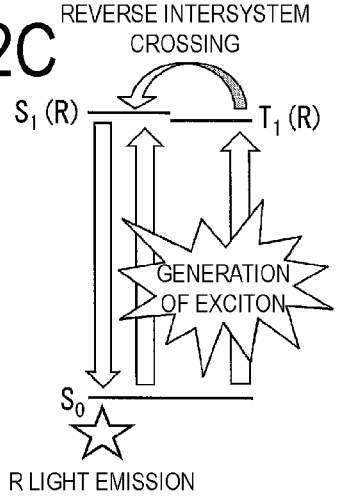
FIG. 12C is a diagram illustrating a principle of light emission in a red subpixel of the organic EL display apparatus according to the third embodiment of the disclosure.

FIG. 12A is a diagram illustrating a principle of light emission in the subpixel 3B of the organic EL display apparatus 1 according to the present embodiment. FIG. 12B is a diagram illustrating a principle of light emission in the subpixel 3G of the organic EL display apparatus 1 according to the present embodiment. FIG. 12C is a diagram illustrating a principle of light emission in the subpixel 3R of the organic EL display apparatus 1 according to the present embodiment.

In the present embodiment as well as in the first and second embodiments, within the subpixel 3B, excitons are generated in the blue light-emitting layer 34B and almost 100% blue light emission (blue fluorescence emission) is achieved as illustrated in FIG. 11 and FIG. 12A. In this case, use of a TADF material as the blue fluorescent luminescent material causes reverse intersystem crossing to convert upwardly the excitons with a 75% $T_1$ level generated in the blue light-emitting layer 34B to the $S_1$ level. Hence, the luminous efficiency in the subpixel 3B can be improved to a great degree.

In the present embodiment, a hole transporting material is used both as a material having the highest content percentage in the blue light-emitting layer 34B and as a material having the highest content percentage in the green light-emitting layer 34G. Hence, within the subpixel 3G, excitons are generated in the green light-emitting layer 34G, and the subpixel 3G achieves almost 100% green light emission (green fluorescence emission) as illustrated in FIG. 11 and FIG. 12B.

In the above-described situation, use of a TADF material as a blue fluorescent luminescent material causes the Förster transfer from the $S_1$ level of the blue fluorescent luminescent material to the $S_1$ level of the green fluorescent luminescent material to occur even in a case where, in the subpixel 3G, excitons are generated in the blue light-emitting layer 34B, resulting in green fluorescence emission. Regardless of whether a TADF material is used as a blue fluorescent luminescent material, use of a TADF material as the green fluorescent luminescent material causes reverse intersystem crossing to convert upwardly the excitons with a 75% $T_1$ level generated in the green light-emitting layer 34G to the $S_1$ level. Hence, the luminous efficiency in the subpixel 3G can be improved to a great degree.

In the present embodiment, a hole transporting material is used both as a material having the highest content percentage in the blue light-emitting layer 34B and as a material having the highest content percentage in the green light-emitting layer 34G, and either a bipolar transporting material or an electron transporting material is used as a material having the highest content percentage in the red light-emitting layer 34R. Hence, within the subpixel 3R, excitons are generated in the red light-emitting layer 34R, as illustrated in FIG. 11 and FIG. 12C. In the above-described situation, use of a red fluorescent luminescent material as a luminescent material of the red light-emitting layer 34R causes almost 100% red fluorescence emission to be achieved when the singlet excitons generated from the red fluorescent luminescent material in the red light-emitting layer 34R are decayed back to the ground state.

In addition, use of a TADF material as the red fluorescent luminescent material causes reverse intersystem crossing to convert upwardly the excitons with a 75% $T_1$ level generated in the red light-emitting layer 34R to the $S_1$ level. Hence, the luminous efficiency in the subpixel 3R can be improved to a great degree.

On the other hand, use of a red phosphorescent material as a luminescent material of the red light-emitting layer 34R causes triplet excitons to be generated in the red light-emitting layer 34R. As in the case of the second embodiment, almost 100% red phosphorescent light emission is achieved when the triplet excitons of the red phosphorescent luminescent material are decayed back to the ground state.

Advantageous Effects

As described thus far, according to the present embodiment, even in a case of changing carrier mobilities of the material having the highest content percentage in the blue light-emitting layer 34B and the material having the highest content percentage in the green light-emitting layer 34G (e.g., the host material in the blue light-emitting layer 34B and the host material in the green light-emitting layer 34G), neither color mixing nor color shift takes place, and thus a high efficiency can be achieved in providing each luminescent color. Hence, as revealed by the comparison of the organic EL display apparatus 1 according to the present embodiment with the organic EL display apparatus 1 according to the first embodiment, the organic EL display apparatus 1 of the present embodiment differs from the ones of related art in that the carrier mobilities of the material having the highest content percentage of all the materials in the blue light-emitting layer 34B do not limit the layering order of the blue light-emitting layer 34B, the green light-emitting layer 34G, and the red light-emitting layer 34R. Hence, the light-emitting layer unit 33 has a higher degree of freedom in determining the layering order of the light-emitting layers 34 compared with that in prior art.

In addition, as described above, the organic EL display apparatus 1 according to the present embodiment has a layered structure that is identical to the corresponding structures in the first and second embodiments except that the carrier mobilities of the material having the highest content percentage of all the materials in the blue light-emitting layer 34B and the carrier mobilities of the material having the highest content percentage of all the materials in the green light-emitting layer 34G have been changed. Accordingly, the present embodiment can also obtain similar advantageous effects to those of the first and second embodiments.

Fourth Embodiment

A description will be given of yet another embodiment of the disclosure, with reference mainly to FIG. 13.

The present embodiment will be described about differences between the present embodiment and the first embodiment to the third embodiment, and components having the same functions as those of the components described in the first embodiment to the third embodiment are appended with the same reference signs, and the description thereof is omitted. Obviously, the same modifications as those of the first to the third embodiments may also be applied to the present embodiment.

Figure 13:
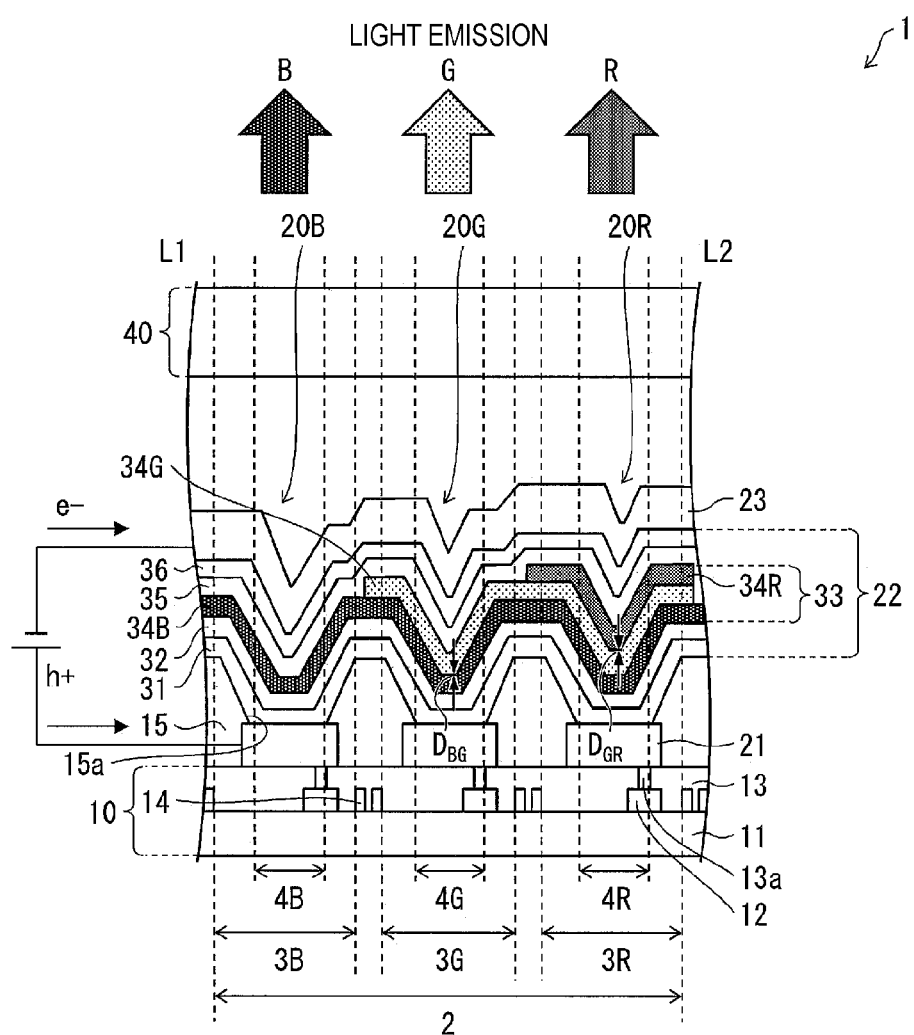
FIG. 13 is a cross-sectional view illustrating an example of a schematic configuration of an organic EL display apparatus according to the fourth embodiment of the disclosure.

Schematic Configuration of Organic EL Display Apparatus 1 and Method for Manufacturing Same FIG. 13 is a cross sectional view illustrating an example of a schematic configuration of the organic EL display apparatus 1 according to the present embodiment. Note that the cross-sectional view of FIG. 13 illustrates an example of a schematic configuration of a single pixel area of the organic EL display apparatus 1 and corresponds to a cross section taken along the line L1-L2 in FIG. 3.

The organic EL display apparatus 1 according to the present embodiment is a bottom-emitting organic EL display apparatus where the light emitted from the light-emitting layer unit 33 is extracted through the first electrode 21, that is, through the TFT substrate 10.

In a case where the organic EL display apparatus 1 is a bottom-emitting organic EL display apparatus, an insulating substrate having a light-transmitting property, which is called a transparent substrate or a light-transmitting substrate, such as a glass substrate and a plastic substrate, is used as the insulating substrate 11.

In addition, in the case where the organic EL display apparatus 1 is a bottom-emitting organic EL display apparatus, the light emitted from the light-emitting layer unit 33 is extracted through the light-transmissive electrode either directly or after being reflected by a reflective electrode. Hence, in the present embodiment, as described above, the first electrode 21 located on the TFT substrate 10 side is a light-transmissive electrode and the second electrode 23 is a reflective electrode. As the materials for the light-transmissive electrode and the reflective electrode, the light-transmissive electrode materials and the reflective electrode materials illustrated in the first embodiment, for example, can be used.

The organic EL display apparatus 1 according to the present embodiment is identical to the organic EL display apparatuses 1 according to the first to third embodiments except that the first electrode 21 is a light-transmissive electrode, and that instead of forming the protection layer 24, a reflective electrode having a greater layer thickness than that of the second electrode 23 (semi-transparent electrode) in the organic EL display apparatus 1 according to the first embodiment is used as the second electrode 23. In the present embodiment, for example, the first electrodes 21 (anode electrode) in all the subpixels 3B, 3G, and 3R are ITO electrodes with a layer thickness of 100 nm, and the second electrode 23 (cathode electrode) is an Al electrode with a layer thickness of 100 nm.

In the present embodiment, as illustrated in FIG. 13, the first electrode 21 including a light-transmissive electrode, the hole injection layer 31, the hole transport layer 32, the blue light-emitting layer 34B, the green light-emitting layer 34G, the red light-emitting layer 34R, the electron transport layer 35, the electron injection layer 36, and the second electrode 23 including a reflective electrode are formed on and over the TFT substrate 10 in this order from the TFT substrate 10 side.

Advantageous Effects

According to the present embodiment, the displaying based on a similar principle to the one in the first to third embodiments can be performed. To put it differently, by setting the conditions other than the ones described above to the same conditions employed in any of the first to third embodiments, each subpixel 3 can obtain, based on the same principle as that of the above-mentioned one of the first to third embodiments, its own luminescent color with a high efficiency without causing any color mixing or color shift to take place. As a result, a higher resolution can be achieved easily.

Hence, according to the present embodiment, the bottom-emitting organic EL display apparatus 1 having similar effects to those obtained in the first to third embodiments can be provided.

In addition, in a case where the organic EL display apparatus 1 has a bottom-emitting structure as described above, only a weaker microcavity effect can be obtained. Hence, even if the optical path length (cavity length) of the organic EL element 20 in each subpixel 3 is changed, the color level and the luminous efficiency of the organic EL element 20 in each subpixel 3 are less likely to change. Hence, the color level and the luminous efficiency of the organic EL element 20 in each subpixel 3 are less likely to change so that it is not necessary to make the second electrode 23 have a layered structure including a reflective electrode and a light-transmissive electrode serving as a layer-thickness adjustment layer (optical-path-length adjustment layer) as in the case of the first electrode 21 according to the first embodiment. In addition, it is not necessary to change the optical path length of the organic EL element 20 in each subpixel 3 by, for example, changing the layer thickness of the light-transmissive electrode or to vary, from one subpixel 3 to another, the layer thickness of the organic EL layer 22 located between the first electrode 21 and the second electrode 23.

Hence, according to the present embodiment, as described above, even in a case where each of the layers included in the organic EL display apparatus 1 has a uniform layer thickness, no problem arises. Hence, the organic EL display apparatus 1 can be manufactured in a simpler process than the manufacturing process of an organic EL display apparatus having a top-emitting structure.

Fifth Embodiment

A description will be given of yet another embodiment of the disclosure, with reference mainly to FIG. 14 to FIG. 17.

The present embodiment will be described about differences between the present embodiment and the first embodiment to the fourth embodiment, and components having the same functions as those of the components described in the first embodiment to the fourth embodiment are appended with the same reference signs, and the description thereof is omitted. Obviously, the same modifications as those of the first to fourth embodiments may also be applied to the present embodiment.

Schematic Configuration and Light Emission Principle of Organic EL Display Apparatus 1

Figure 14:
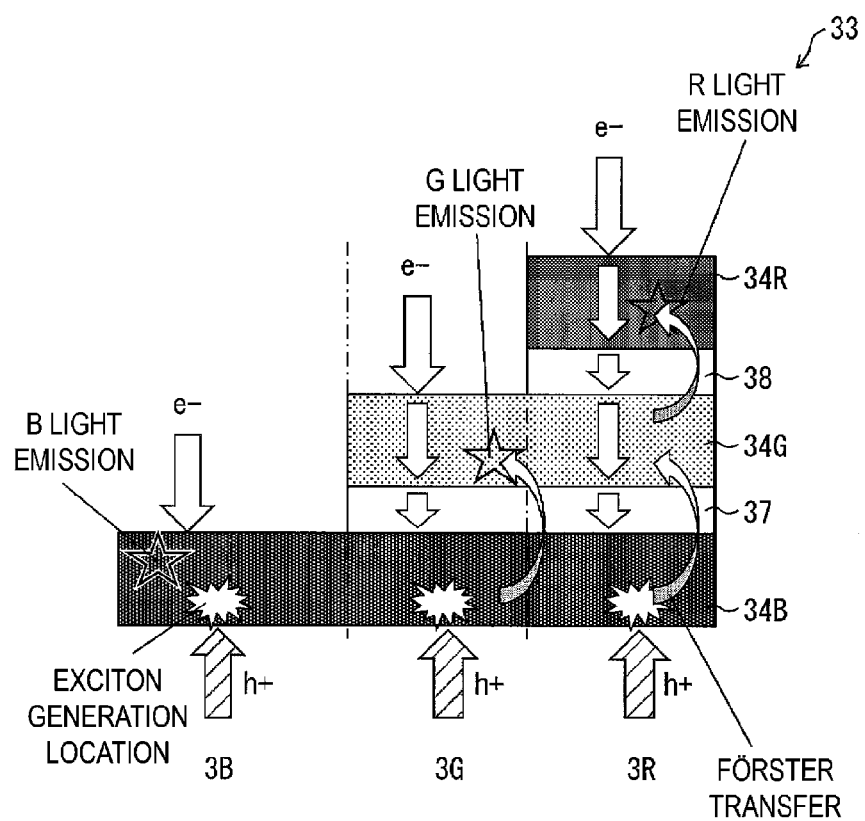
FIG. 14 is a diagram illustrating a schematic configuration of a light-emitting layer unit of an organic EL display apparatus and illustrating a principle of light emission by the light-emitting layer unit according to a fifth embodiment of the disclosure.
Figure 15:
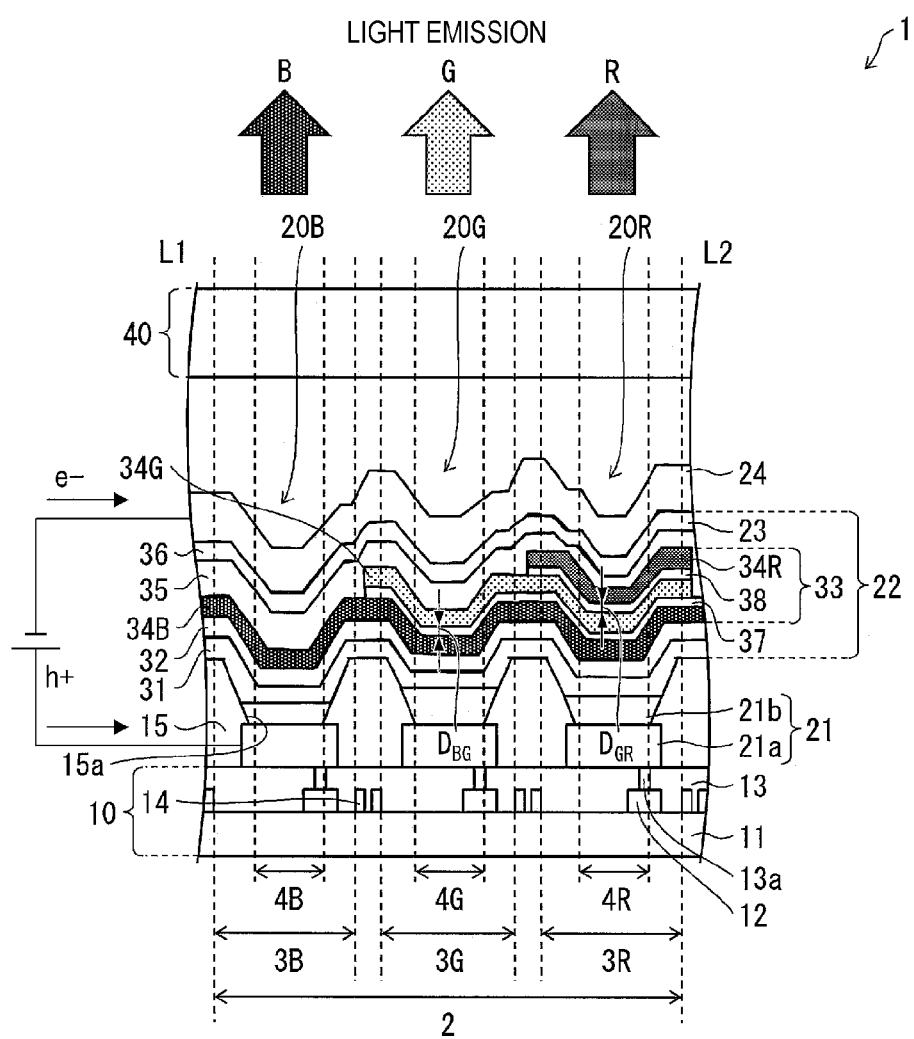
FIG. 15 is a cross-sectional view illustrating an example of a schematic configuration of an organic EL display apparatus according to the fifth embodiment of the disclosure.

FIG. 14 is a diagram illustrating a schematic configuration of the light-emitting layer unit 33 of the organic EL display apparatus 1 and illustrating a principle of light emission by the light-emitting layer unit 33 according to the present embodiment. FIG. 15 is a cross sectional view illustrating an example of a schematic configuration of the organic EL display apparatus 1 according to the present embodiment. Note that the cross-sectional view of FIG. 15 illustrates an example of a schematic configuration of a single pixel area of the organic EL display apparatus 1 and corresponds to a cross section taken along the line L1-L2 in FIG. 3.

Suppose a case where, near the interface where two mutually adjacent light-emitting layers 34 are in a direct contact with each other, a Dexter transfer, which is an energy transfer of the 75% excitons generated to the triplet level to the triplet level of the adjacent light-emitting layer 34, occurs. In this case, the excitons are inactivated thermally without causing light emission.

Hence, as illustrated in FIG. 14 and FIG. 15, the organic EL display apparatus 1 according to the present embodiment includes a first blocking layer 37 containing no luminescent material and configured to block Dexter transfer, the first blocking layer 37 being formed between the blue light-emitting layer 34B and the green light-emitting layer 34G as a common layer that is common to the subpixels 3G and 3R. In each of the subpixels 3G and 3R, the distance between the blue light-emitting layer 34B and the green light-emitting layer 34G (i.e., the distance $D_{BG}$ between the mutually opposing surfaces of the layers 34B and 34G) is not greater than the Förster radius. Hence, the first blocking layer 37 has a thickness that is not greater than the Förster radius.

In addition, the organic EL display apparatus 1 according to the present embodiment includes a second blocking layer 38 containing no luminescent material and configured to block Dexter transfer, the second blocking layer 38 being formed between the green light-emitting layer 3G and the red light-emitting layer 34R in each of the subpixels 3R. The distance between the green light-emitting layer 34G and the red light-emitting layer 34R (i.e., the distance $D_{GR}$ between the mutually opposing surfaces of the layers 34G and 34R) is not greater than the Förster radius, and the second blocking layer 38 has a thickness that is not greater than the Förster radius.

As described earlier, the first blocking layer 37 has a layer thickness that is not greater than the Förster radius. Hence, the Förster transfer from the blue fluorescent luminescent material to the green fluorescent luminescent material in the subpixels 3G and 3R is not blocked, but the Dexter transfer there is blocked. In addition, the second blocking layer 38 has a layer thickness that is not greater than the Förster radius. Hence, the Förster transfer from the green fluorescent luminescent material to the red fluorescent luminescent material in the subpixel 3R is not blocked, but the Dexter transfer there is blocked.

Hence, by forming a thin first blocking layer 37 between the blue light-emitting layer 34B and the green light-emitting layer 34G in the subpixels 3G and 3R as described above, the luminous efficiency of the green light-emitting layer 34G in the subpixels 3G and 3R can be improved. Hence, by forming a thin second blocking layer 38 between the green light-emitting layer 34G and the red light-emitting layer 34R in the subpixel 3R, the luminous efficiency of the red light-emitting layer 34R in the subpixel 3R can be improved.

To ensure the Förster transfer, it is preferable that the layer thickness of the first blocking layer 37 and the layer thickness of the second blocking layer 38 be as small as possible. Specifically, the layer thickness is preferably 10 nm or smaller and is more preferably 5 nm or smaller.

As described in the first embodiment, it is commonly understood that Förster radius ranges from 1 to 10 nm, approximately. Hence, the distance between the surface located on the opposite side of the blue light-emitting layer 34B from the surface facing the green light-emitting layer 34G and the surface of the green light-emitting layer 34G facing the blue light-emitting layer 34B is preferably not greater than 10 nm. In addition, the distance between the surface located on the opposite side of the green light-emitting layer 34G from the surface facing the red light-emitting layer 34R and the surface of the red light-emitting layer 34R facing the green light-emitting layer 34G is preferably not greater than 10 nm.

Hence, in the present embodiment, it is preferable that the blue light-emitting layer 34B and the first blocking layer 37 have a total layer thickness of 10 nm or smaller. Thus, the minimum distance from any position in the blue light-emitting layer 34B to the green light-emitting layer 34G can be reduced down to 10 nm or even smaller. Förster transfer can be made possible even for a molecule of the blue fluorescent luminescent material located on the opposite side of the blue light-emitting layer 34B from the green light-emitting layer 34G.

Likewise, in the present embodiment, it is preferable that the green light-emitting layer 34G and the second blocking layer 38 have a total layer thickness of 10 nm or smaller. Thus, the minimum distance from any position in the green light-emitting layer 34G to the red light-emitting layer 34R can be reduced down to 10 nm or even smaller. Förster transfer can be made possible even for a molecule of the green fluorescent luminescent material located on the opposite side of the green light-emitting layer 34G from the red light-emitting layer 34R.

It is preferable that the first blocking layer 37 exhibit, for example, electron transport properties or exhibit bipolar transport properties as the entire first blocking layer 37. Likewise, it is preferable that the second blocking layer 38 exhibit, for example, electron transport properties or exhibit bipolar transport properties as the entire second blocking layer 38. In a case where materials exhibiting good bipolar transport properties are used for the first blocking layer 37 and for the second blocking layer 38, each of the materials is either a material that exhibits good bipolar transport properties as in the case with bipolar transporting materials or a combination of two or more kinds of materials that exhibit good bipolar transport properties when combined.

The organic EL display apparatus 1 according to the present embodiment has a configuration that is identical to the corresponding configuration according to the first embodiment except the above-mentioned points. In addition, the principle of light emission in the present embodiment is the same as that in the first embodiment.

Production Method of Organic EL Display Apparatus 1

A method for manufacturing the organic EL display apparatus 1 according to the present embodiment is identical to the method of manufacturing the organic EL display apparatus 1 according to the first embodiment except that a first blocking layer formation process for forming the first blocking layer 37 is additionally included between the blue light-emitting layer formation process and the green light-emitting layer formation process in the first embodiment and that a second blocking layer formation process for forming the second blocking layer 38 is additionally included in the green light-emitting layer formation process and the red light-emitting layer formation process in the first embodiment.

In the example illustrated in FIG. 14 and FIG. 15, the first blocking layer 37 is formed as a common layer that is common to the subpixels 3G and 3R as in the case of the green light-emitting layer 34G. Hence, in the method of manufacturing the organic EL display apparatus 1 illustrated in FIG. 14 and FIG. 15, the first blocking layer 37 and the green light-emitting layer 34G can be formed, for example, consecutively by the use of the same vapor deposition mask. Hence, in the green light-emitting layer formation process, the green light-emitting layer 34G having the identical pattern to the pattern of the first blocking layer 37 when viewed from above is formed on the first blocking layer 37.

The present embodiment, however, is not limited to this method. Alternatively, separate vapor deposition masks each of which has an identical opening pattern to the other's and each of which is dedicated to each of the first blocking layer 37 and the green light-emitting layer 34G may be used to pattern-form the first blocking layer 37 and the green light-emitting layer 34G.

In addition, in the example illustrated in FIG. 14 and FIG. 15, the second blocking layer 38 is formed only in each of the subpixels 3R. Hence, in the method of manufacturing the organic EL display apparatus 1 illustrated in FIG. 14 and FIG. 15, the second blocking layer 38 and the red light-emitting layer 34R can be formed, for example, consecutively by the use of the same vapor deposition mask. Hence, in the red light-emitting layer formation process, the red light-emitting layer 34R having the identical pattern to the pattern of the second blocking layer 38 when viewed from above is formed on the second blocking layer 38. The present embodiment, however, is not limited to this method. Alternatively, separate vapor deposition masks each of which has an identical opening pattern to the other's and each of which is dedicated to each of the second blocking layer 38 and the red light-emitting layer 34R may be used to pattern-form the second blocking layer 38 and the red light-emitting layer 34R.

Advantageous Effects

As has been described thus far, the organic EL display apparatus 1 according to the present embodiment has a configuration that is identical to the configuration of the organic EL display apparatus 1 according to the first embodiment except that the first blocking layer 37 and the second blocking layer 38 are formed. In addition, the organic EL display apparatus 1 according to the present embodiment performs light emission based on the same principle as that in the first embodiment. Accordingly, the present embodiment can also obtain similar advantageous effects to those of the first embodiment.

In addition, according to the present embodiment, the formation of the first blocking layer 37 does not block the Förster transfer from the blue fluorescent luminescent material to the green fluorescent luminescent material but does block the Dexter transfer there. Hence, the luminous efficiency of the green light-emitting layer 34G in the subpixel 3G can be improved. In addition, the formation of the second blocking layer 38 does not block the Förster transfer from the green fluorescent luminescent material to the red fluorescent luminescent material but does block the Dexter transfer there. Hence, the luminous efficiency of the red light-emitting layer 34R in the subpixel 3R can be improved.

Note that the foregoing description is based on an example modified from the organic EL display apparatus 1 according to the first embodiment, but the present embodiment is not limited to such modifications. Alternatively, as described earlier, the present embodiment may be modified in a similar manner to the second to fourth embodiments. Exemplar modifications are described below, but the present embodiment is limited neither to the form described above nor to the following modified examples.

First Modified Example

Figure 16:
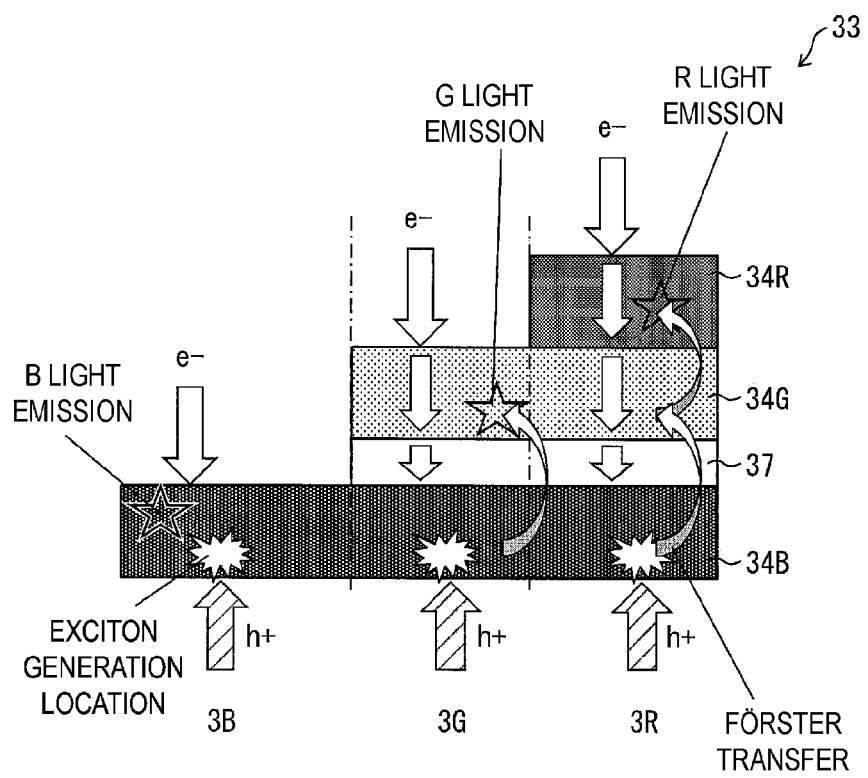
FIG. 16 is a diagram illustrating a schematic configuration of a light-emitting layer unit of an organic EL display apparatus and illustrating a principle of light emission by the light-emitting layer unit according to a first modified example of the fifth embodiment of the disclosure.
Figure 17:
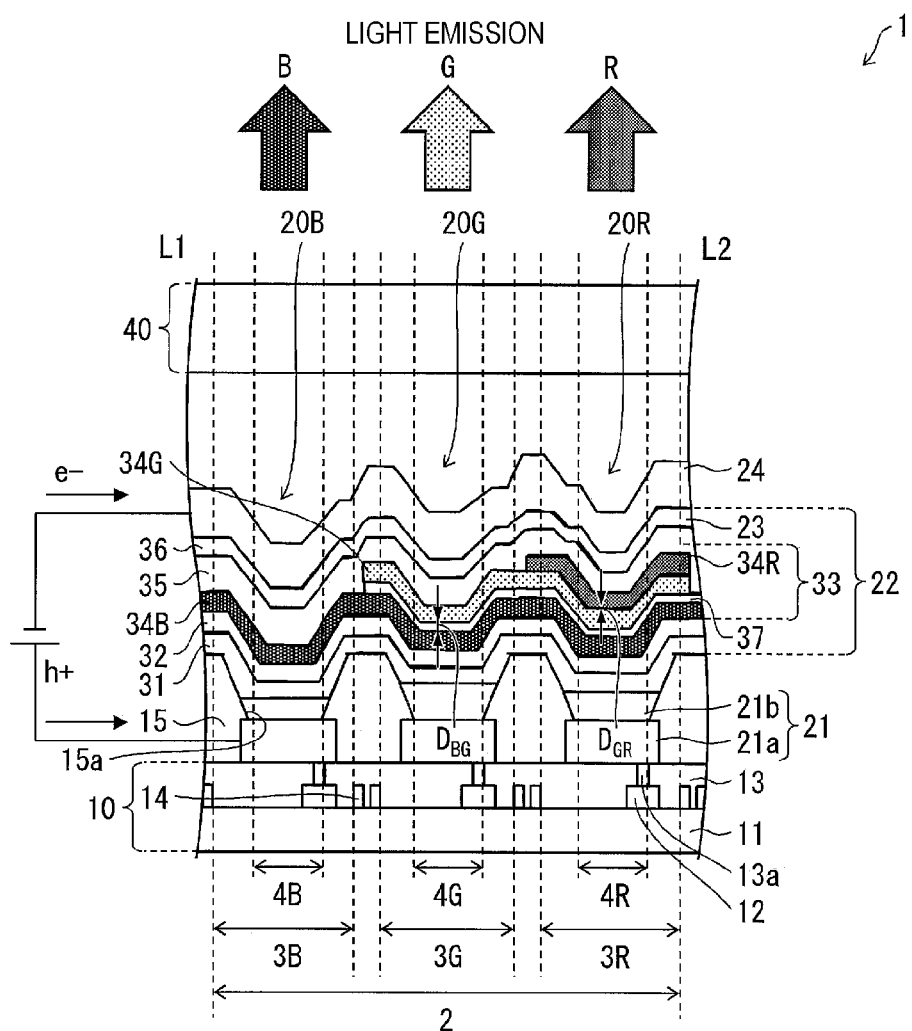
FIG. 17 is a cross-sectional view illustrating an example of a schematic configuration of an organic EL display apparatus according to the first modified example of the fifth embodiment of the disclosure.

FIG. 16 is a diagram illustrating a schematic configuration of the light-emitting layer unit 33 of the organic EL display apparatus 1 and illustrating a principle of light emission by the light-emitting layer unit 33 according to the present modified example. FIG. 17 is a cross sectional view illustrating an example of a schematic configuration of the organic EL display apparatus 1 according to the present modified example. Note that the cross-sectional view of FIG. 17 illustrates an example of a schematic configuration of a single pixel area of the organic EL display apparatus 1 and corresponds to a cross section taken along the line L1-L2 in FIG. 3.

The organic EL display apparatus 1 according to the present modified example has a configuration that is identical to the one illustrated in FIG. 14 and FIG. 15 except that a red phosphorescent luminescent material is used as a luminescent material of the red light-emitting layer 34R; only the first blocking layer 37 is formed as the blocking layer as illustrated in FIG. 16 and FIG. 17, that is, no second blocking layer 38 is formed.

To put it differently, the organic EL display apparatus 1 according to the present modified example has a configuration that is identical to the configuration of the organic EL display apparatus 1 according to the second embodiment except that the first blocking layer 37 containing no luminescent material and configured to block Dexter transfer is additionally formed between the blue light-emitting layer 34B and the green light-emitting layer 34G as a common layer that is common to the subpixels 3G and 3R. Accordingly, the principle of light emission in the present modified example is the same as that in the second embodiment.

In addition, in each of the subpixels 3G and 3R the distance between the blue light-emitting layer 34B and the green light-emitting layer 34G (i.e., the distance $D_{BG}$ between the mutually opposing surfaces of the layers 34B and 34G), the thickness of the first blocking layer 37, the total layer thickness of the green light-emitting layer 34G and the second blocking layer 38, and the carrier mobilities of the first blocking layer 37 are the same as their respective counterparts of the organic EL display apparatus 1 illustrated in FIG. 14 and FIG. 15 as described above.

In a case of using a red phosphorescent luminescent material as a luminescent material of the red light-emitting layer 34R as described above, the direct contact of the green light-emitting layer 34G and the red light-emitting layer 34R with each other allows for the use of energy transfer caused by the Dexter transfer at the contact interface between the green light-emitting layer 34G and the red light-emitting layer 34R. Hence, no second blocking layer 38 is necessary.

Second Modified Example

Though not illustrated, as in the case of the third embodiment, a hole transporting material may be used both as a material having the highest content percentage in the blue light-emitting layer 34B and as a material having the highest content percentage in the green light-emitting layer 34G, and a bipolar transporting material or an electron transporting material may be used as a material having the highest content percentage in the red light-emitting layer 34R. In this case, it is preferable that the first blocking layer 37 exhibit, for example, hole transport properties or exhibit bipolar transport properties as the entire first blocking layer 37. Likewise, it is preferable that the second blocking layer 38 exhibit, for example, hole transport properties or exhibit bipolar transport properties as the entire second blocking layer 38. In this case, the principle of light emission in the present modified example is the same as that in the third embodiment.

Third Modified Example

The first blocking layer 37 is configured to block the Dexter transfer from the blue fluorescent luminescent material to the green fluorescent luminescent material in the subpixels 3G and 3R. Hence, as illustrated in FIG. 14 to FIG. 17, it is not necessary to provide the first blocking layer 37 in the subpixels 3 other than the subpixels 3G and 3R. What is necessary is providing the first blocking layer 37 between the green light-emitting layer 34G and the blue light-emitting layer 34B in each subpixel 3G and in each subpixel 3R. Note that the present embodiment is not limited to such a configuration. Alternatively, like the blue light-emitting layer 34B, the first blocking layer 37 may be formed in the entire display region 1a as a common layer that is common to the subpixels 3B, 3G, and 3R in all the pixels 2.

In this case, the blue light-emitting layer 34B and the first blocking layer 37 may be formed consecutively by the use of, for example, the same open mask, or by the use of separate open masks having an identical pattern and dedicated individually to these layers 34B and 37.

Likewise, the second blocking layer 38 is configured to block the Dexter transfer from the green fluorescent luminescent material to the red fluorescent luminescent material in the subpixels 3R. Hence, as illustrated in FIG. 14 and FIG. 15, it is not necessary to provide the blocking layer 38 in the subpixels 3 other than the subpixels 3R. What is necessary is providing the second blocking layer 38 between the green light-emitting layer 34G and the red light-emitting layer 34R in each subpixel 3R. The present embodiment, however, is not limited to such a configuration. Alternatively, like the green light-emitting layer 34G, the second blocking layer 38 may be formed as a common layer that is common to the subpixels 3G and the subpixels 3R.

In this case, the green light-emitting layer 34G and the second blocking layer 38 may be formed consecutively by the use of, for example, the same vapor deposition mask, or by the use of separate vapor deposition masks having an identical pattern and dedicated individually to these layers 34G and 38.

Sixth Embodiment

A description will be given of yet another embodiment of the disclosure, with reference mainly to FIG. 18 to FIG. 20.

The present embodiment will be described about differences between the present embodiment and the first embodiment to the fifth embodiment, and components having the same functions as those of the components described in the first embodiment to the fifth embodiment are appended with the same reference signs, and the description thereof is omitted. Obviously, the same modifications as those of the first embodiment to the fifth embodiment may also be applied to the present embodiment.

Figure 18:
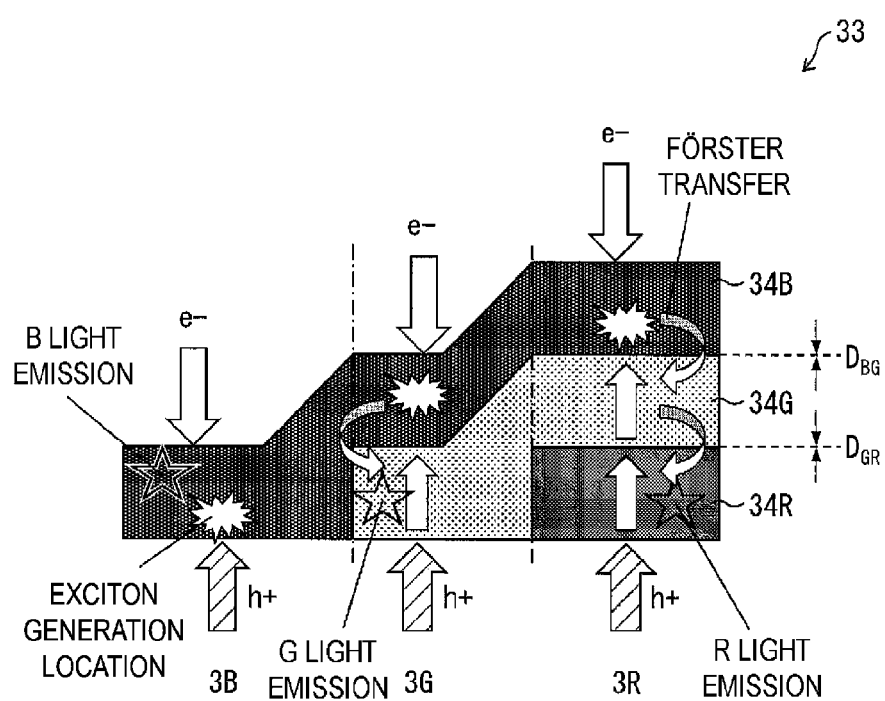
FIG. 18 is a diagram illustrating a schematic configuration of a light-emitting layer unit of an organic EL display apparatus and illustrating a principle of light emission by the light-emitting layer unit according to a sixth embodiment of the disclosure.

FIG. 18 is a diagram illustrating a schematic configuration of the light-emitting layer unit 33 of the organic EL display apparatus 1 and illustrating a principle of light emission by the light-emitting layer unit 33 according to the present embodiment. FIG. 19 is a cross sectional view illustrating an example of a schematic configuration of the organic EL display apparatus 1 according to the present embodiment. Note that the cross-sectional view of FIG. 19 illustrates an example of a schematic configuration of a single pixel area of the organic EL display apparatus 1 and corresponds to a cross section taken along the line L1-L2 in FIG. 3.

Figure 19:
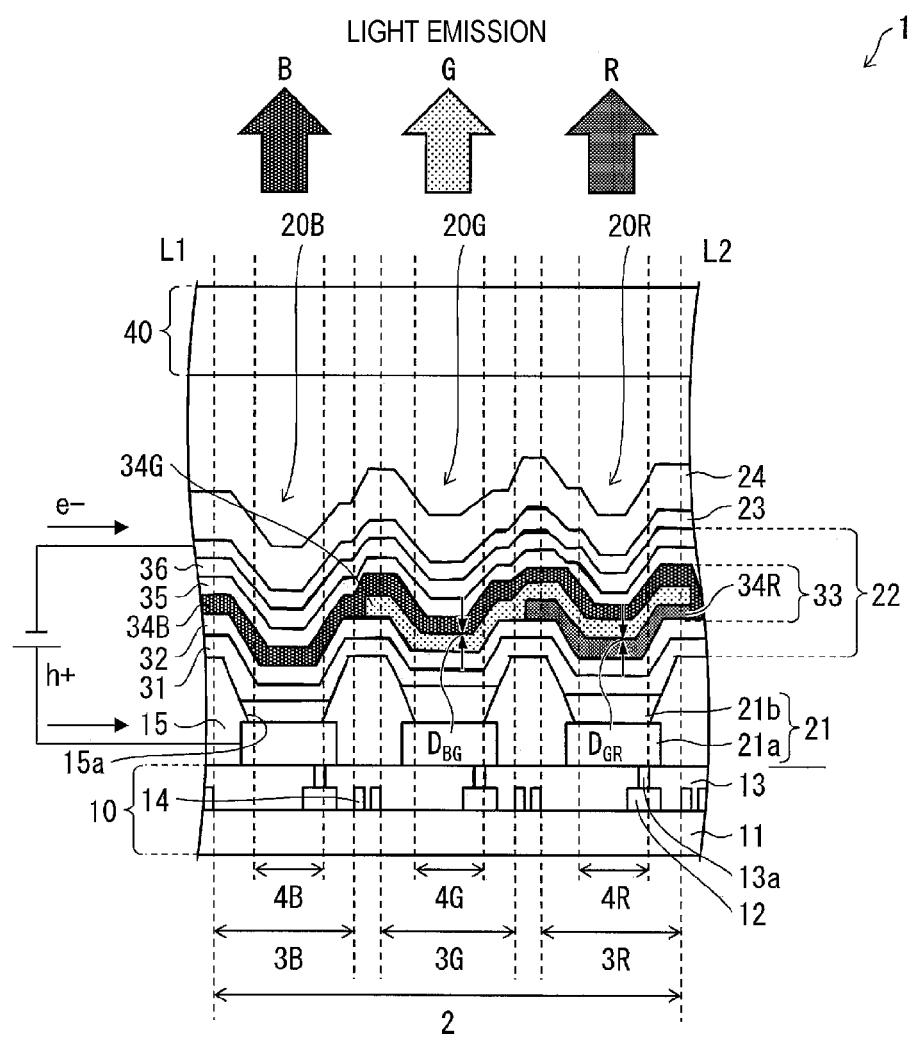
FIG. 19 is a cross-sectional view illustrating an exemplar schematic configuration of the organic EL display apparatus according to the sixth embodiment of the disclosure.

Schematic Configuration of Organic EL Display Apparatus 1 and Method for Manufacturing Same As illustrated in FIG. 18 and FIG. 19, the organic EL display apparatus 1 according to the present embodiment has a configuration where the light-emitting layer unit 33 is provided between the first electrode 21 and the second electrode 23; and in the light-emitting layer unit 33, the red light-emitting layer 34R, the green light-emitting layer 34G, and the blue light-emitting layer 34B are layered in this order from the first electrode 21 side. To put it differently, in the present embodiment, the layers in the light-emitting layer unit 33 are layered in the reverse order from the corresponding orders in the first to fifth embodiments.

Hence, in the present embodiment, as illustrated in FIG. 18, for example, hole transporting materials are used as the material having the highest content percentage of all the materials in the green light-emitting layer 34G and as the material having the highest content percentage of all the materials in the blue light-emitting layer 34B. In addition, a bipolar transporting material or a hole transporting material is used as the material having the highest content percentage of all the materials for the red light-emitting layer 34R. The organic EL display apparatus 1 according to the present embodiment has a configuration that is identical to the corresponding configuration of the organic EL display apparatus 1 according to the first embodiment except the above-mentioned points.

In addition, a method for manufacturing the organic EL display apparatus 1 according to the present embodiment is identical to, for example, the method of manufacturing the organic EL display apparatus 1 according to the first embodiment except that the red light-emitting layer formation process, the green light-emitting layer formation process, and the blue light-emitting layer formation process are performed in this order.

Display Method of Organic EL Display Apparatus 1

Hence, in the present embodiment, the light emission is performed in a similar manner to the light emission in the first embodiment. To put it differently, as illustrated in FIG. 18, in the subpixel 3B, excitons are generated in the blue light-emitting layer 34B as in the case of the first embodiment, and almost 100% blue light emission (blue fluorescence emission) is achieved.

In the subpixel 3G, depending on the carrier balance between the blue light-emitting layer 34B and the green light-emitting layer 34G, excitons are generated in either the blue light-emitting layer 34B or the green light-emitting layer 34G. In the subpixel 3G, in a case where excitons are generated in the green light-emitting layer 34G, the green light-emitting layer 34G achieves almost 100% green light emission (green fluorescence emission). On the other hand, in the subpixel 3G, in a case where excitons are generated in the blue light-emitting layer 34B, the Förster transfer from $S_1$ level of the blue fluorescent luminescent material to the $S_1$ level of the green fluorescent luminescent material does occur, and as a result, the subpixel 3G achieves almost 100% green light emission (green fluorescence emission).

In addition, in the subpixel 3R, depending on the carrier balance between the blue light-emitting layer 34B and the green light-emitting layer 34G, electrons are generated either in the blue light-emitting layer 34B or in the green light-emitting layer 34G. In the subpixel 3R, in a case where excitons are generated in the blue light-emitting layer 34B, Förster transfer occurs from the $S_1$ level of the blue fluorescent luminescent material to the $S_1$ level of the green fluorescent luminescent material. Then, Förster transfer occurs from the $S_1$ level of the green fluorescent luminescent material to the $S_1$ level of the red fluorescent luminescent material. As a consequence, almost 100% red light emission (red fluorescence emission) is achieved. On the other hand, in the subpixel 3R, in a case where excitons are generated in the green light-emitting layer 34G, the Förster transfer from the $S_1$ level of the green fluorescent luminescent material to the $S_1$ level of the red fluorescent luminescent material does occur, and as a result, the subpixel 3R achieves almost 100% red light emission (red fluorescence emission).

In this case, use of both a TADF material as the blue fluorescent luminescent material and a TADF material as the green fluorescent luminescent material renders similar effects to those described in the first embodiment.

Advantageous Effects

Hence, according to the present embodiment, similar advantageous effects to those of the first embodiment can be obtained. In cases of related art, a change in the layering order may change the recombination position of the holes and the electrons, which may result in color mixing. In the present embodiment, however, though the layering order of the light-emitting layers 34 is changed from the corresponding order in the first embodiment, the recombination of the holes and the electrons occurs at the same position as the corresponding position in the first embodiment. Hence, as revealed by the comparison of the organic EL display apparatus 1 according to the present embodiment with the organic EL display apparatus 1 according to the first embodiment, the organic EL display apparatus 1 of the present embodiment differs from the ones of related art in that even though the layering order is changed from the corresponding order in the first embodiment, each subpixel 3 can obtain efficiently its own luminescent color without causing color mixing or color shift.

First Modified Example

In addition, also in the present embodiment, use of a red phosphorescent luminescent material as the luminescent material of the red light-emitting layer 34R causes light to be emitted in a similar manner to that in the second embodiment.

Second Modified Example

Figure 20:
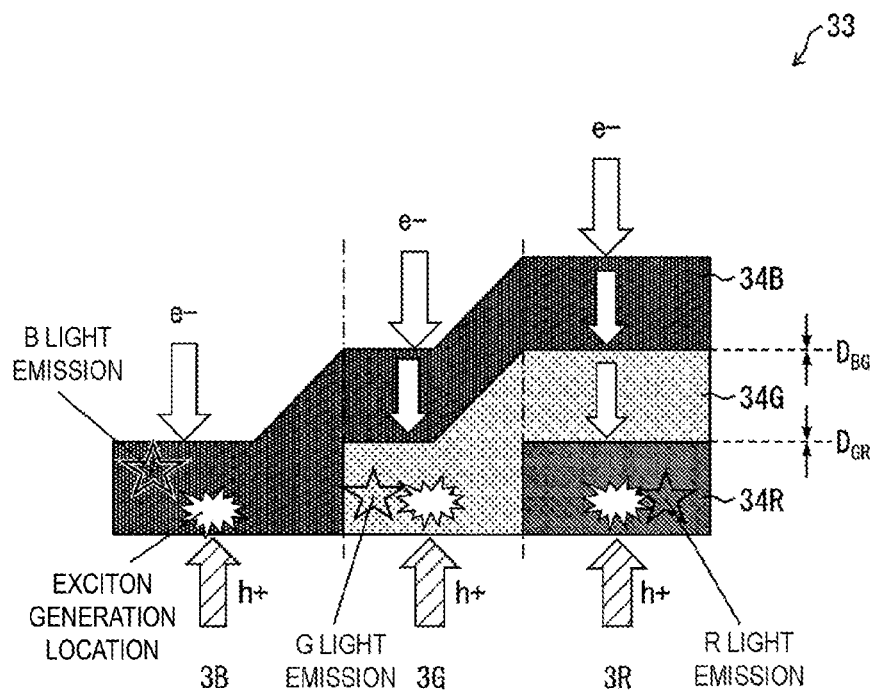
FIG. 20 is a diagram illustrating a schematic configuration of a light-emitting layer unit of an organic EL display apparatus and illustrating a principle of light emission by the light-emitting layer unit according to a second modified example of the sixth embodiment of the disclosure.

FIG. 20 is a diagram illustrating a schematic configuration of the light-emitting layer unit 33 of the organic EL display apparatus 1 and illustrating a principle of light emission by the light-emitting layer unit 33 according to the present modified example.

As illustrated in FIG. 20, in the organic EL display apparatus 1 according to the present modified example, a bipolar transporting material or an electron transporting material is used both as a material having the highest content percentage in the blue light-emitting layer 34B and as a material having the highest content percentage in the green light-emitting layer 34G in the organic EL display apparatus 1 illustrated in FIG. 17 and FIG. 18. In this case, the carrier transport properties of the material having the highest content percentage in the red light-emitting layer 34R is not particularly limited. However, as described in the first embodiment, by selecting a host material having electron transporting properties as a host material, for example, a material with better properties is made more easily available than in a case of selecting a host material having hole transport properties. In addition, a low-voltage driving is more likely to be achieved. Hence, it is preferable that a bipolar transporting material or an electron transporting material be used.

In this case, light emission is performed in a similar manner to the one in the third embodiment. Hence, as in the case of the third embodiment, in a case where a red fluorescent luminescent material is used as the luminescent material of the red light-emitting layer 34R, it is preferable that the red fluorescent luminescent material be a TADF material, the blue fluorescent luminescent material be a TADF material, and the green fluorescent luminescent material be a TADF material.

As described above, according to the present embodiment, as revealed by the comparison of the organic EL display apparatus 1 according to the present embodiment including the above-described modified examples with the organic EL display apparatus 1 according to the first to third embodiments, the organic EL display apparatus 1 of the present embodiment differs from the ones of related art in that even though the layering order is changed, each subpixel 3 can obtain efficiently its own luminescent color without causing color mixing or color shift. Hence, for example, as revealed by the comparison of the organic EL display apparatus 1 illustrated in FIG. 20 with the organic EL display apparatus 1 illustrated in FIG. 17 and FIG. 18, the organic EL display apparatus 1 of the present embodiment differs from the ones of related art in that the carrier mobilities of the material having the highest content percentage of all the materials in the blue light-emitting layer 34B do not limit the layering order of the blue light-emitting layer 34B, the green light-emitting layer 34G, and the red light-emitting layer 34R. Hence, the light-emitting layer unit 33 has a higher degree of freedom in determining the layering order of the light-emitting layers 34 than in cases of related art.

Note that though not described in detail below, it is possible to make not only the modifications described above but also similar modifications to those made in the fourth and fifth embodiments. By means of such modifications, similar advantageous effects to those obtained by the fourth and fifth embodiments can be obtained.

Seventh Embodiment

A description will be given of yet another embodiment of the disclosure, with reference mainly to FIG. 21 and FIG. 22.

The present embodiment will be described about differences between the present embodiment and the first embodiment to the sixth embodiment, and components having the same functions as those of the components described in the first embodiment to the sixth embodiment are appended with the same reference signs, and the description thereof is omitted. Obviously, the same modifications as those of the first embodiment to the sixth embodiment may also be applied to the present embodiment.

Figure 21:
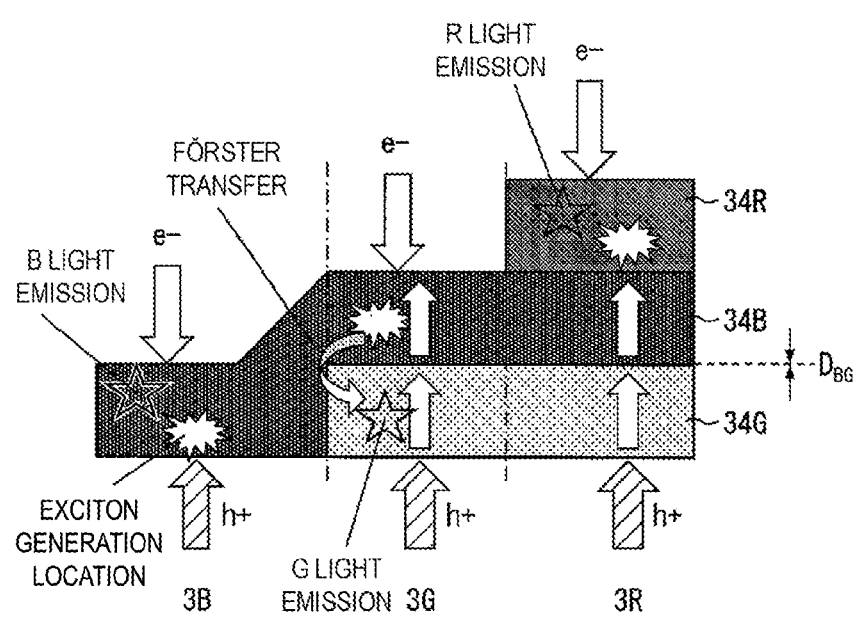
FIG. 21 is a diagram illustrating a schematic configuration of a light-emitting layer unit of an organic EL display apparatus and illustrating a principle of light emission by the light-emitting layer unit according to a seventh embodiment of the disclosure.

Schematic Configuration of Organic EL Display Apparatus 1 and Method for Manufacturing Same FIG. 21 is a diagram illustrating a schematic configuration of the light-emitting layer unit 33 of the organic EL display apparatus 1 and illustrating a principle of light emission by the light-emitting layer unit 33 according to the present modified example. FIG. 22 is a cross sectional view illustrating an example of a schematic configuration of the organic EL display apparatus 1 according to the present embodiment. Note that the cross-sectional view of FIG. 22 illustrates an example of a schematic configuration of a single pixel area of the organic EL display apparatus 1 and corresponds to a cross section taken along the line L1-L2 in FIG. 3.

Figure 22:
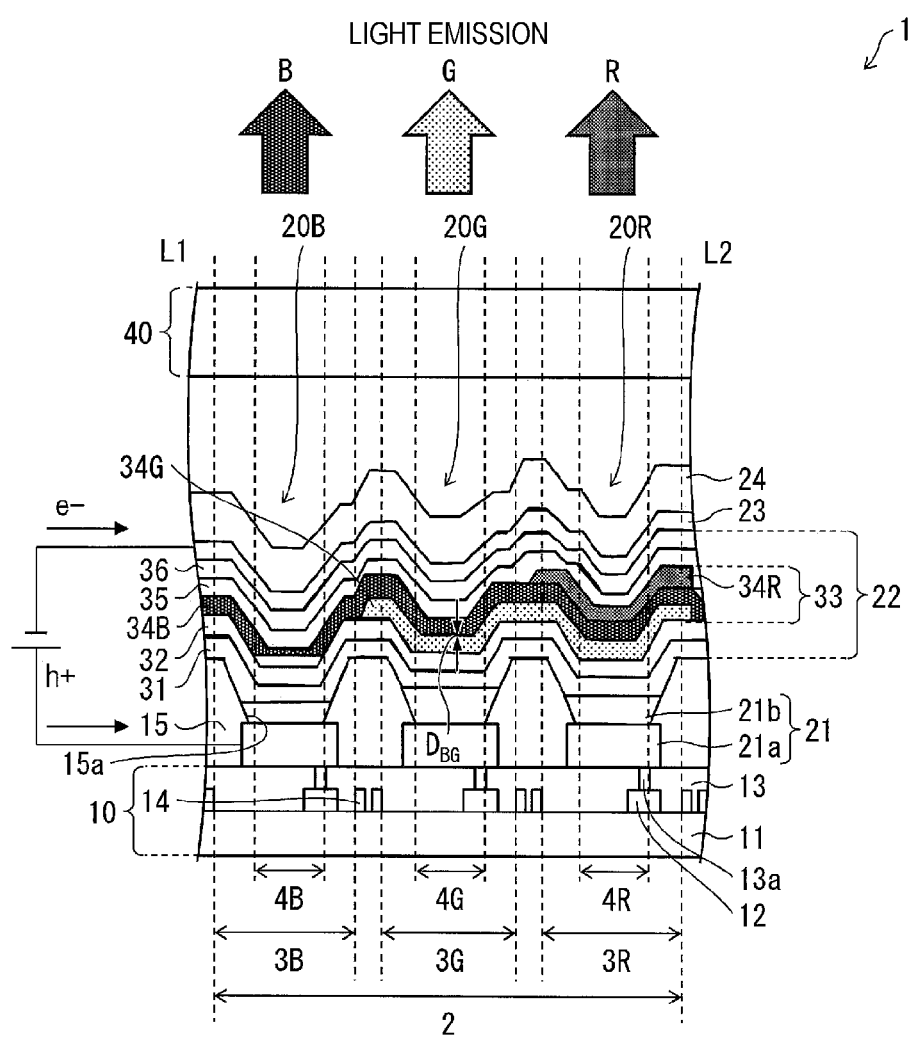
FIG. 22 is a cross-sectional view illustrating an exemplar schematic configuration of the organic EL display apparatus according to the seventh embodiment of the disclosure.

As illustrated in FIG. 21 and FIG. 22, the organic EL display apparatus 1 according to the present embodiment has a configuration where the light-emitting layer unit 33 is provided between the first electrode 21 and the second electrode 23; and in the light-emitting layer unit 33, the green light-emitting layer 34G, the blue light-emitting layer 34B, and the red light-emitting layer 34R, are layered in this order from the first electrode 21 side.

In the present embodiment, as illustrated in FIG. 21, a hole transporting material is used both as a material having the highest content percentage in the blue light-emitting layer 34B and as a material having the highest content percentage in the green light-emitting layer 34G. The carrier mobilities of the material having the highest content percentage in the red light-emitting layer 34R are not particularly limited, but it is preferable to use a bipolar transporting material or a hole transporting material to this end.

In addition, in a case where the luminescent material of the red light-emitting layer 34R is a red fluorescent luminescent material, it is preferable that the red fluorescent luminescent material be a TADF material. In addition, it is preferable that the blue fluorescent luminescent materials be a TADF material.

The organic EL display apparatus 1 according to the present embodiment has a configuration that is identical to the corresponding configuration of the organic EL display apparatus 1 according to the first embodiment except the above-mentioned points.

In addition, a method for manufacturing the organic EL display apparatus 1 according to the present embodiment is identical to, for example, the method of manufacturing the organic EL display apparatus 1 according to the first embodiment except that the green light-emitting layer formation process, the blue light-emitting layer formation process, and the red light-emitting layer formation process are performed in this order.

Display Method of Organic EL Display Apparatus 1

In this case, as illustrated in FIG. 21, in the subpixels 3B, excitons are generated in the blue light-emitting layer 34B, and almost 100% blue light emission (blue fluorescence emission) is achieved.

In the subpixel 3G, excitons are generated in the blue light-emitting layer 34B, the Förster transfer from the $S_1$ level of the blue fluorescent luminescent material to the $S_1$ level of the green fluorescent luminescent material does occur, and as a result, the subpixel 3G achieves almost 100% green light emission (green fluorescence emission). In this case, use of a TADF material as the blue fluorescent luminescent material causes reverse intersystem crossing to convert upwardly the excitons with a 75% $T_1$ level generated in the blue light-emitting layer 34B to the $S_1$ level. Hence, the luminous efficiency in the subpixel 3B and the luminous efficiency in the subpixel 3G can be improved to a great degree.

In the subpixel 3R, excitons are generated in the red light-emitting layer 34R, and the subpixel 3R achieves almost 100% red light emission (red fluorescence emission). In the above-described situation, use of a red fluorescent luminescent material as a luminescent material of the red light-emitting layer 34R causes red fluorescence emission to be achieved when the singlet excitons generated from the red fluorescent luminescent material in the red light-emitting layer 34R are decayed back to the ground state. In addition, use of a TADF material as the red fluorescent luminescent material causes reverse intersystem crossing to convert upwardly the excitons with a 75% $T_1$ level generated in the red light-emitting layer 34R to the $S_1$ level. Hence, the luminous efficiency in the subpixel 3R can be improved to a great degree.

Advantageous Effects

Hence, according to the present embodiment, similar advantageous effects to those of, for example, the first embodiment can be obtained. In the present embodiment as in the sixth embodiment, despite the fact that the layering order of the light-emitting layers 34 is changed from the order in the first embodiment, each subpixel 3 can obtain its own luminescent color with a high efficiency without causing any color mixing or color shift to take place. In addition, the comparison of the organic EL display apparatus 1 according to the present embodiment with the organic EL display apparatuses 1 according to the first to sixth embodiment reveals that the organic EL display apparatus 1 of the present embodiment differs from the ones of related art in that the carrier mobilities of the material having the highest content percentage of all the materials in the blue light-emitting layer 34B do not limit the layering order of the blue light-emitting layer 34B, the green light-emitting layer 34G, and the red light-emitting layer 34R. Hence, the light-emitting layer unit 33 has a higher degree of freedom in determining the layering order of the light-emitting layers 34 than in cases of related art.

Note that though not described in detail below, as described earlier, also in the present embodiment, it is possible to make similar modifications to those in the first to sixth embodiments. By means of such modifications, similar advantageous effects to those obtained by the first to sixth embodiments can be obtained.

Eighth Embodiment

A description will be given of yet another embodiment of the disclosure, with reference mainly to FIG. 23 and FIG. 24.

The present embodiment will be described about differences between the present embodiment and the first embodiment to the seventh embodiment, and components having the same functions as those of the components described in the first embodiment to the seventh embodiment are appended with the same reference signs, and the description thereof is omitted. Obviously, the same modifications as those of the first to seventh embodiments may also be applied to the present embodiment.

Figure 23:
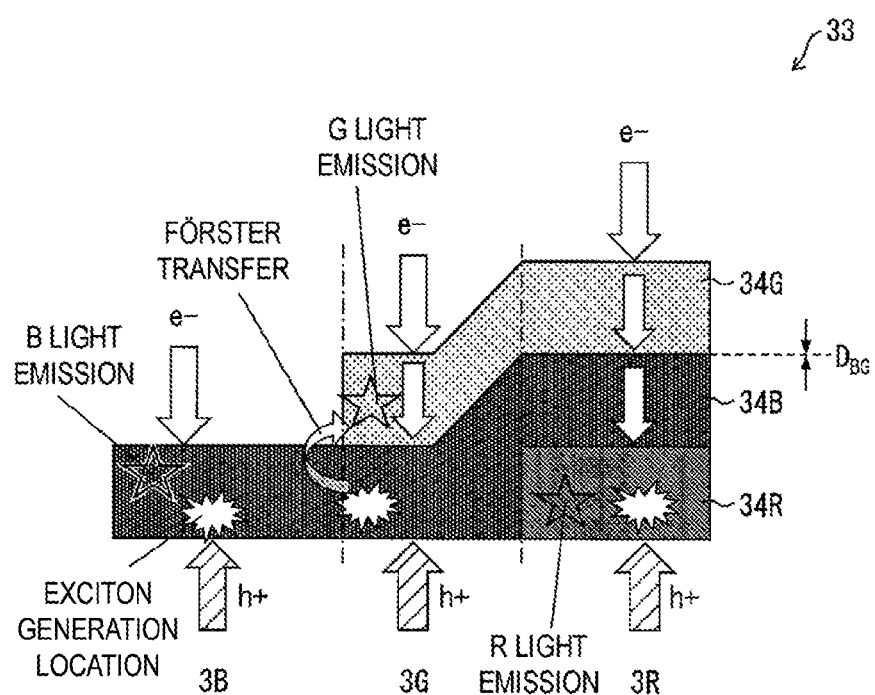
FIG. 23 is a diagram illustrating a schematic configuration of a light-emitting layer unit of an organic EL display apparatus and illustrating a principle of light emission by the light-emitting layer unit according to an eighth embodiment of the disclosure.

Schematic Configuration of Organic EL Display Apparatus 1 and Method for Manufacturing Same FIG. 23 is a diagram illustrating a schematic configuration of the light-emitting layer unit 33 of the organic EL display apparatus 1 and illustrating a principle of light emission by the light-emitting layer unit 33 according to the present modified example. FIG. 24 is a cross sectional view illustrating an example of a schematic configuration of the organic EL display apparatus 1 according to the present embodiment. Note that the cross-sectional view of FIG. 24 illustrates an example of a schematic configuration of a single pixel area of the organic EL display apparatus 1 and corresponds to a cross section taken along the line L1-L2 in FIG. 3.

Figure 24:
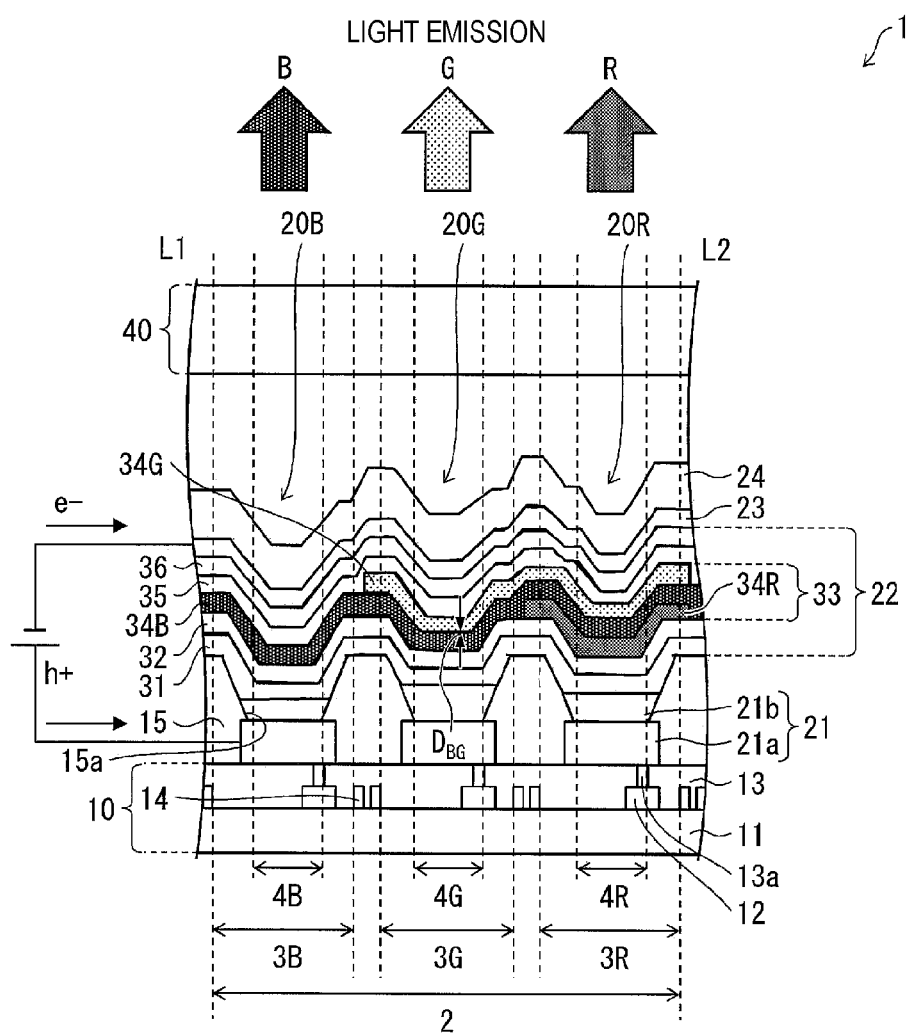
FIG. 24 is a cross-sectional view illustrating an example of a schematic configuration of the organic EL display apparatus according to the eighth embodiment of the disclosure.

As illustrated in FIG. 23 and FIG. 24, the organic EL display apparatus 1 according to the present embodiment has a configuration where the light-emitting layer unit 33 is provided between the first electrode 21 and the second electrode 23; and in the light-emitting layer unit 33, the red light-emitting layer 34R, the blue light-emitting layer 34B, and the green light-emitting layer 34G, are layered in this order from the first electrode 21 side. To put it differently, in the present embodiment, the layers in the light-emitting layer unit 33 are layered in the reverse order from the corresponding order in the seventh embodiment.

In the present embodiment, as illustrated in FIG. 23, an electron transporting material is used as a material having the highest content percentage in the blue light-emitting layer 34B, and an electron transporting material is used as a material having the highest content percentage in the green light-emitting layer 34G. The carrier mobilities of the material having the highest content percentage in the red light-emitting layer 34R are not particularly limited, but it is preferable to use a bipolar transporting material or an electron transporting material to this end.

The organic EL display apparatus 1 according to the present embodiment has a configuration that is identical to the corresponding configuration of the organic EL display apparatus 1 according to the seventh embodiment except the above-mentioned points.

Note that in the present embodiment as well as in the seventh embodiment, in a case where the luminescent material of the red light-emitting layer 34R is a red fluorescent luminescent material, it is preferable that the red fluorescent luminescent material be a TADF material. In addition, it is preferable that the blue fluorescent luminescent materials be a TADF material.

In addition, a method for manufacturing the organic EL display apparatus 1 according to the present embodiment is identical to, for example, the method of manufacturing the organic EL display apparatus 1 according to, for example, the seventh embodiment except that the red light-emitting layer formation process, the blue light-emitting layer formation process, and the green light-emitting layer formation process are performed in this order.

Display Method of Organic EL Display Apparatus 1

In this case, light emission is performed in a similar manner to the one in the seventh embodiment. To put it differently, in the subpixels 3B, excitons are generated in the blue light-emitting layers 34B, and the subpixels 3B achieve almost 100% blue light emission (blue fluorescence emission).

In the subpixel 3G, excitons are generated in the blue light-emitting layer 34B, the Förster transfer from the $S_1$ level of the blue fluorescent luminescent material to the $S_1$ level of the green fluorescent luminescent material does occur, and as a result, the subpixel 3G achieves almost 100% green light emission (green fluorescence emission).

In the subpixel 3R, excitons are generated in the red light-emitting layer 34R, and the subpixel 3R achieves almost 100% red light emission (red fluorescence emission).

In this case, use of both a TADF material as the blue fluorescent luminescent material and a TADF material as the red fluorescent luminescent material renders similar effects to those described in the seventh embodiment.

Note that though not described in detail below, as described earlier, also in the present embodiment, it is possible to make similar modifications to those in the first to sixth embodiments.

Advantageous Effects

Hence, according to the present embodiment, similar advantageous effects to those of the seventh embodiment can be obtained. Note that though not described in detail below, as described earlier, also in the present embodiment, it is possible to make similar modifications to those in the first to sixth embodiments. By means of such modifications, similar advantageous effects to those obtained by the first to sixth embodiments can be obtained.

Ninth Embodiment

A description will be given of yet another embodiment of the disclosure, with reference mainly to FIG. 25 and FIG. 26.

The present embodiment will be described about differences between the present embodiment and the first embodiment to the eighth embodiment, and components having the same functions as those of the components described in the first embodiment to the eighth embodiment are appended with the same reference signs, and the description thereof is omitted. Obviously, the same modifications as those of the first to eighth embodiments may also be applied to the present embodiment.

Figure 25:
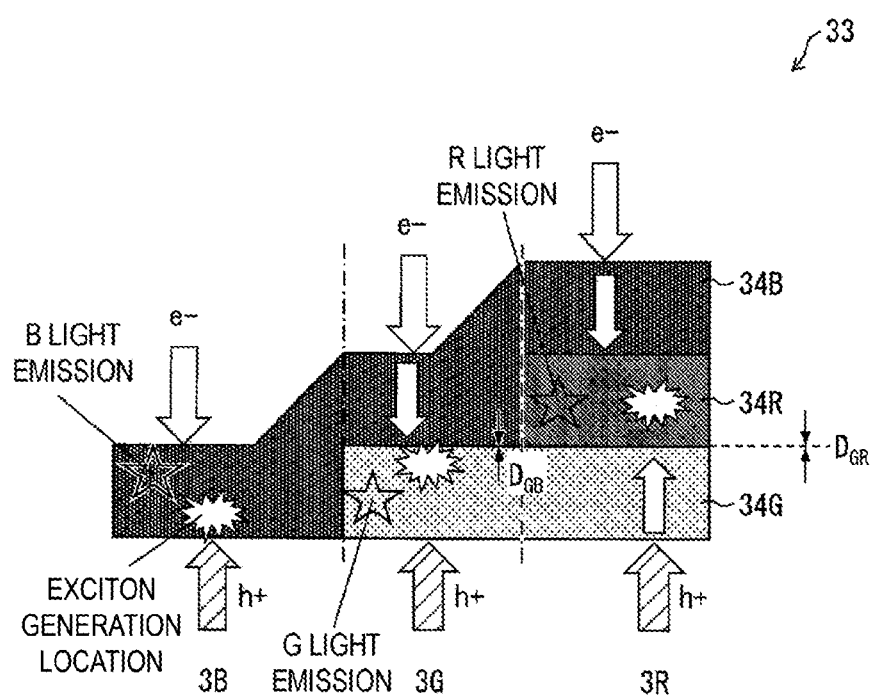
FIG. 25 is a diagram illustrating a schematic configuration of a light-emitting layer unit of an organic EL display apparatus and illustrating a principle of light emission by the light-emitting layer unit according to a ninth embodiment of the disclosure.

Schematic Configuration of Organic EL Display Apparatus 1 and Method for Manufacturing Same FIG. 25 is a diagram illustrating a schematic configuration of the light-emitting layer unit 33 of the organic EL display apparatus 1 and illustrating a principle of light emission by the light-emitting layer unit 33 according to the present modified example. FIG. 26 is a cross sectional view illustrating an example of a schematic configuration of the organic EL display apparatus 1 according to the present embodiment. Note that the cross-sectional view of FIG. 26 illustrates an example of a schematic configuration of a single pixel area of the organic EL display apparatus 1 and corresponds to a cross section taken along the line L1-L2 in FIG. 3.

Figure 26:
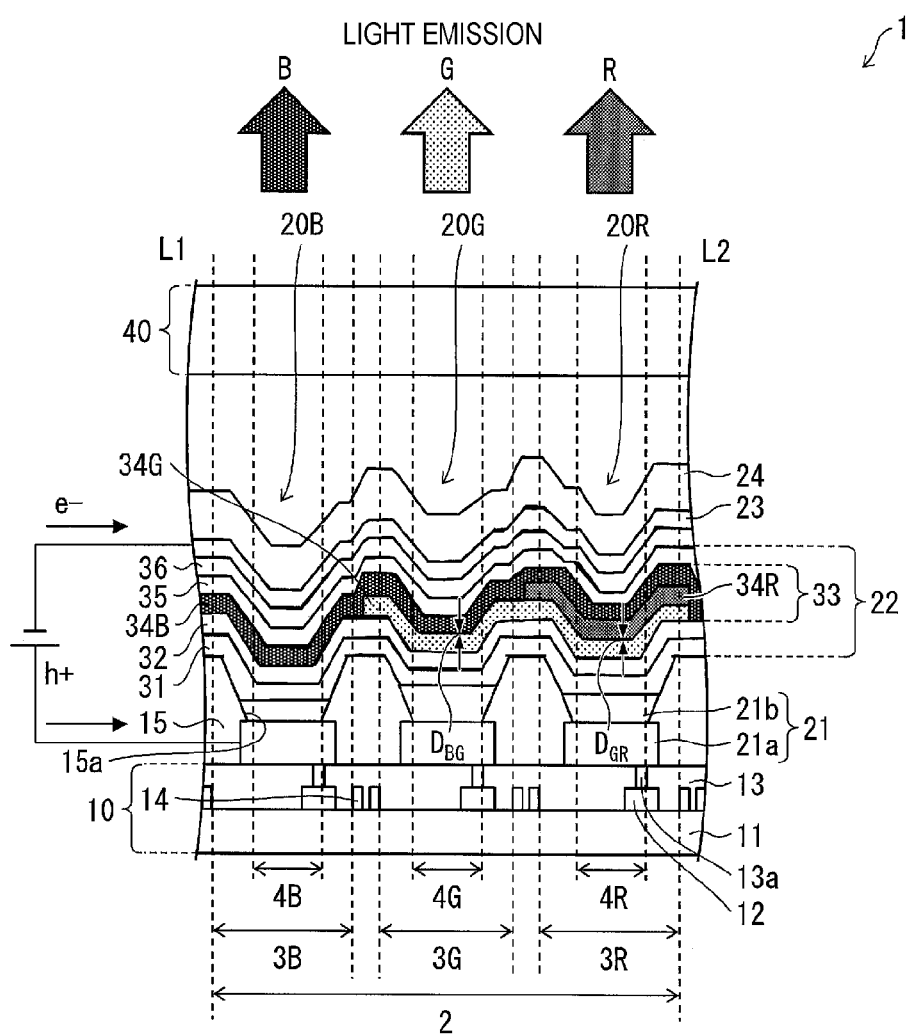
FIG. 26 is a cross-sectional view illustrating an example of a schematic configuration of the organic EL display apparatus according to the ninth embodiment of the disclosure.

As illustrated in FIG. 25 and FIG. 26, the organic EL display apparatus 1 according to the present embodiment has a configuration where the light-emitting layer unit 33 is provided between the first electrode 21 and the second electrode 23; and in the light-emitting layer unit 33, the green light-emitting layer 34G, the red light-emitting layer 34R, and the blue light-emitting layer 34B, are layered in this order from the first electrode 21 side.

In the present embodiment, as illustrated in FIG. 25, an electron transporting material is used as a material having the highest content percentage in the blue light-emitting layer 34B, and an electron transporting material is used as a material having the highest content percentage in the red light-emitting layer 34R. A hole transporting material is used as a material having the highest content percentage in the green light-emitting layer 34G.

In addition, in a case where the luminescent material of the red light-emitting layer 34R is a red fluorescent luminescent material, it is preferable that the red fluorescent luminescent material be a TADF material. In addition, it is preferable that the blue fluorescent luminescent materials be a TADF material.

The organic EL display apparatus 1 according to the present embodiment has a configuration that is identical to the corresponding configuration of the organic EL display apparatus 1 according to the first embodiment except the above-mentioned points.

In addition, a method for manufacturing the organic EL display apparatus 1 according to the present embodiment is identical to, for example, the method of manufacturing the organic EL display apparatus 1 according to the first embodiment except that the green light-emitting layer formation process, the red light-emitting layer formation process, and the blue light-emitting layer formation process are performed in this order.

Display Method of Organic EL Display Apparatus 1

In this case, as illustrated in FIG. 25, in the subpixels 3B, excitons are generated in the blue light-emitting layer 34B, and almost 100% blue light emission (blue fluorescence emission) is achieved.

In each subpixel 3G, depending on the carrier balance in the subpixel 3G, excitons are generated either in the blue light-emitting layer 34B or in the green light-emitting layer 34G, and the distance between the green light-emitting layer 34G and the blue light-emitting layer 34B is not greater than the Förster radius. Hence, even in a case where excitons are generated in the blue light-emitting layer 34B, Förster transfer occurs from the $S_1$ level of the blue fluorescent luminescent material to the S1 level of the green fluorescent luminescent material. As a result, the subpixel 3G achieves almost 100% green light emission (green fluorescence emission). In this case, use of a TADF material as the blue fluorescent luminescent material causes reverse intersystem crossing to convert upwardly the excitons with a 75% $T_1$ level generated in the blue light-emitting layer 34B to the $S_1$ level. Hence, the luminous efficiency in the subpixel 3B and the luminous efficiency in the subpixel 3G can be improved to a great degree.

In addition, in each subpixel 3R, depending on the carrier balance in the red light-emitting layer 34R and the green light-emitting layer 34G, excitons are generated either in the red light-emitting layer 34R or in the green light-emitting layer 34G. In addition, the distance between the red light-emitting layer 34R and the green light-emitting layer 34G is not greater than the Förster radius. Hence, even in a case where excitons are generated in the green light-emitting layer 34G, the subpixel 3R emits red light as in the other embodiments.

Advantageous Effects

Hence, according to the present embodiment, similar advantageous effects to those of, for example, the first embodiment can be obtained. In addition, though not described in detail below, as described earlier, also in the present embodiment, it is possible to make similar modifications to those in the first to eighth embodiments. By means of such modifications, similar advantageous effects to those obtained by the first to eighth embodiments can be obtained.
Supplement A display apparatus (e.g., organic EL display apparatus 1) according to a first aspect of the disclosure includes: a display region 1a; a first electrode (first electrode 21); a second electrode (second electrode 23); and a layered body (e.g., organic EL layer 22) formed between the first electrode and the second electrode, wherein the display region includes: a first subpixel (e.g., blue subpixel 3B), a second subpixel (e.g., green subpixel 3G), and a third subpixel (e.g., red subpixel 3R); the first subpixel, the second subpixel, and the third subpixel emit their respective light having mutually different peak wavelengths (e.g., blue light, green light, and red light); the layered body includes: a first light-emitting layer (e.g., blue light-emitting layer 34B) containing a first fluorescent luminescent material (e.g., blue fluorescent luminescent material), a second light-emitting layer (e.g., green fluorescent light-emitting layer 34G) containing a second fluorescent luminescent material (e.g., green fluorescent luminescent material), and a third light-emitting layer (e.g., red light-emitting layer 34R) containing a third fluorescent luminescent material (e.g., red fluorescent luminescent material) or a phosphorescent luminescent material (e.g., red phosphorescent luminescent material) as a luminescent material; the second fluorescent luminescent material has a lower energy level in a minimum excited singlet state than an energy level of the first fluorescent luminescent material in the minimum excited singlet state; the third fluorescent luminescent material or the phosphorescent luminescent material has a lower energy level in a minimum excited singlet state than the energy level of the second fluorescent luminescent material in the minimum excited singlet state; the first light-emitting layer is formed as a layer that is common to the first subpixel, the second subpixel, and the third subpixel; the second light-emitting layer is formed as a layer that is common to the second subpixel and the third subpixel; and the third light-emitting layer is formed only in the third subpixel.

The display apparatus according to a second aspect of the disclosure is the display apparatus according to the first aspect, wherein one of the first electrode and the second electrode may include a reflective electrode and the other of the first electrode and the second electrode is a light-transmissive electrode, in the first subpixel, light emitted from the first light-emitting layer may be let out to outside either directly through the light-transmissive electrode or through the light-transmissive electrode after being reflected multiple times between the reflective electrode and the light-transmissive electrode in the first subpixel, in the second subpixel, light emitted from the second light-emitting layer may be let out to outside either directly through the light-transmissive electrode or through the light-transmissive electrode after being reflected between the reflective electrode and the light-transmissive electrode in the second subpixel, and, in the third subpixel, light emitted from the third light-emitting layer may be let out to outside either directly through the light-transmissive electrode or through the light-transmissive electrode after being reflected multiple times between the reflective electrode and the light-transmissive electrode in the third subpixel.

The display apparatus according to a third aspect of the disclosure is a display apparatus according to the first aspect or the second aspect, wherein in the second subpixel, a distance between the first light-emitting layer and the second light-emitting layer may be equal to or smaller than the Förster radius.

The display apparatus according to a fourth aspect of the disclosure is the display apparatus according to any one of the first to third aspects, wherein in the third subpixel, a distance between the first light-emitting layer and the second light-emitting layer may be equal to or smaller than the Förster radius, and a distance between the second light-emitting layer and the third light-emitting layer may be equal to or smaller than the Förster radius.

The display apparatus according to a fifth aspect of the disclosure is the display apparatus according to the fourth aspect, wherein the second light-emitting layer and the third light-emitting layer may be layered via a second blocking layer 38 containing no luminescent material and having a layer thickness that is equal to or smaller than the Förster radius.

The display apparatus according to a sixth aspect of the disclosure is the display apparatus according to any one of the third to fifth aspects, wherein the first light-emitting layer and the second light-emitting layer may be layered via a first blocking layer containing no luminescent material and having a layer thickness that is equal to or smaller than the Förster radius.

The display apparatus according to a seventh aspect of the disclosure is the display apparatus according to any one of the first to sixth aspects, wherein a part of a light emission spectrum of the first fluorescent luminescent material and a part of an absorption spectrum of the second fluorescent luminescent material may overlap each other, and a part of a light emission spectrum of the second fluorescent luminescent material and a part of an absorption spectrum of the third fluorescent luminescent material or phosphorescent luminescent material may overlap each other.

The display apparatus according to an eighth aspect of the disclosure is the display apparatus according to any one of the first to seventh aspects, wherein the first fluorescent luminescent material may be a thermally activated delayed fluorescence material with an energy difference of 0.3 eV or smaller between a minimum excited singlet state and a minimum excited triplet state.

The display apparatus according to a ninth aspect of the disclosure is the display apparatus according to any one of the first to eighth aspects, wherein the second fluorescent luminescent material may be a thermally activated delayed fluorescence material with an energy difference of 0.3 eV or smaller between a minimum excited singlet state and a minimum excited triplet state.

The display apparatus according to a tenth aspect of the disclosure is the display apparatus according to any one of the first to ninth aspects, wherein the third fluorescent luminescent material may be a thermally activated delayed fluorescence material with an energy difference of 0.3 eV or smaller between a minimum excited singlet state and a minimum excited triplet state.

The display apparatus according to an eleventh aspect of the disclosure is the display apparatus according to any one of the first to ninth aspects, wherein the first light-emitting layer, the second light-emitting layer, and the third light-emitting layer may be layered between the first electrode and the second electrode in this order from the first electrode side.

The display apparatus according to a twelfth aspect of the disclosure is the display apparatus according to any one of the first to ninth aspects, wherein the third light-emitting layer, the second light-emitting layer, and the first light-emitting layer may be layered between the first electrode and the second electrode in this order from the first electrode side.

The display apparatus according to a thirteenth aspect of the disclosure is the display apparatus according to any one of the first to third aspects, wherein the second light-emitting layer, the first light-emitting layer, and the third light-emitting layer may be layered between the first electrode and the second electrode in this order from the first electrode side.

The display apparatus according to a fourteenth aspect of the disclosure is the display apparatus according to any one of the first to third aspects, wherein the third light-emitting layer, the first light-emitting layer, and the second light-emitting layer may be layered between the first electrode and the second electrode in this order from the first electrode side.

The display apparatus according to a fifteenth aspect of the disclosure is the display apparatus according to any one of the first to ninth aspects, wherein the second light-emitting layer, the third light-emitting layer, and the first light-emitting layer may be layered between the first electrode and the second electrode in this order from the first electrode side.

A display apparatus manufacturing method according to a sixteenth aspect of the disclosure for manufacturing a display apparatus (e.g., organic EL display apparatus 1) including: a display region 1a; a first electrode (first electrode 21); a second electrode (second electrode 23); and a layered body (e.g., organic EL layer 22) formed between the first electrode and the second electrode, wherein the display region includes: a first subpixel (e.g., blue subpixel 3B), a second subpixel (e.g., green subpixel 3G), and a third subpixel (e.g., red subpixel 3R); the first subpixel, the second subpixel, and the third subpixel emit their respective light having mutually different peak wavelengths (e.g., blue light, green light, and red light); the layered body includes: a first light-emitting layer (e.g., blue light-emitting layer 34B) containing a first fluorescent luminescent material (e.g., blue fluorescent luminescent material), a second light-emitting layer (e.g., green light-emitting layer 34G) containing a second fluorescent luminescent material (e.g., green fluorescent luminescent material), and a third light-emitting layer (e.g., red light-emitting layer 34R) containing a third fluorescent luminescent material (e.g., red fluorescent luminescent material) or a phosphorescent luminescent material (e.g., red phosphorescent luminescent material); the second fluorescent luminescent material has a lower energy level in a minimum excited singlet state than an energy level of the first fluorescent luminescent material in the minimum excited singlet state; and the third luminescent material or the phosphorescent luminescent material has a lower energy level in a minimum excited singlet state than the energy level of the second fluorescent luminescent material in the minimum excited singlet state. The display apparatus manufacturing method includes: a first electrode formation step for forming the first electrode; a layered body formation step for forming the layered body; and a second electrode formation step for forming the second electrode. In the display apparatus manufacturing method, the layered body formation step includes: a first light-emitting layer vapor deposition step for vapor-depositing the first light-emitting layer as a layer that is common to the first subpixel, the second subpixel, and the third subpixel; a second light-emitting layer vapor-deposition step for vapor-depositing the second light-emitting layer in a separately patterning manner as a layer that is common to the second subpixel and the third subpixel; and a third light-emitting layer vapor-deposition step for vapor-depositing the third light-emitting layer in a separately patterning manner in the third subpixel.

The disclosure is not limited to each of the embodiments stated above, and various modifications may be implemented within a range not departing from the scope of the claims. Embodiments obtained by appropriately combining technical approaches stated in each of the different embodiments also fall within the scope of the technology of the disclosure. Moreover, novel technical features may be formed by combining the technical approaches stated in each of the embodiments.

REFERENCE SIGNS LIST

1 Organic EL display apparatus (display apparatus)
1a Display region
2 Pixel
3, 3B, 3G, 3R Subpixel
4, 4B, 4G, 4R Light emitting region
10 TFT substrate (substrate)
11 Insulating substrate
12 TFT
13 Interlayer insulating film
13a Contact hole
14 Wiring lines
15 Bank
15a Opening
20, 20B, 20G, 20R Organic EL element
21 First electrode
21a Reflective electrode
21b Light-transmissive electrode
22 Organic EL layer
23 Second electrode
24 Protection layer
31 Hole injection layer
32 Hole transport layer 33 Light-emitting layer unit (layered body)
34 Light-emitting layer
34B Blue light-emitting layer (first light-emitting layer)
34G Green light-emitting layer (second light-emitting layer)
34R Red light-emitting layer (third light-emitting layer)
35 Electron transport layer
36 Electron injection layer
37 Blocking layer (first blocking layer)
38 Blocking layer (second blocking layer)
40 Sealing substrate
$D_{BG}$, $D_{GR}$ Distance between mutually opposing surfaces

The invention claimed is:

1. A display apparatus comprising:
a display region;
a first electrode;
a second electrode; and
a layered body between the first electrode and the second electrode, wherein the display region includes:
a first subpixel,
a second subpixel, and
a third subpixel,
the first subpixel, the second subpixel, and the third subpixel emit their respective light having mutually different peak wavelengths,
the layered body includes:
a first light-emitting layer including a first fluorescent luminescent material,
a second light-emitting layer including a second fluorescent luminescent material, and
a third light-emitting layer including a third fluorescent luminescent material or a phosphorescent luminescent material as a luminescent material,
the second fluorescent luminescent material has a lower energy level in a minimum excited singlet state than an energy level of the first fluorescent luminescent material in the minimum excited singlet state,
the third fluorescent luminescent material or the phosphorescent luminescent material has a lower energy level in a minimum excited singlet state than the energy level of the second fluorescent luminescent material in the minimum excited singlet state,
the first light-emitting layer is defined as a layer that is common to the first subpixel, the second subpixel, and the third subpixel,
the second light-emitting layer is defined as a layer that is common to the second subpixel and the third subpixel,
the third light-emitting layer is defined only in the third subpixel,
a material having a highest content percentage in the first light-emitting layer and a material having a highest content percentage in the second light-emitting layer are each an electron transporting material, and
a material having a highest content percentage in the third light-emitting layer is an electron transporting material or a bipolar transporting material.

2. The display apparatus according to claim 1, wherein
one of the first electrode and the second electrode includes a reflective electrode and the other of the first electrode and the second electrode is a light-transmissive electrode,
in the first subpixel, light emitted from the first light-emitting layer is let out to outside either directly through the light-transmissive electrode or through the light-transmissive electrode after being reflected multiple times between the reflective electrode and the light-transmissive electrode in the first subpixel,
in the second subpixel, light emitted from the second light-emitting layer is let out to outside either directly through the light-transmissive electrode or through the light-transmissive electrode after being reflected multiple times between the reflective electrode and the light-transmissive electrode in the second subpixel, and
in the third subpixel, light emitted from the third light-emitting layer is let out to outside either directly through the light-transmissive electrode or through the light-transmissive electrode after being reflected multiple times between the reflective electrode and the light-transmissive electrode in the third subpixel.

3. The display apparatus according to claim 1, wherein
in the second subpixel, a distance between the first light-emitting layer and the second light-emitting layer is less than or equal to a Förster radius,
the first light-emitting layer and the second light-emitting layer are layered via a first blocking layer containing no luminescent material,
the first light-emitting layer and the first blocking layer have a total layer thickness that is less than or equal to the Förster radius, and
a material having the highest content percentage in the first blocking layer is a bipolar transporting material or an electron transporting material.

4. The display apparatus according to claim 1, wherein
in the third subpixel, a distance between the first light-emitting layer and the second light-emitting layer is less than or equal to a Förster radius, and a distance between the second light-emitting layer and the third light-emitting layer is less than or equal to the Förster radius,
the first light-emitting layer and the second light-emitting layer are layered via a first blocking layer containing no luminescent material,
the second light-emitting layer and the third light-emitting layer are layered via a second blocking layer containing no luminescent material,
the first light-emitting layer and the first blocking layer have a total layer thickness that is less than or equal to the Förster radius,
the second light-emitting layer and the second blocking layer have a total layer thickness that is less than or equal to the Förster radius, and
a material having the highest content percentage in the first blocking layer and a material having the highest content percentage in the second blocking layer are each a bipolar transporting material or an electron transporting material.

5. The display apparatus according to claim 1, wherein
a portion of a light emission spectrum of the first fluorescent luminescent material and a portion of an absorption spectrum of the second fluorescent luminescent material overlap each other, and
a portion of a light emission spectrum of the second fluorescent luminescent material and a part of an absorption spectrum of the third fluorescent luminescent material or phosphorescent luminescent material may overlap each other.

6. The display apparatus according to claim 1, wherein the first fluorescent luminescent material is a thermally activated delayed fluorescence material with an energy difference of 0.3 eV or smaller between a minimum excited singlet state and a minimum excited triplet state.

7. The display apparatus according to claim 1, wherein the second fluorescent luminescent material is a thermally activated delayed fluorescence material with an energy difference of 0.3 eV or smaller between a minimum excited singlet state and a minimum excited triplet state.

8. The display apparatus according to claim 1, wherein the third fluorescent luminescent material is a thermally activated delayed fluorescence material with an energy difference of 0.3 eV or smaller between a minimum excited singlet state and a minimum excited triplet state.

9. The display apparatus according to claim 1, wherein the first light-emitting layer, the second light-emitting layer, and the third light-emitting layer are layered between the first electrode and the second electrode in this order from the first electrode side.

10. The display apparatus according to claim 1, wherein the third light-emitting layer, the second light-emitting layer, and the first light-emitting layer are layered between the first electrode and the second electrode in this order from the first electrode side.

11. The display apparatus according to claim 1, wherein the second light-emitting layer, the first light-emitting layer, and the third light-emitting layer are layered between the first electrode and the second electrode in this order from the first electrode side.

12. The display apparatus according to claim 1, wherein the third light-emitting layer, the first light-emitting layer, and the second light-emitting layer are layered between the first electrode and the second electrode in this order from the first electrode side.

13. The display apparatus according to claim 1, wherein the second light-emitting layer, the third light-emitting layer, and the first light-emitting layer are layered between the first electrode and the second electrode in this order from the first electrode side.

14. A display apparatus manufacturing method for manufacturing a display apparatus including: a display region; a first electrode; a second electrode; and a layered body between the first electrode and the second electrode, wherein the display region includes: a first subpixel, a second subpixel, and a third subpixel; the first subpixel, the second subpixel, and the third subpixel emit their respective light having mutually different peak wavelengths; the layered body includes: a first light-emitting layer containing a first fluorescent luminescent material, a second light-emitting layer containing a second fluorescent luminescent material, and a third light-emitting layer containing a third fluorescent luminescent material or a phosphorescent luminescent material; the second fluorescent luminescent material has a lower energy level in a minimum excited singlet state than an energy level of the first fluorescent luminescent material in the minimum excited singlet state; and the third fluorescent luminescent material or the phosphorescent luminescent material has a lower energy level in a minimum excited singlet state than the energy level of the second fluorescent luminescent material in the minimum excited singlet state, the display apparatus manufacturing method comprising:
  a first electrode formation step of forming the first electrode;
  a layered body formation step of forming the layered body; and
  a second electrode formation step of forming the second electrode, wherein the layered body formation step includes
  a first light-emitting layer vapor deposition step of vapor-depositing the first light-emitting layer as a layer that is common to the first subpixel, the second subpixel, and the third subpixel,
  a second light-emitting layer vapor-deposition step of vapor-depositing the second light-emitting layer in a separately patterning manner as a layer that is common to the second subpixel and the third subpixel, and
  a third light-emitting layer vapor-deposition step of vapor-depositing the third light-emitting layer in a separately patterning manner in the third subpixel, wherein
a material having a highest content percentage in the first light-emitting layer and a material having a highest content percentage in the second light-emitting layer are each an electron transporting material, and
a material having a highest content percentage in the third light-emitting layer is an electron transporting material or a bipolar transporting material.

15. The manufacturing method according to claim 14, wherein
  in the second subpixel, a distance between the first light-emitting layer and the second light-emitting layer is less than or equal to a Förster radius,
  the first light-emitting layer and the second light-emitting layer are layered via a first blocking layer containing no luminescent material,
  the first light-emitting layer and the first blocking layer have a total layer thickness that is less than or equal to the Förster radius, and
  a material having the highest content percentage in the first blocking layer is a bipolar transporting material or an electron transporting material.

16. The manufacturing method according to claim 14, wherein
  in the third subpixel, a distance between the first light-emitting layer and the second light-emitting layer is less than or equal to a Förster radius, and a distance between the second light-emitting layer and the third light-emitting layer is less than or equal to the Förster radius,
  the first light-emitting layer and the second light-emitting layer are layered via a first blocking layer containing no luminescent material,
  the second light-emitting layer and the third light-emitting layer are layered via a second blocking layer containing no luminescent material,
  the first light-emitting layer and the first blocking layer have a total layer thickness that is less than or equal to the Förster radius,
  the second light-emitting layer and the second blocking layer have a total layer thickness that is less than or equal to the Förster radius, and
  a material having the highest content percentage in the first blocking layer and a material having the highest content percentage in the second blocking layer are each a bipolar transporting material or an electron transporting material.

* * * * *